United States Patent
Young

(10) Patent No.: US 10,574,132 B2
(45) Date of Patent: Feb. 25, 2020

(54) INDUCTOR WITH BYPASS SWITCH

(71) Applicant: Alpha and Omega Semiconductor (Cayman) Limited, Grand Cayman (KY)

(72) Inventor: Chris M. Young, Round Rock, TX (US)

(73) Assignee: Alpha and Omega Semiconductor (Cayman) Limited, Grand Cayman (KY)

( * ) Notice: Subject to any disclaimer, the term of this patent is extended or adjusted under 35 U.S.C. 154(b) by 0 days.

(21) Appl. No.: 16/029,421

(22) Filed: Jul. 6, 2018

(65) Prior Publication Data

US 2019/0288591 A1   Sep. 19, 2019

Related U.S. Application Data

(60) Provisional application No. 62/642,717, filed on Mar. 14, 2018.

(51) Int. Cl.
*H02M 1/088*     (2006.01)
*H02M 1/32*     (2007.01)
(Continued)

(52) U.S. Cl.
CPC ........ *H02M 1/32* (2013.01); *G01R 19/16528* (2013.01); *G01R 19/16585* (2013.01);
(Continued)

(58) Field of Classification Search
CPC ......... H02M 1/088; H02M 2001/0058; H02M 2001/0054
See application file for complete search history.

(56) References Cited

U.S. PATENT DOCUMENTS 5,929,692 A    7/1999 Carsten
6,271,651 B1   8/2001 Stratakos et al.
(Continued)

OTHER PUBLICATIONS

Extended European Search Report in related Europe Application No. 19162239.8, dated Aug. 13, 2019, 8 pages.

*Primary Examiner* — Thomas J. Hiltunen
(74) *Attorney, Agent, or Firm* — Craige Thompson; Thompson Patent Law

(57) ABSTRACT

Some apparatus and associated methods relate to conductivity modulation apparatus for active operations with an inductive element in a packaged circuit module formed with a bypass switch for configuration in parallel with an inductor. In an illustrative example, the bypass switch may be a controllable bidirectional switch formed of, for example, two anti-series connected MOSFETs. In some embodiments, the packaged module may include a main switch and/or a freewheeling rectifier (e.g., synchronous rectifier) operable as a buck-derived switched mode power supply. The bypass switch may, in operation, selectively circulate inductor current through the bypass switch, for example, to control the timing and/or quantity of energy transfer from the inductor to a load. In some implementations, the bypass switch may be operated, for example, to dynamically modulate conductivity across the terminals of an inductor in a buck-derived switched mode power supply to enhance circuit performance in numerous operational modes.

20 Claims, 32 Drawing Sheets

(51) Int. Cl.
*H02M 1/14* (2006.01)
*H02M 3/158* (2006.01)
*G01R 19/165* (2006.01)
*H02M 1/34* (2007.01)
*H02M 1/08* (2006.01)
*H02M 3/156* (2006.01)
*H02M 3/335* (2006.01)
*H02M 1/00* (2006.01)

(52) U.S. Cl.
CPC ............ *H02M 1/08* (2013.01); *H02M 1/088* (2013.01); *H02M 1/14* (2013.01); *H02M 1/34* (2013.01); *H02M 3/156* (2013.01); *H02M 3/158* (2013.01); *H02M 3/1582* (2013.01); *H02M 3/1584* (2013.01); *H02M 3/1588* (2013.01); *H02M 3/335* (2013.01); *H02M 3/33507* (2013.01); *H02M 2001/0054* (2013.01); *H02M 2001/342* (2013.01); *H02M 2003/1586* (2013.01)

(56) References Cited

U.S. PATENT DOCUMENTS

| | | | |
|---|---|---|---|
| 6,509,721 B1* | 1/2003 | Liebler | H02M 3/158 323/224 |
| 6,522,108 B2 | 2/2003 | Prager et al. | |
| 6,737,838 B2* | 5/2004 | Sluijs | H02M 3/1582 323/225 |
| 7,019,507 B1* | 3/2006 | Dittmer | H02M 1/32 323/271 |
| 8,575,910 B2 | 11/2013 | Young | |
| 9,178,420 B1 | 11/2015 | Hawley | |
| 9,673,710 B2* | 6/2017 | Ihs | H02M 3/158 |
| 9,712,055 B1* | 7/2017 | Swartz | H02M 3/158 |
| 9,787,179 B1* | 10/2017 | Clarkin | H02M 3/156 |
| 9,882,474 B2* | 1/2018 | Schmitz | H02M 3/157 |
| 10,193,442 B2* | 1/2019 | Parto | H02M 3/156 |
| 10,243,449 B1* | 3/2019 | Young | H02M 1/08 |
| 2007/0096707 A1 | 5/2007 | Xi | |
| 2012/0081095 A1* | 4/2012 | Kung | H02M 3/158 323/285 |
| 2014/0125306 A1 | 5/2014 | Babazadeh et al. | |
| 2015/0194882 A1* | 7/2015 | Ihs | H02M 3/156 323/272 |

* cited by examiner

INDUCTOR WITH BYPASS SWITCH

CROSS-REFERENCE TO RELATED APPLICATIONS

This application claims the benefit of U.S. Provisional Application Ser. No. 62/642,717 titled "Buck-Derived Switching Power Supply Techniques," filed by Chris M. Young on Mar. 14, 2018.

This application incorporates the entire contents of the foregoing application(s) herein by reference.

TECHNICAL FIELD

Various embodiments relate generally to components and methods for switch-mode power supplies.

BACKGROUND

Electronic devices receive power in a variety of ways. For example, consumer electronic devices may receive power from a wall outlet (e.g., mains) or from various portable sources (e.g., batteries, renewable energy sources, generators). Battery operated devices have an operational time that is dependent upon battery capacity and average current draw. Manufacturers of battery powered devices may strive to reduce average battery current of their products in order to offer longer device use between battery replacement or between charge operations. In some examples, manufacturers of mains-powered devices may strive to increase power efficiency of their products in order to minimize thermal loads and/or to maximize the performance per watt of power consumed.

In some electronic devices, an input voltage supply (e.g., battery input, rectified mains supply, intermediate DC supply) may be converted to a different voltage by various voltage conversion circuits. Switch-mode power supplies have gained popularity as voltage conversion circuits due to their high efficiency and therefore are often used in various electronic devices.

Switch-mode power supplies convert voltages using switching devices that turn on with very low resistance and turn off with very high resistance. Switch-mode power supplies may charge an output inductor during a period of time and may release part or all of the inductor energy during a subsequent period of time. The output energy may be delivered to a bank of output capacitors, which provide the filtering to produce a DC output voltage. In buck-derived switch-mode power supplies, the output voltage, in a steady state, may be approximately the input voltage times a duty cycle, where the duty cycle is the duration of the on-time of a pass switch divided by the total on-time and off-time of the pass switch for one switching cycle.

SUMMARY

Some apparatus and associated methods relate to a buck-derived switched mode power supply with three-quarter bridge (TQB) formed with a bypass switch in parallel with an inductor. In an illustrative example, the bypass switch may be configured to, in response to a decrease in average load demand, operate in a first mode to turn on the bypass switch to selectively circulate inductor current through the bypass switch while a high-side switch and a low-side switch are off. In a second mode, the bypass switch may be turned off to circulate the inductor current through, for example, an output capacitor and the low-side switch. In some implementations of the TQB, the bypass switch may be operated, for example, to selectively time a transfer of a controlled amount of energy stored in the inductor to the output capacitor in response to a decrease in average load demand while reducing transient disturbances.

Some apparatus and associated methods relate to conductivity modulation apparatus for active operations with an inductive element in a packaged circuit module formed with a bypass switch for configuration in parallel with an inductor. In an illustrative example, the bypass switch may be a controllable bidirectional switch formed of, for example, two anti-series connected MOSFETs. In some embodiments, the packaged module may include a main switch and/or a freewheeling rectifier (e.g., synchronous rectifier) operable as a buck-derived switched mode power supply. The bypass switch may, in operation, selectively circulate inductor current through the bypass switch, for example, to control the timing and/or quantity of energy transfer from the inductor to a load. In some implementations, the bypass switch may be operated, for example, to dynamically modulate conductivity across the terminals of an inductor in a buck-derived switched mode power supply to enhance circuit performance in numerous operational modes.

Various embodiments may achieve one or more advantages. Power density improvements may be achieved by reduction of the bulk capacitance required to maintain voltage levels within specification during positive and negative load transients, for example, such as those associated with processor loads. Substantial reduction in volume, cost, weight, and board area may be gained by various implementations that enable voltage regulation during severe load current transients with substantially reduced bulk capacitance. Further advantages may be found in improved transient response while attenuating noise and improving efficiency.

Reduction of output capacitance may achieve one or more advantages. For example, capacitance reduction may reduce cost, required board space, weight, assembly cost, assembly time, product reliability and product longevity. Some examples of three-quarter bridges (TQBs) may increase the efficiency of various switch-mode power supplies. Various methods implemented with a TQB may make more efficient use of energy stored in an output inductor, when an output load demand suddenly changes, for example, such as through bidirectional current capability through the bypass switch that is in parallel with the inductor. Accordingly, a TQB may substantially mitigate transient output voltage peaks and valleys on an output voltage supply of various switch-mode power supplies. Various TQBs may reduce the amount of output capacitance required on various switch-mode power supplies. Various TQBs may reduce the size, weight, and cost of transient voltage suppression on output voltage supplies of various switch-mode power supplies.

Some implementations may advantageously reduce or substantially avoid excess energy flow into the output capacitor during load dump conditions, for example. Some embodiments may allow selective release of energy stored in the inductor for controlled release at a predetermined rate to the output capacitor after a load dump. In some examples, excess energy may be controllably dissipated to handle the effects of a load dump. Some implementations may protect load circuits by, for example, clamping an output voltage in case of an excess voltage deviation on the output capacitor. Some implementations may provide a bypass of the inductor to speed up transient response, and/or eliminate ringing of the phase node during low to high transitions. Still further, during discontinuous conduction mode (DCM), for example, the TQB operation may include damping of ringing. In one illustrative example, various embodiments may, in one mode of operation, operate to circulate inductor current to limit overvoltage on the output supply during a load transition from high current to low current. In some examples, the TQB may operate to release and/or dissipate energy that may be circulating via the inductor of a buck-derived power conversion module.

Some apparatus and associated methods relate to a multimode driver for a buck-derived switched mode power supply with three-quarter bridge (TQB) formed with a bypass switch (BPS) in parallel with an inductor. In an illustrative example, the multimode driver may be configured to operate the BPS in multiple different modes in response to load conditions, for example. The multiple modes may operate the BPS in any combination of, for example, full on, controlled resistance, controlled current, and controlled voltage. In some examples, the BPS driver may be formed in a separate circuit external to a buck switch driver. Some embodiments may co-package the multimode driver with the BPS. In various implementations, the multimode driver may advantageously improve, for example, efficiency and load transient response performance based on multimode operation that is responsive to load dynamics.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, a three-quarter bridge and an exemplary implementation in a representative computing product is briefly introduced with reference to FIG. 1. Second, with reference to FIGS. 2A-10C, various exemplary operation modes of various exemplary TQBs are described. Next, in FIGS. 11-13, further explanatory discussion is presented to explain improvements in inductive energy management of exemplary TQBs. Finally, with reference to FIGS. 14-23D, packaging and circuit configuration embodiments of exemplary TQBs are presented to explain improvements in cost, pinout, flexibility, and size, for example.

Figure 1:
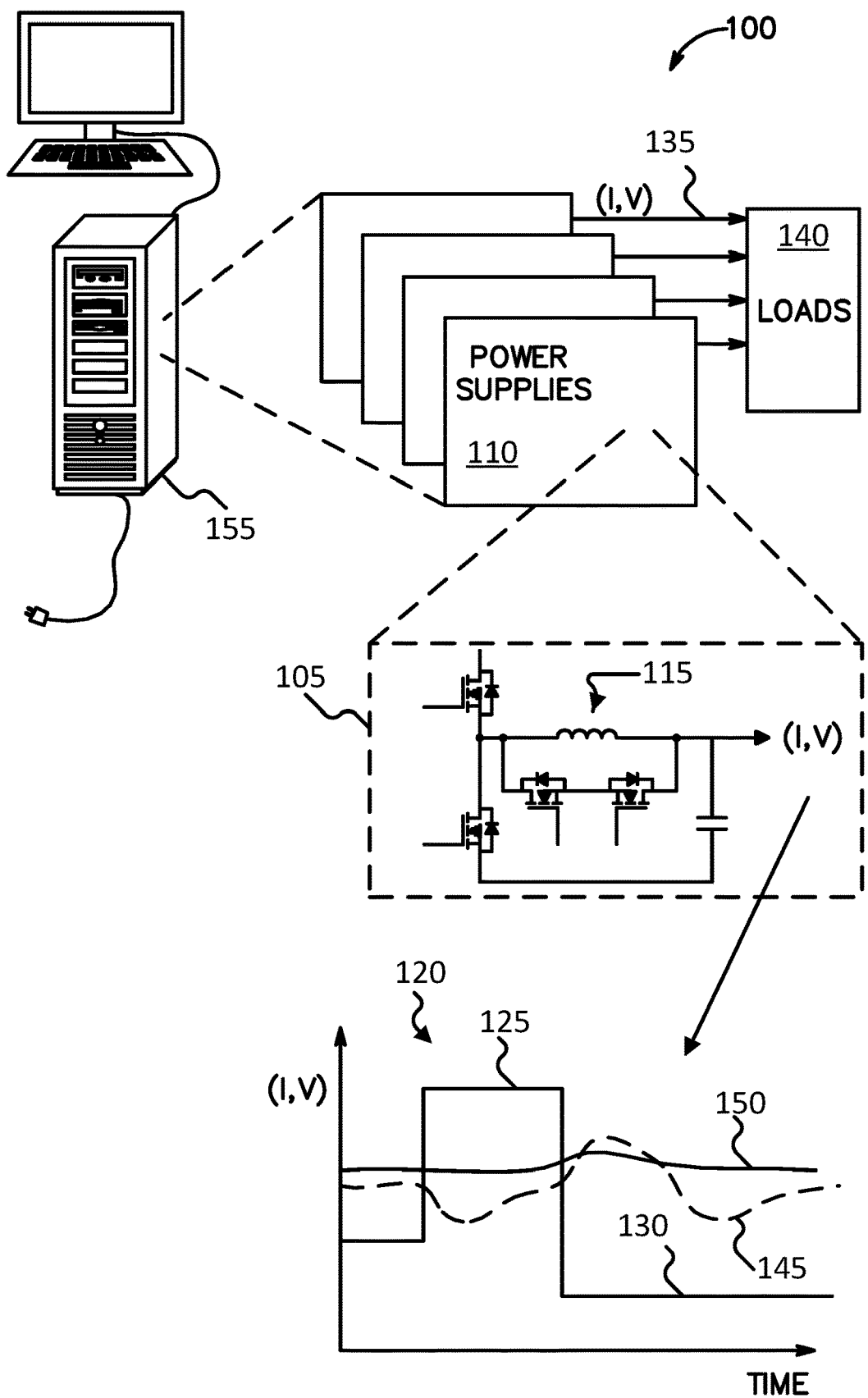
FIG. 1 depicts an exemplary three-quarter bridge (TQB) suppressing a transient load response of a buck-derived switch-mode power supply (BPS).

FIG. 1 depicts an exemplary three-quarter bridge (TQB) suppressing a transient load response of a buck-derived switch-mode power supply (BPS). A transient load suppression example 100 includes a TQB circuit 105. The TQB circuit 105 is operably coupled to a buck-derived SMPS 110. The TQB circuit 105 may operate in several modes, controlled by an SMPS controller (not shown). For example, the TQB circuit 105 may selectively recirculate and release energy in an output inductor 115. Selective recirculation and energy release from the output inductor 115 may be advantageous when a load demand 120 changes rapidly, for example, from a high load state 125 to a lower load state 130.

An output voltage supply 135 is supplied by the buck-derived SMPS 110. The output voltage supply 135 supplies various loads 140. The loads 140 may present transient current loading on the output voltage supply 135. As depicted in the exemplary load demand 120 chart, where the TQB circuit 105 is not implemented on the buck-derived SMPS 110, the output voltage response 145 may include substantially large perturbations in response to the transient current loading on the output voltage supply 135. When the TQB circuit 105 is implemented on the buck-derived SMPS 110, the output voltage response 150 is substantially well regulated, substantially avoiding the larger voltage perturbations.

In the depicted example, the buck-derived SMPS 110 is implemented in a computer 155. The computer 155 includes one or more buck-derived SMPSs 110 supplying one or more loads 140. In some examples, the loads 140 may be specified to operate at an input voltage with limited voltage perturbations.

Figure 2A:
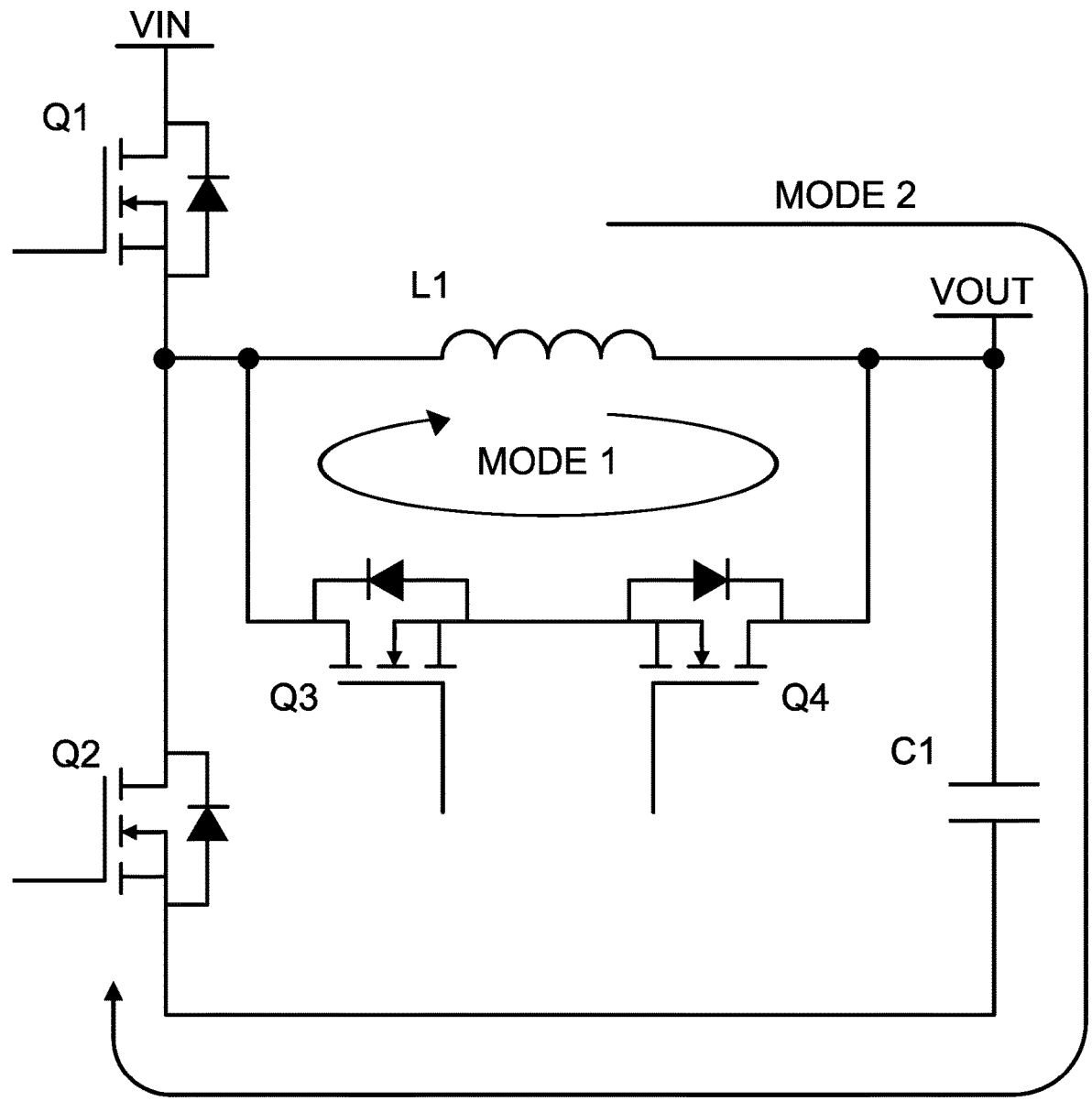
FIG. 2A depicts an exemplary TQB implemented on a BPS and operating in a first post load dump (PLD1) function.

FIG. 2A depicts an exemplary TQB implemented on a BPS and operating in a first post load dump (PLD1) function. A TQB implementation 200A includes a high-side FET Q1. The high-side FET Q1 may be connected on a drain terminal to a DC input supply, for example, VIN. The high-side FET Q1 is configured to selectively connect an input terminal of an output inductor L1 to the DC input supply. The high-side FET Q1 is connected on a source terminal to a drain terminal of a low-side FET Q2. The low-side FET Q2 is configured to selectively return output current to the output inductor L1. The low-side FET Q2 may be a synchronous rectifier, for example. The high-side FET Q1 and the low-side FET Q2 may be connected on a gate terminal to individual control signals, for example, control outputs from one or more driver chips controlled by a switch-mode power supply control chip. The low-side FET Q2 is connected on a source terminal to a negative terminal of an output capacitor C1. The output inductor L1 is connected on an output terminal to a positive terminal of the output capacitor C1.

The input terminal of the output inductor is connected to a drain terminal of a first bypass FET Q3. A source terminal of the first bypass switch Q3 is connected to a source terminal of a second bypass FET Q4. The second bypass FET Q4 is connected on a drain terminal to the output terminal of the output inductor. The first bypass FET Q3 and the second bypass FET Q4 may be connected on a gate terminal to individual control signals, for example, control outputs from one or more driver chips controlled by a switch-mode power supply control chip. The first bypass FET Q3 and the second bypass FET Q4 may be referred to as a bypass switch Q3/Q4, for example. The output capacitor C1 may supply a load demand.

In the BPS of this example, with the bypass switch Q3/Q4 in parallel with the output inductor L1, in response to a decrease in average load demand, in a first mode (e.g., mode 1), the high-side switch Q1 is turned off and the bypass switch Q3/Q4 is turned on to selectively circulate current from the output inductor L1 through the bypass switch Q3/Q4. In a second mode (e.g., mode 2), the bypass switch Q3/Q4 is turned off to circulate the inductor current through the output capacitor C1 and the low-side FET Q2 rectifier. The second mode (e.g., mode 2) may selectively transfer a controlled amount of energy stored in the output inductor L1 to the output capacitor C1.

The operation described may make efficient use of output inductor current by trapping the energy within the output inductor (e.g., selectively circulating the output inductor current with the bypass switch Q3/Q4 in the first mode (e.g., mode 1)) until a time when the energy may be consumed by the load, by releasing the energy to the load (e.g., selectively releasing the output inductor current with the bypass switch Q3/Q4 in the second mode (e.g., mode 2)).

Figure 2B:
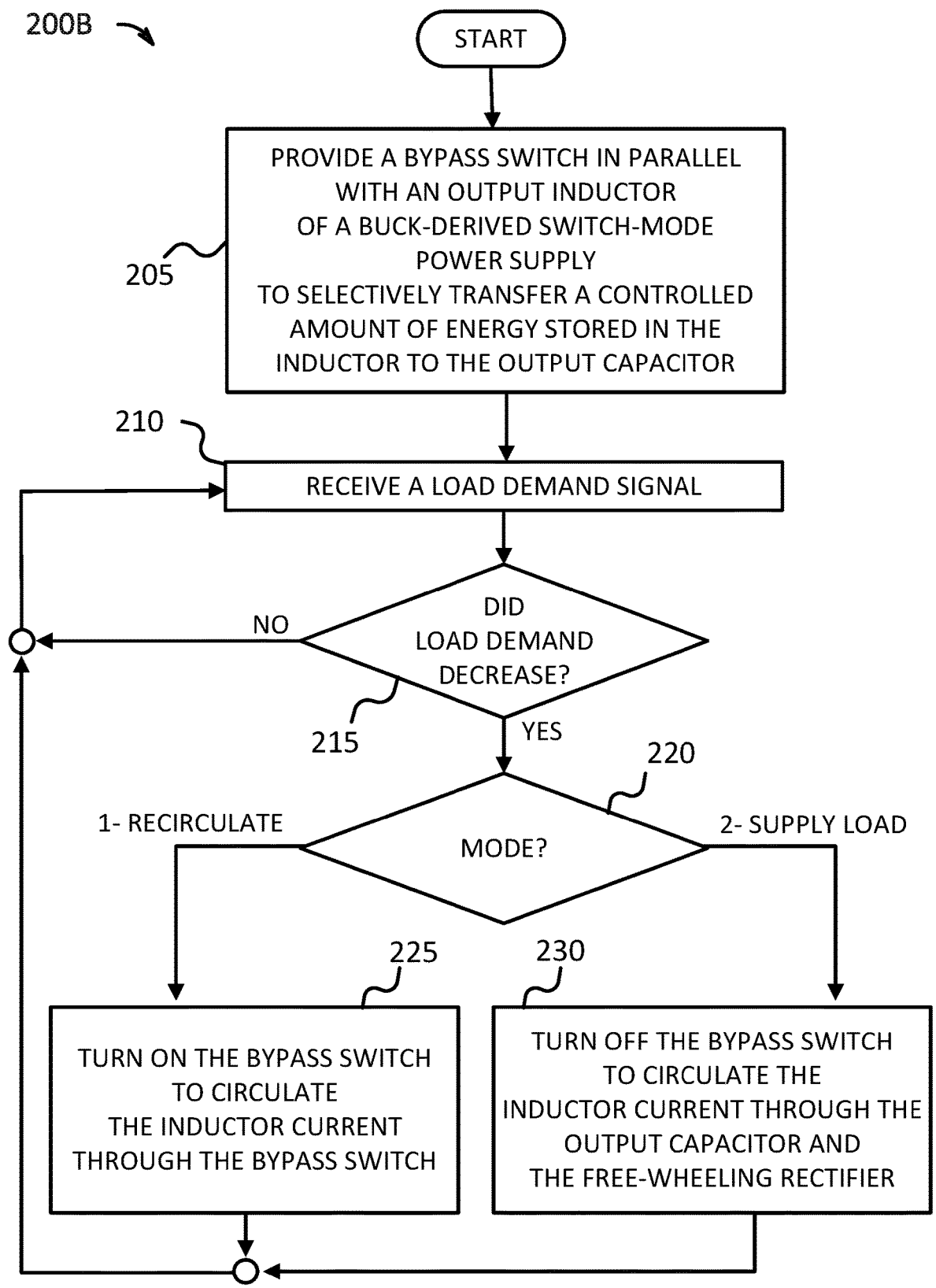
FIG. 2B depicts a flowchart view of an exemplary TQB implemented on a BPS operating in a first post load dump (PLD1) function.

FIG. 2B depicts a flowchart view of an exemplary TQB implemented on a BPS operating in a first post load dump (PLD1) function. A first post load dump process 200B begins at a step 205 with the high-side switch Q1 turned off. At step 205, the bypass switch Q3/Q4 is provided in parallel with the output inductor L1 of the BPS. Next at step 210, the process receives a load demand signal. In some examples, the load demand signal may be indicative of an output current demand. In various implementations, when the output current demand increases, an output voltage may decrease and may cross a predetermined threshold which may indicate a change in load demand. Next, at step 215, the process determines a load demand direction. If the load demand has not decreased, then the process jumps back to step 210. If the load demand has increased, then the process continues to step 220. At step 220, the process determines an operating mode. In various examples, the operating mode may be determined based on an output voltage. In some implementations, the operating mode may be determined by a control signal.

If the determined operating mode is to recirculate the inductor current, then the process continues to step 225. At step 225, the bypass switch Q3/Q4 is turned on to circulate current in the output inductor L1 through the bypass switch Q3/Q4. The process then continues to step 210, where the process starts over and repeats.

If the determined operating mode is to supply the load with the inductor current, then the process continues to step 230. At step 230, the method turns off the bypass switch to circulate the inductor current through the output capacitor and the freewheeling rectifier. The process then continues to step 210, where the process starts over and repeats. In this mode, the low-side FET Q2 may be turned off allowing return current to pass through the body diode of low-side FET Q2. In some examples, the low-side FET Q2 may be turned on for higher efficiency and to act as a synchronous rectifier.

Figure 3A:
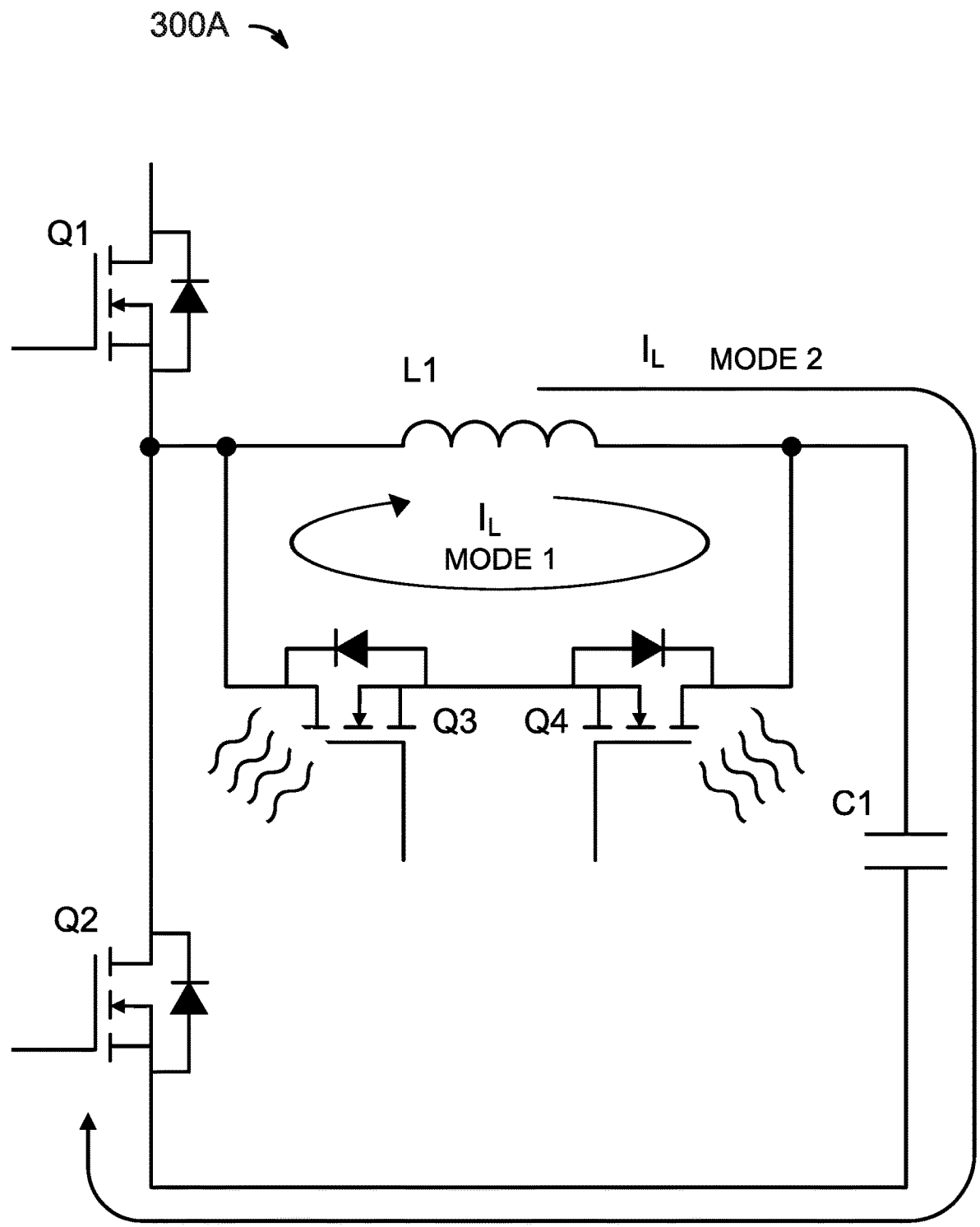
FIG. 3A depicts an exemplary TQB implemented on a BPS and operating in a second post load dump (PLD2) function.

FIG. 3A depicts an exemplary TQB implemented on a BPS and operating in a second post load dump (PLD2) function. A TQB implementation 300A includes the elements described in the TQB implementation 200A with reference to FIG. 2A. As in the TQB implementation 200A, the output capacitor C1 may supply a load demand.

In the BPS of this example, with the bypass switch Q3/Q4 in parallel with the output inductor L1, in response to a decrease in average load demand, in a first mode (e.g., mode 1), the bypass switch Q3/Q4 is turned on to selectively circulate current from the output inductor L1 through the bypass switch Q3/Q4. In a second mode (mode 2), the bypass switch Q3/Q4 is operated in a linear mode to circulate the inductor current through the output capacitor C1 and the low-side FET Q2 rectifier. The second mode (e.g., mode 2) may continuously transfer a controlled amount of energy stored in the output inductor L1 to the output capacitor C1.

Figure 3B:
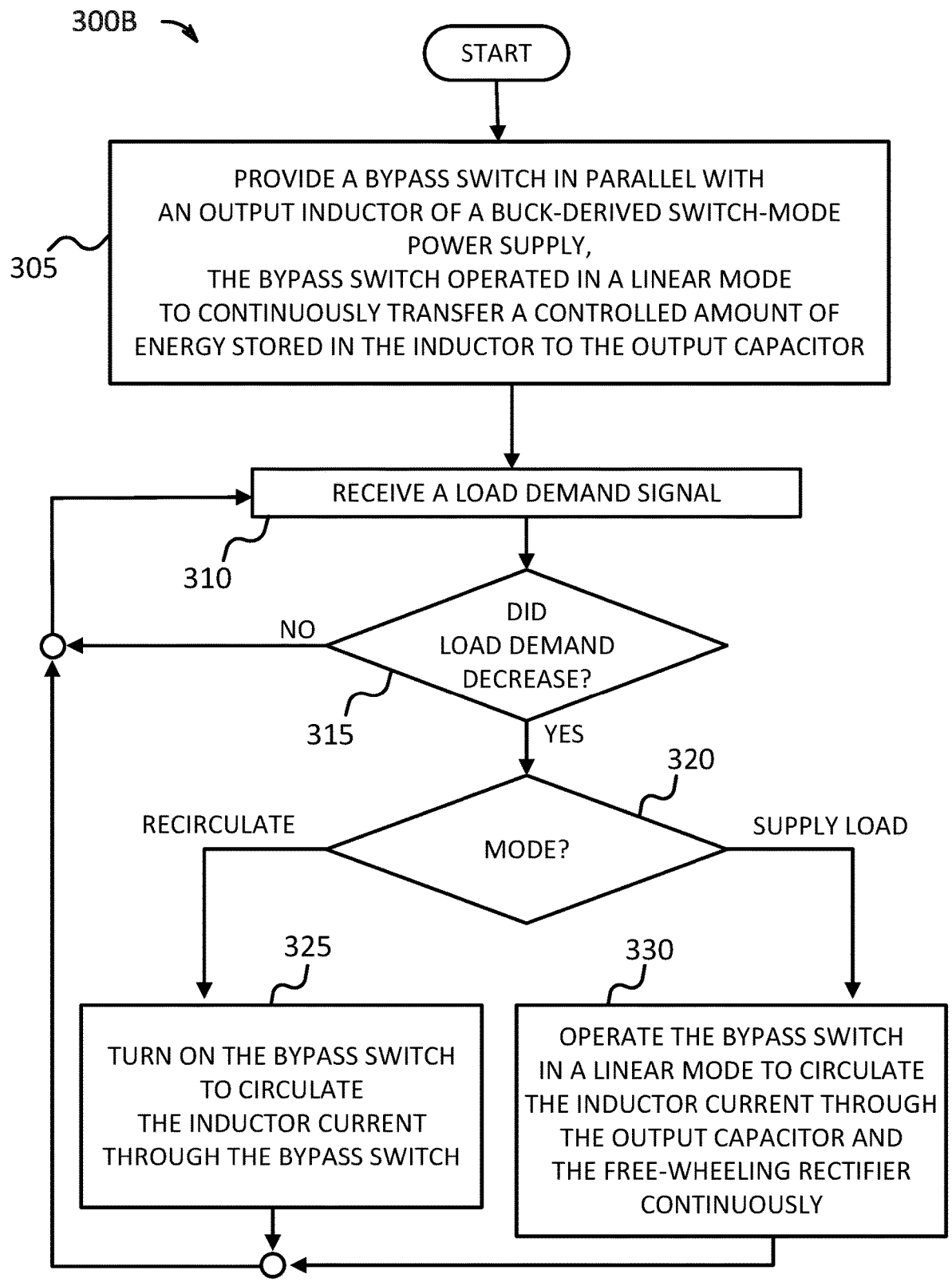
FIG. 3B depicts a flowchart view of an exemplary TQB implemented on a BPS operating in a second post load dump (PLD2) function.

FIG. 3B depicts a flowchart view of an exemplary TQB implemented on a BPS operating in a second post load dump (PLD2) function. A second post load dump process 300B begins at a step 305. At step 305, the bypass switch Q3/Q4 is provided in parallel with the output inductor L1 of the BPS. Next, at step 310, the process receives a load demand signal. Next, at step 315, the process determines a load demand direction. If the load demand has increased, then the process jumps back to step 310. If the load demand has decreased, then the process continues to step 320. At step 320, the process determines an operating mode. If the determined operating mode is to recirculate the inductor current, then the process continues to step 325. At step 325, the bypass switch Q3/Q4 is turned on to circulate current in the output inductor L1 through the bypass switch Q3/Q4.

If the determined operating mode is to supply current to the load, then the process continues to step 330. At step 330, the bypass switch Q3/Q4 is operated in a linear mode to circulate the current in the output inductor L1 through the output capacitor C1, and through the low-side FET Q2. Accordingly, the second load dump process 300B may selectively release, with the bypass switch Q3/Q4, a controlled amount of energy stored in the output inductor L1, at a more continuous rate, to the output capacitor C1, by operating in the linear mode.

Figure 4A:
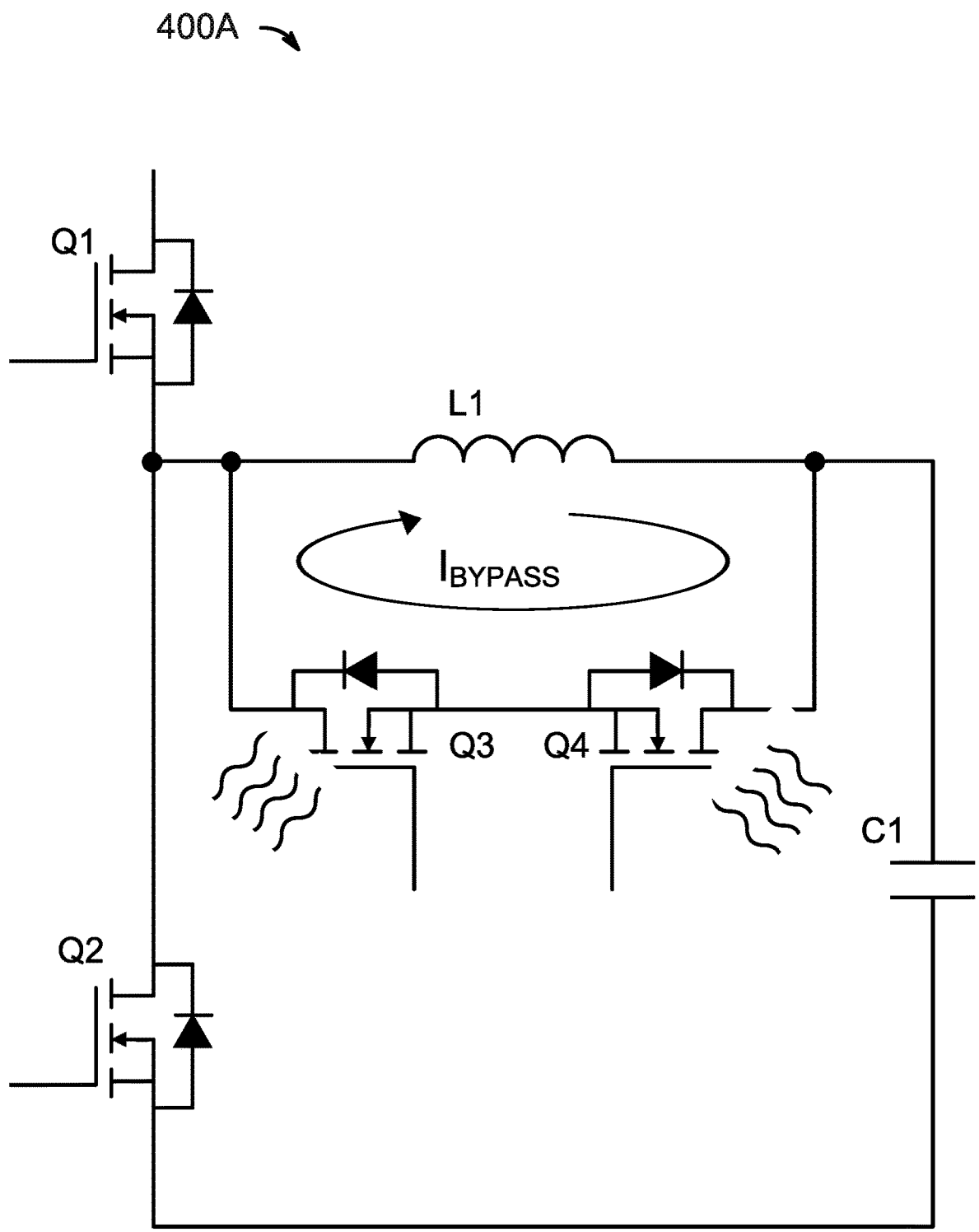
FIG. 4A depicts an exemplary TQB implemented on a BPS and operating in a third post load dump (PLD3) function.

FIG. 4A depicts an exemplary TQB implemented on a BPS and operating in a third post load dump (PLD3) function. A TQB implementation 400A includes the elements described in the TQB implementation 200A with reference to FIG. 2A. As in the TQB implementation 200A, the output capacitor C1 may supply a load demand.

In the BPS of this example, with the bypass switch Q3/Q4 in parallel with the output inductor L1, in response to a decrease in load demand, the bypass switch Q3/Q4 is controlled to operate in a resistive mode to dissipate excess energy stored in the inductor L1. Dissipation of the excess energy stored in the inductor L1 may be advantageous in situations where the load may not need the energy in the near future, for example, when the loads are turned off or disconnected from the BPS.

Figure 4B:
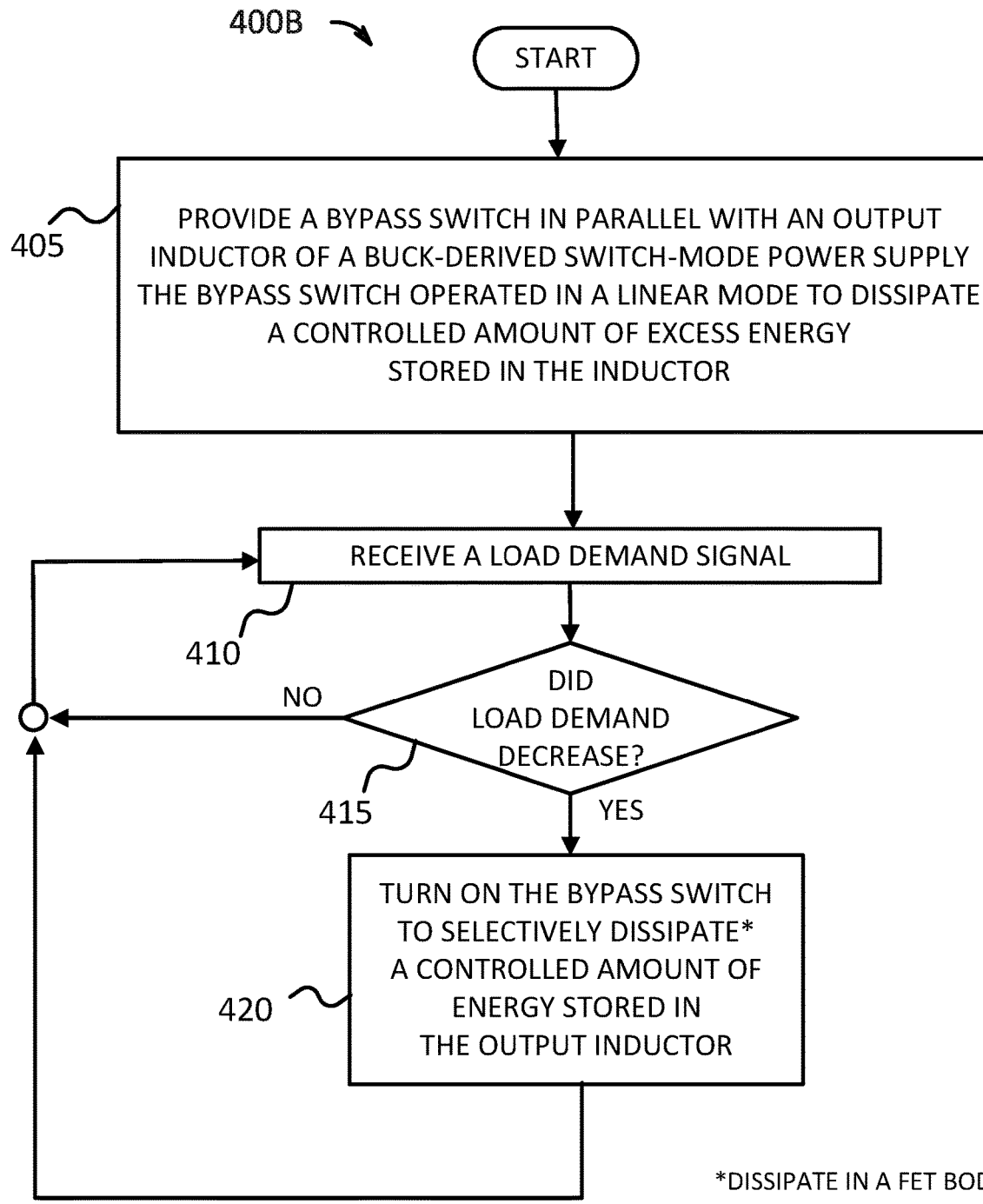
FIG. 4B depicts a flowchart view of an exemplary TQB implemented on a BPS operating in a third post load dump (PLD3) function.

FIG. 4B depicts a flowchart view of an exemplary TQB implemented on a BPS operating in a third post load dump (PLD3) function. A third post load dump process 400B begins at a step 405. At step 405, the bypass switch Q3/Q4 is provided in parallel with the output inductor L1 of a BPS. Next, at step 410, the process receives a load demand signal. Next, at step 415, the process determines a load demand direction. If the load demand has increased, then the process jumps back to step 410. If the load demand has decreased, then the process continues to step 420. At step 420, the process the bypass switch Q3/Q4 is turned on to selectively dissipate a controlled amount of energy stored in the output inductor L1. For example, the energy may be dissipated in a body diode of the first bypass FET Q3. The energy may be dissipated, for example, in the first bypass FET Q3 operating in a resistive mode, alone or in combination with the body diode of the first bypass FET Q3. The energy may be dissipated, for example, in the second bypass FET Q4 operating in a resistive mode alone or in combination with the first bypass FET Q3 operating in a resistive mode and/or the body diode of the first bypass FET Q3.

Figure 5A:
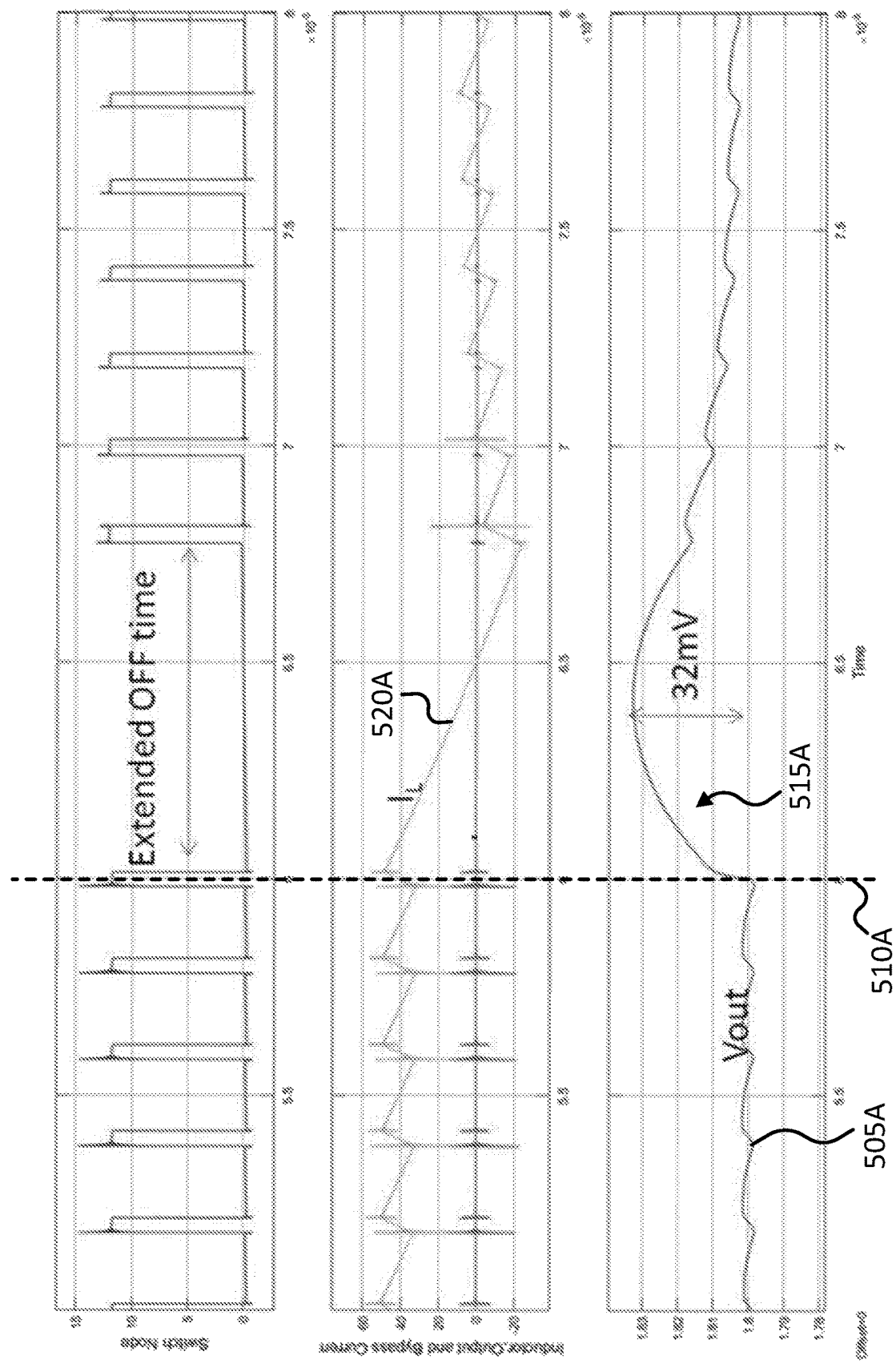
FIG. 5A depicts a chart view of the response of a BPS without an exemplary TQB implementation.

FIG. 5A depicts a chart view of the response of a BPS without an exemplary TQB implementation. An output voltage 505A is shown for a BPS without an exemplary TQB implementation. At the time identified by 510A, a load suddenly releases a substantial current draw, for example, the load may suddenly drop from 50 amps to 5 amps. In response to the sudden load release, the output voltage 505A increases due to more output inductor current $I_L$ 520A being directed into an output capacitance instead of into the load. In the depicted example, the output voltage 505A includes a 32-mV transient surge 515A.

Figure 5B:
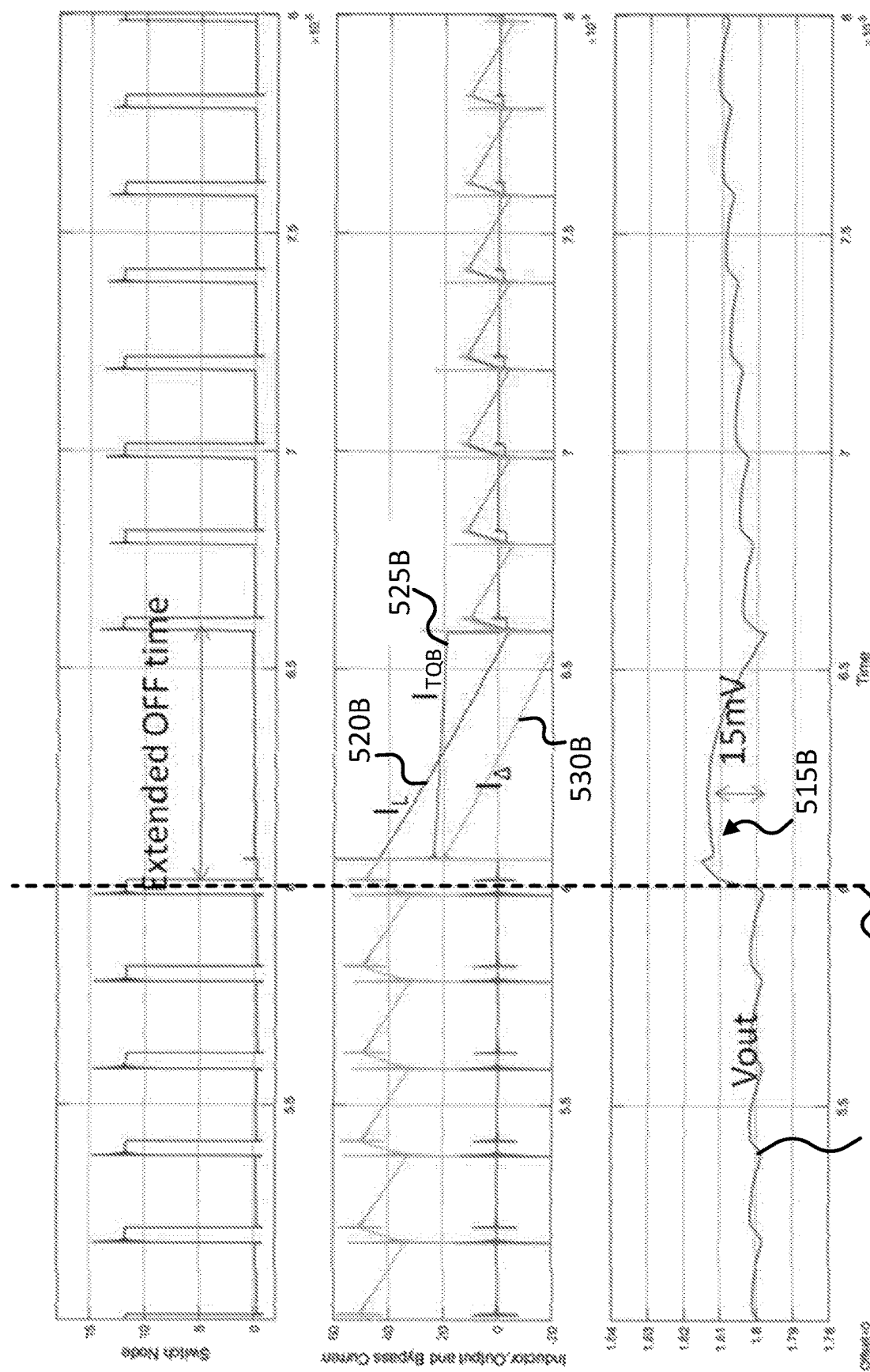
FIG. 5B depicts a chart view of the response of a BPS with an exemplary TQB implementation.

FIG. 5B depicts a chart view of the response of a BPS with an exemplary TQB implementation. An output voltage 505B is shown for a BPS with an exemplary TQB implementation. At the time identified by 510B, a load suddenly releases a substantial current draw, for example, the load may suddenly drop from 50 amps to 5 amps. In response to the sudden load release, the output voltage 505B increases due to more output inductor current $I_L$, 520B, being directed into an output capacitance instead of into the load. In the depicted example, some of the output inductor current $I_L$ 520B, is directed into the TQB implementation. The current directed into the TQB implementation is identified as $I_{TQB}$ 525B. The resulting current into the output capacitor is then $I_A$ 530B. Accordingly, since the resulting current into the output capacitor $I_A$ 530B is reduced, so is the output voltage 505B. In the depicted example, the output voltage 505B includes a 15-mV transient surge 515B.

Figure 6A:
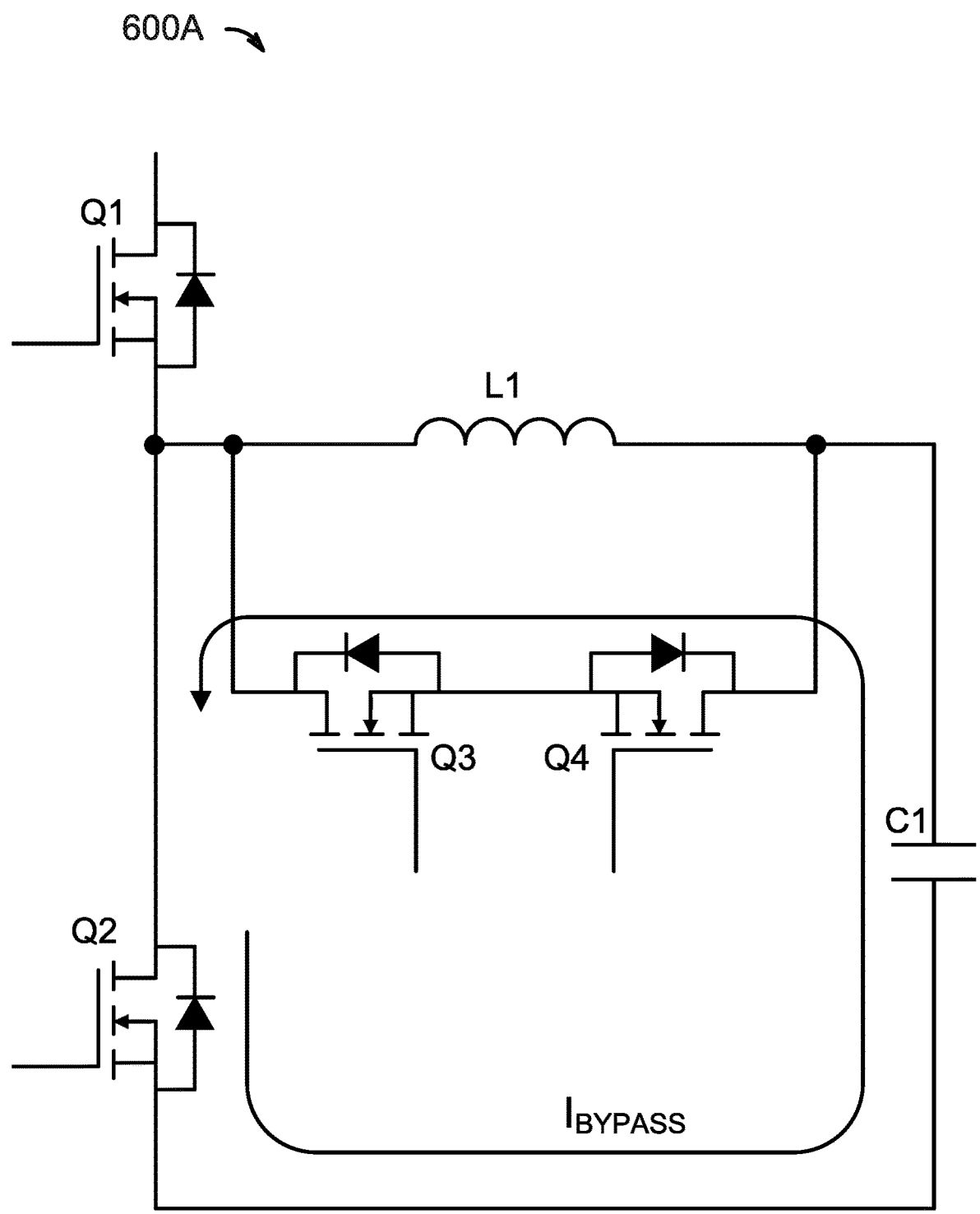
FIG. 6A depicts an exemplary TQB implemented on a BPS and operating in a first output voltage clamp (OVC1) function.

FIG. 6A depicts an exemplary TQB implemented on a BPS and operating in a first output voltage clamp (OVC1) function. A TQB implementation 600A includes the elements described in the TQB implementation 200A with reference to FIG. 2A. As in the TQB implementation 200A, the output capacitor C1 may supply an output voltage.

In the BPS of this example, with the bypass switch Q3/Q4 in parallel with the output inductor L1, the bypass switch Q3/Q4 being controlled to operate in a resistive mode to clamp an output voltage on the output capacitor C1 through a low-side FET Q2. In an illustrative example, in response to the output voltage on the output capacitor C1 exceeding a predetermined threshold, a preprogrammed controller may operate the bypass switch Q3/Q4 in a resistive mode and may turn on the low-side FET Q2. Current from the output capacitor C1 may then flow through the bypass switch Q3/Q4 and through the low-side FET Q2. Accordingly, energy may be dissipated in the bypass switch Q3/Q4, which may clamp the voltage across the output capacitor C1. The amount of energy dissipation may be controlled by the preprogrammed controller operating the bypass switch Q3/Q4.

Figure 6B:
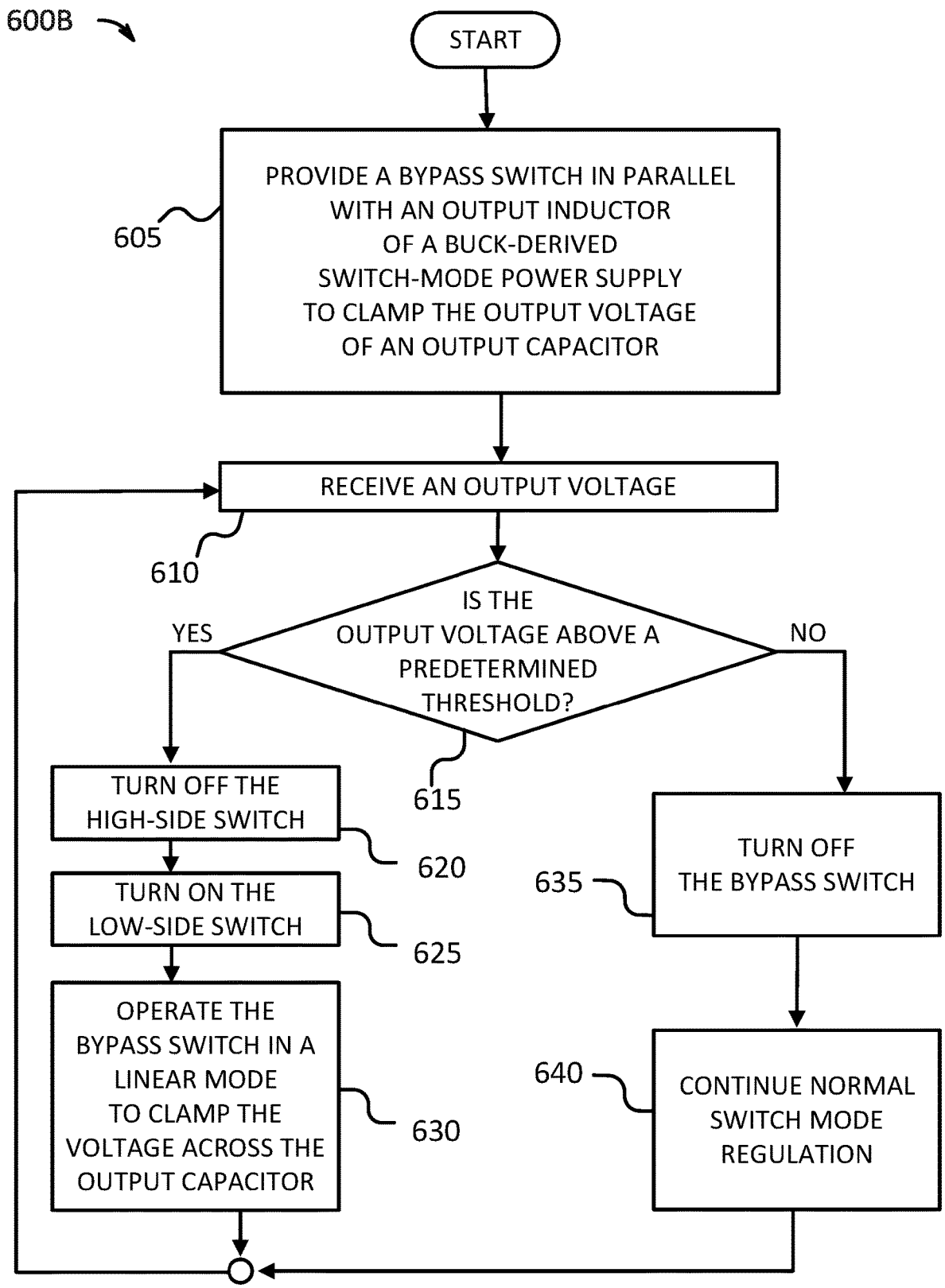
FIG. 6B depicts a flowchart view of an exemplary TQB implemented on a BPS operating in a first output voltage clamp (OVC1) function.

FIG. 6B depicts a flowchart view of an exemplary TQB implemented on a BPS operating in a first output voltage clamp (OVC1) function. A first output voltage clamp process 600B begins at a step 605. At step 605, the bypass switch Q3/Q4 is provided in parallel with the output inductor L1 of the BPS. Next, at step 610, the process receives an output voltage signal. Next, at step 615, the process compares the output voltage with a predetermined threshold.

If the output voltage is above the predetermined threshold, then the process proceeds to step 620. At step 620, the process turns off the high-side FET Q1. Next at step 625, the process turns on the low-side FET Q2. Finally, at step 630, the process operates the bypass switch Q3/Q4 in a linear mode to clamp a voltage across the output capacitor C1, before jumping back to step 610.

If the output voltage is below the predetermined threshold, then the process proceeds to step 635. At step 635, the process turns off the bypass switch Q3/Q4. Next, at step 640, the process goes back to or resumes normal switch-mode operation, then jumps back to step 610.

Figure 7A:
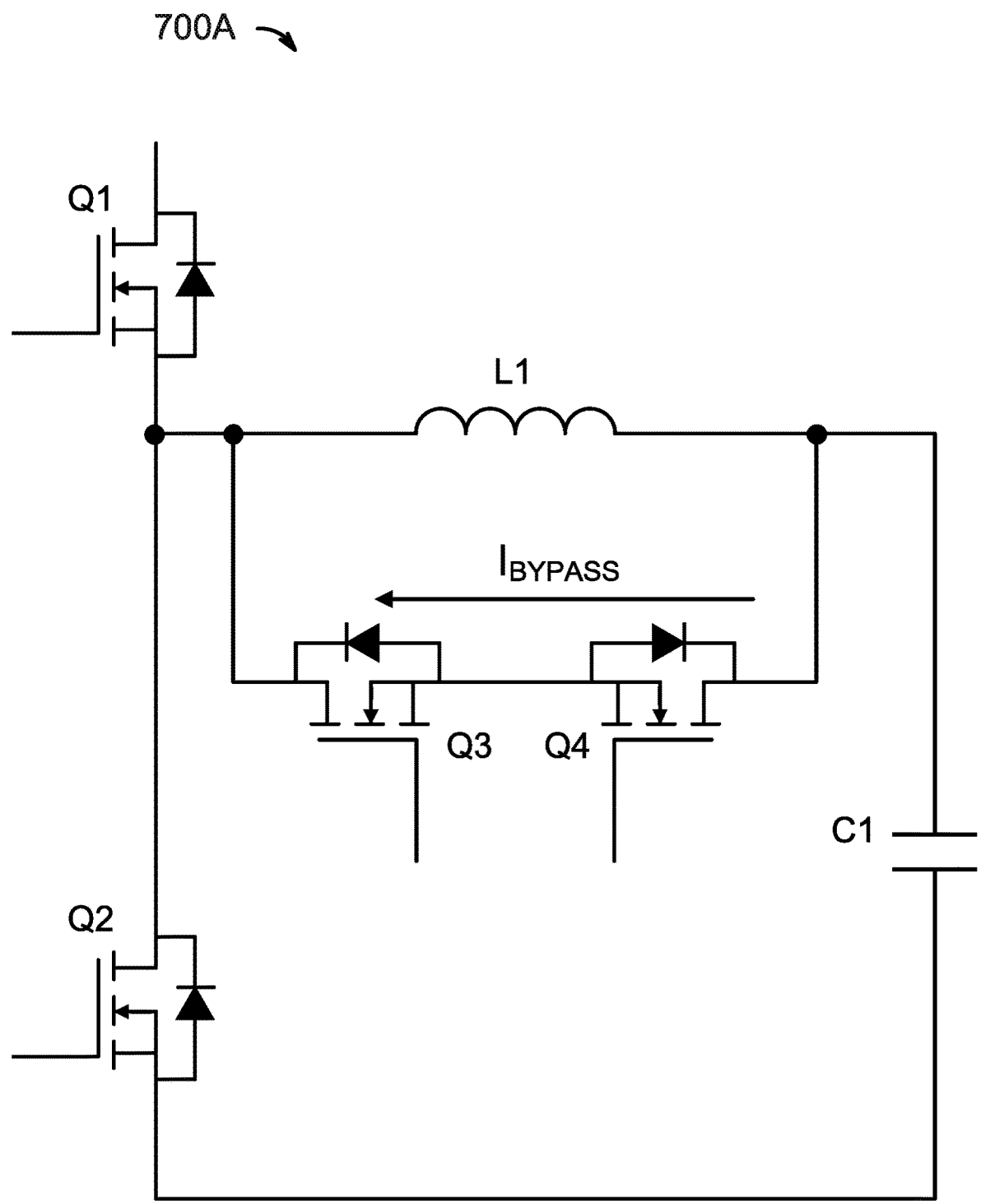
FIG. 7A depicts an exemplary TQB implemented on a BPS and operating in a second output voltage clamp (OVC2) function.

FIG. 7A depicts an exemplary TQB implemented on a BPS and operating in a second output voltage clamp (OVC2) function. A TQB implementation 700A includes the elements described in the TQB implementation 200A, with reference to FIG. 2A. As in the TQB implementation 200A, the output capacitor C1 may supply an output voltage and an output current. The output voltage and/or output current may include a ringing characteristic.

In the BPS of this example, with the bypass switch Q3/Q4 in parallel with the output inductor L1, the bypass switch Q3/Q4 being controlled to operate in a resistive mode to clamp an output voltage on the output capacitor C1 through a low-side FET Q2. In an illustrative example, in response to an output ringing characteristic from a decrease in average load demand, the bypass switch Q3/Q4 is controlled to operate in a resistive mode to adjust a quality factor (Q) of the output inductor-capacitor (LC) L1, C1 circuit combination to dynamically tune an output ringing characteristic.

Figure 7B:
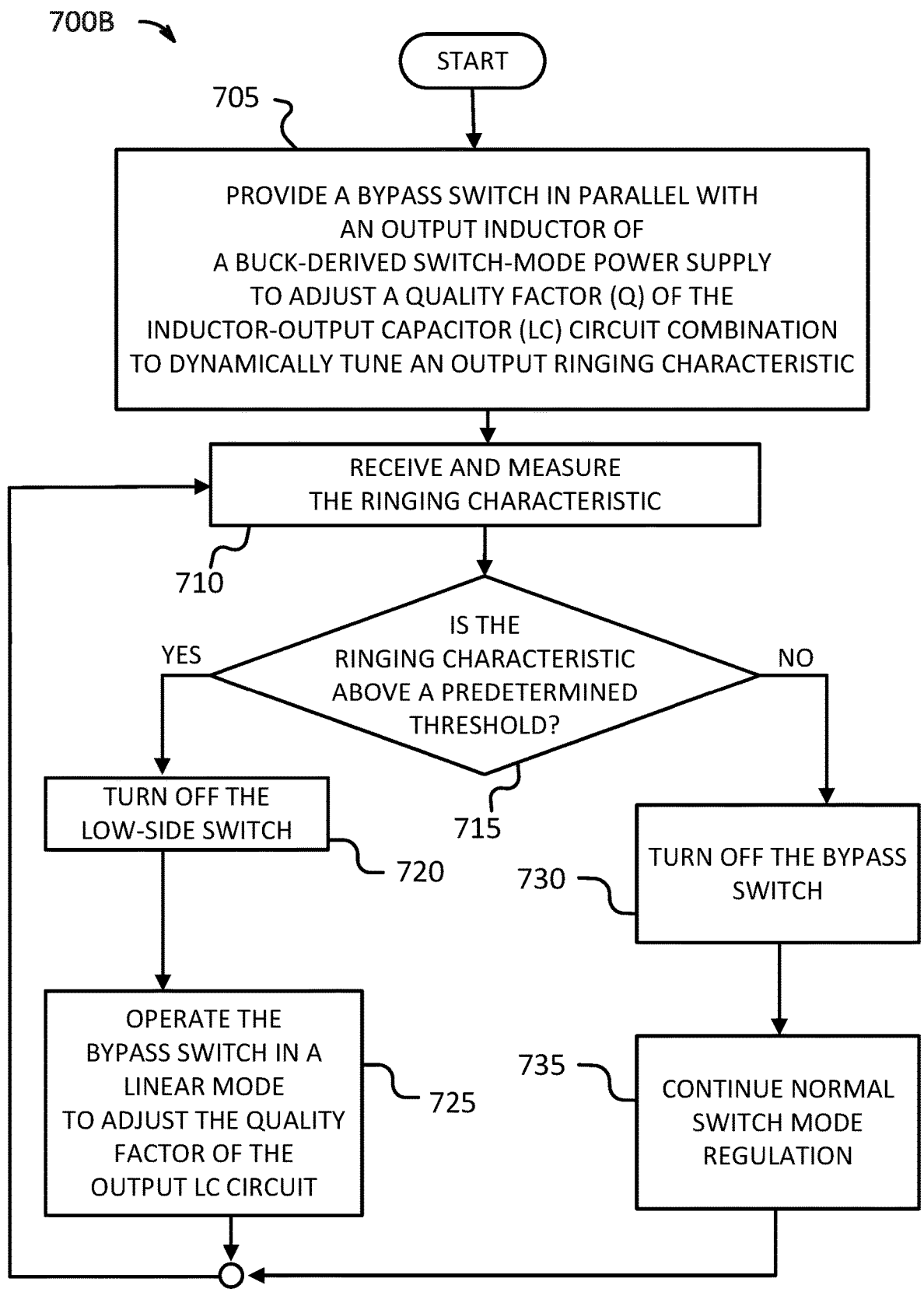
FIG. 7B depicts a flowchart view of an exemplary TQB implemented on a BPS operating in a second output voltage clamp (OVC2) function.

FIG. 7B depicts a flowchart view of an exemplary TQB implemented on a BPS operating in a second output voltage clamp (OVC2) function. A second output voltage clamp process 700B begins at a step 705. At step 705, the bypass switch Q3/Q4 is provided in parallel with the output inductor L1 of a BPS. Next, at step 710, the process receives and measures a ringing characteristic. Next, at step 715, the process compares the ringing characteristic with a predetermined threshold.

If the ringing characteristic is above the predetermined threshold, then the process proceeds to step 720. At step 720, the process turns off the high-side FET Q1. Finally, at step 725, the process operates the bypass switch Q3/Q4 in a linear mode to adjust the quality factor (Q) of the output inductor-capacitor (LC) L1, C1 circuit, before jumping back to step 710. Accordingly, the bypass switch Q3/Q4 is operated in a linear mode to substantially eliminate or reduce the ringing characteristic.

If the ringing characteristic is below the predetermined threshold, then the process proceeds to step 730. At step 730, the process turns off the bypass switch Q3/Q4. Next, at step 735, the process goes back to or resumes normal switch-mode operation, then jumps back to step 710.

Figure 8A:
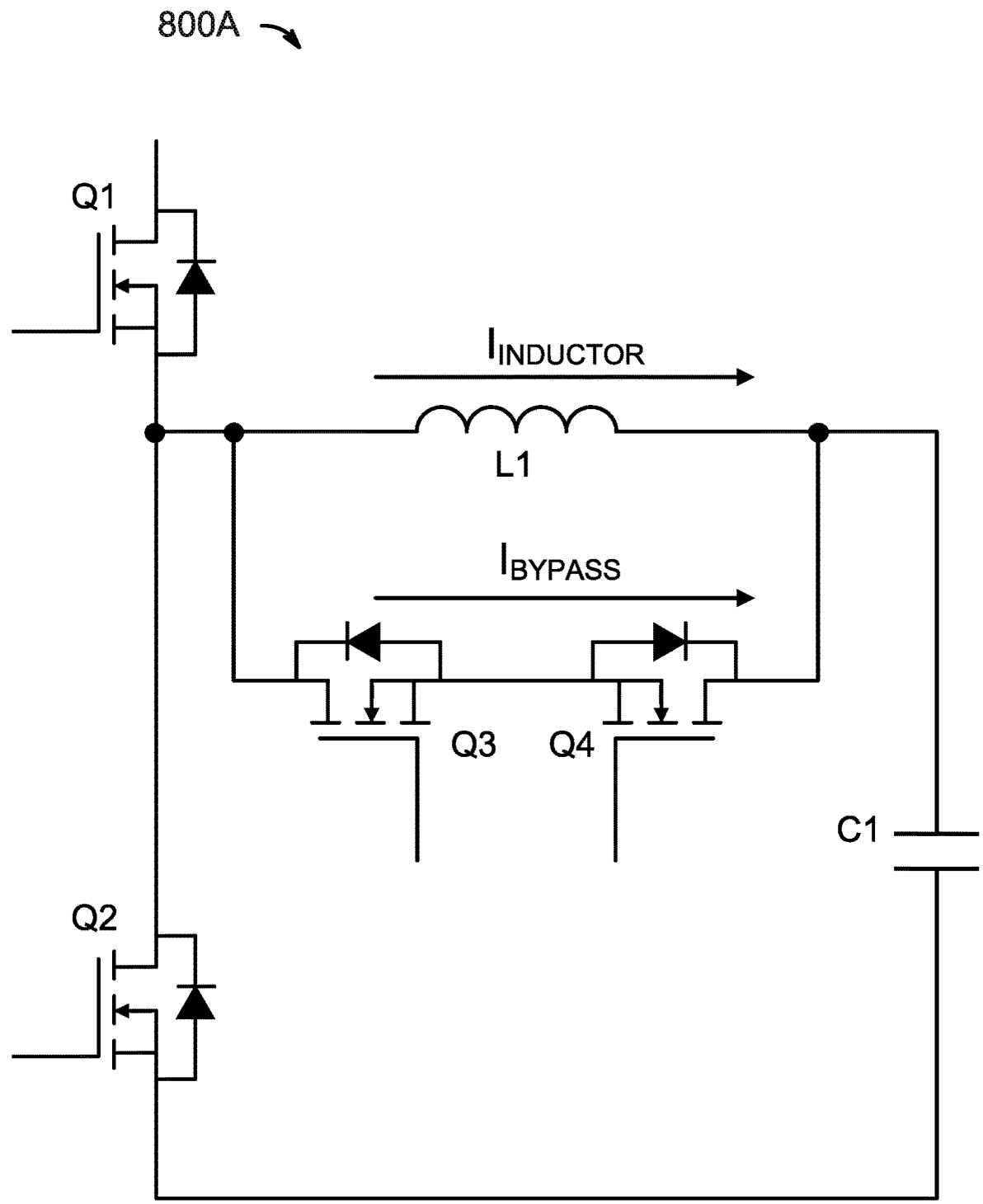
FIG. 8A depicts an exemplary TQB implemented on a BPS operating in a transient speed-up (TSU) function.

FIG. 8A depicts an exemplary TQB implemented on a BPS operating in a transient speed-up (TSU) function. A TQB implementation 800A includes the elements described in the TQB implementation 200A, with reference to FIG. 2A. As in the TQB implementation 200A, the output capacitor C1 may supply a load demand. In the BPS of this example, with the bypass switch Q3/Q4 in parallel with the output inductor L1, the bypass switch Q3/Q4 may allow a bypass current $I_{BYPASS}$ to flow in parallel with the inductor current $I_{INDUCTOR}$ to deliver extra current to a load in response to an increase in load demand.

Figure 8B:
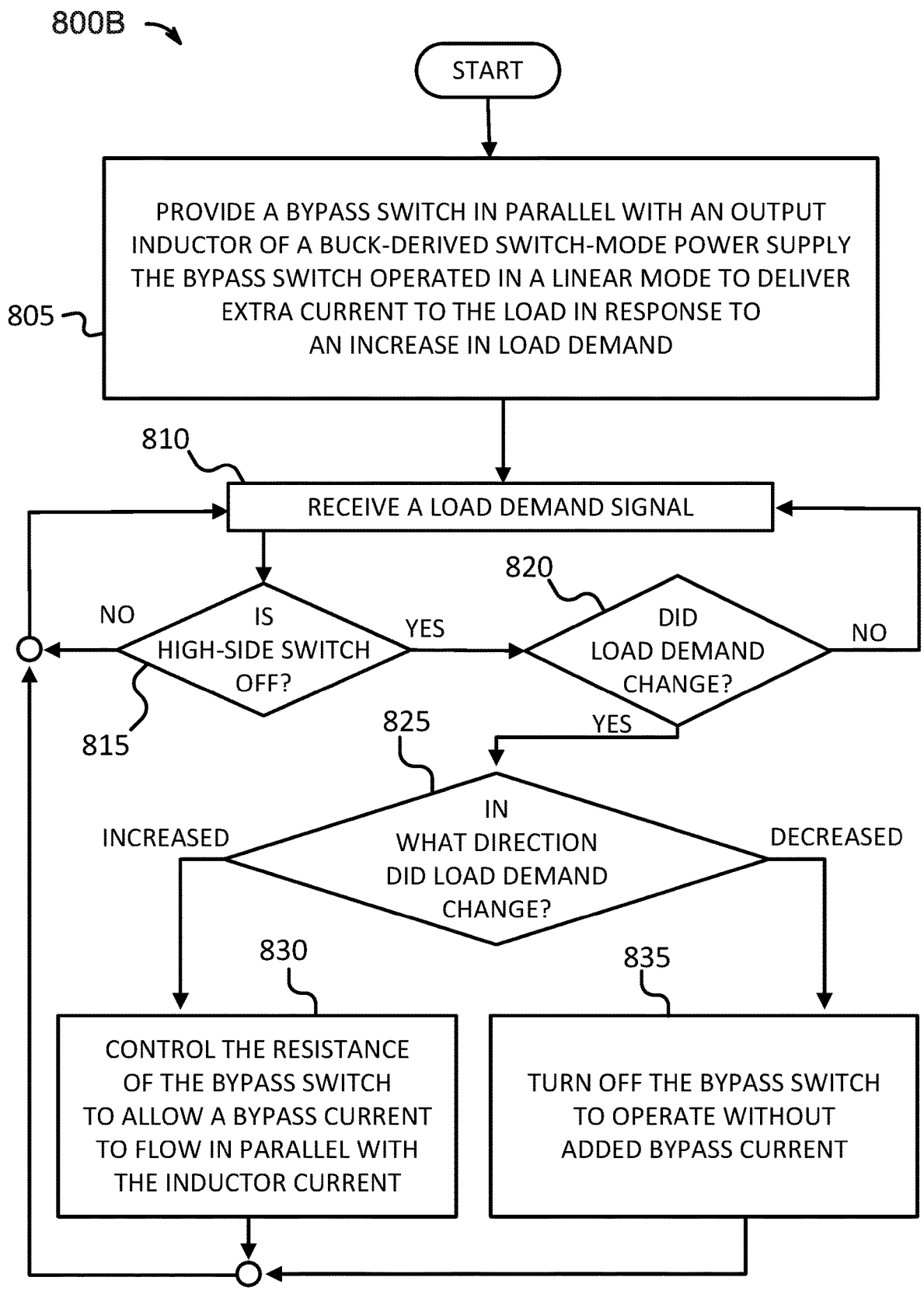
FIG. 8B depicts a flowchart view of an exemplary TQB implemented on a BPS operating in a transient speed-up (TSU) function.

FIG. 8B depicts a flowchart view of an exemplary TQB implemented on a BPS operating in a transient speed-up (TSU) function. A transient speed-up process 800B begins at a step 805. At step 805, the bypass switch Q3/Q4 is provided in parallel with the output inductor L1 of a BPS. Next, at step 810, the process receives and measures a load demand signal. Next, at step 815, the process determines the state of the high-side FET Q1. If the high-side FET is on, then the process jumps back to step 810. If the high-side FET is off, then the process proceeds to step 820. At step 820, the process determines a changed state of the load demand. If the load demand has not changed then the process jumps back to step 810. If the load demand has changed, the process continues to step 825. At step 825, the process determines a load demand change direction.

If the load demand has increased, then the process proceeds to step 830. At step 830, the process controls the resistance of the bypass switch Q3/Q4 to allow a bypass current $I_{BYPASS}$ to flow in parallel with the output inductor current $I_{INDUCTOR}$. The controlled bypass current $I_{BYPASS}$ may advantageously substantially mitigate transient voltage dips on the output voltage signal.

If the load demand has decreased, then the process proceeds to step 835. At step 835, the process turns off the bypass switch Q3/Q4 to operate without added bypass current $I_{BYPASS}$.

Figure 9A:
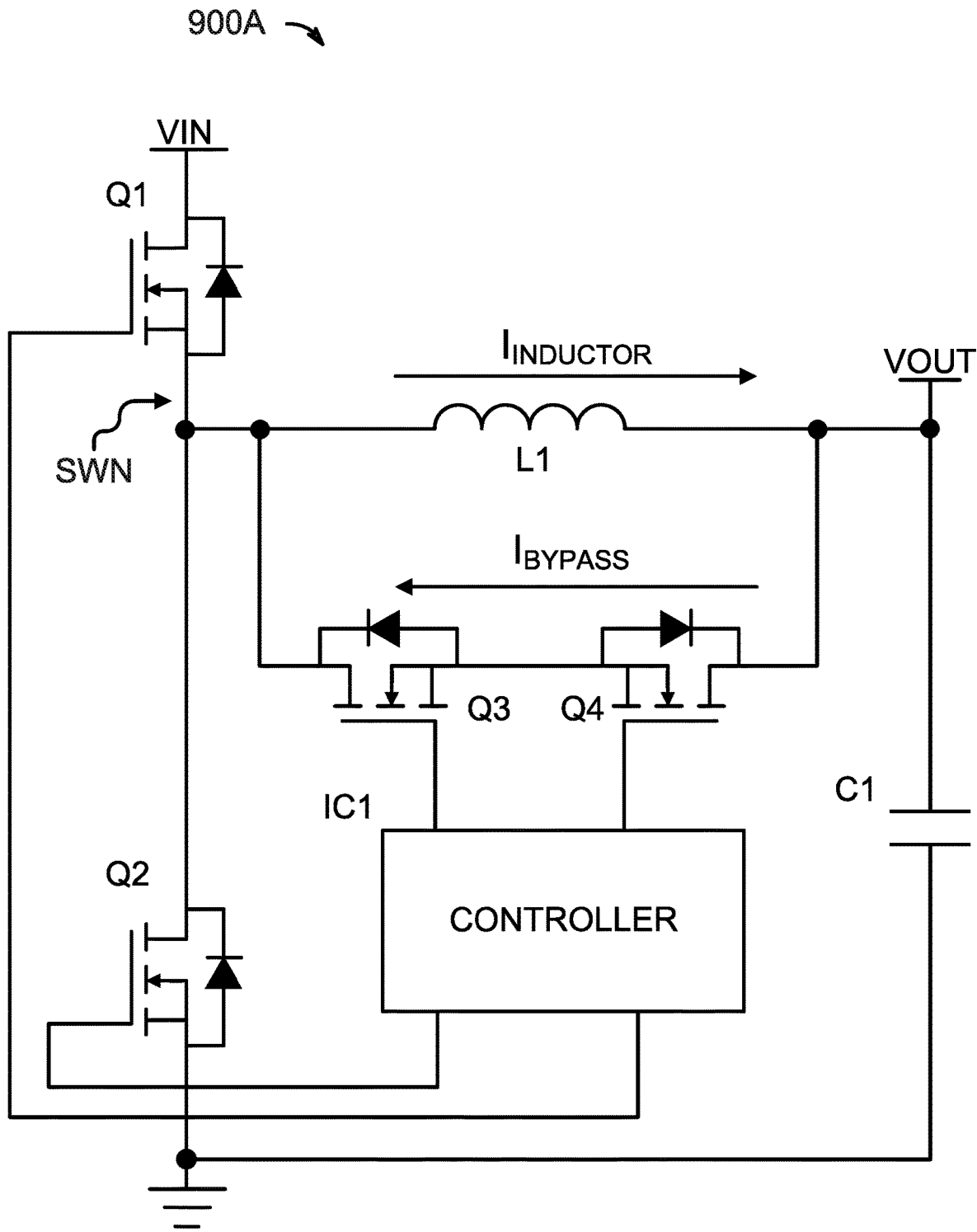
FIG. 9A depicts an exemplary TQB implemented on a BPS operating in a switch node ring suppression (SNRS) function.

FIG. 9A depicts an exemplary TQB implemented on a BPS operating in a switch node ring suppression (SNRS) function. A TQB implementation 900A includes the elements described in the TQB implementation 200A, with reference to FIG. 2A. As in the TQB implementation 200A, the output capacitor C1 may supply a load demand.

In the depicted example, the high-side FET Q1 couples a DC supply VIN to a switch node SWN. The output inductor L1 connects the switch node SWN to an output node VOUT. A bypass switch Q3/Q4 is in parallel with the output inductor L1. The bypass switch Q3/Q4 is configured to operate in a resistive mode when the low-side FET Q2 turns off and before the high-side switch Q1 turns on. When operating in this configuration, the circuit may selectively form a current path $I_{BYPASS}$ to snub oscillating energy on the switch node SWN. In the depicted example, a controller IC1 is configured to operate the FETs Q1, Q2, Q3 and Q4 in the modes described.

Figure 9B:
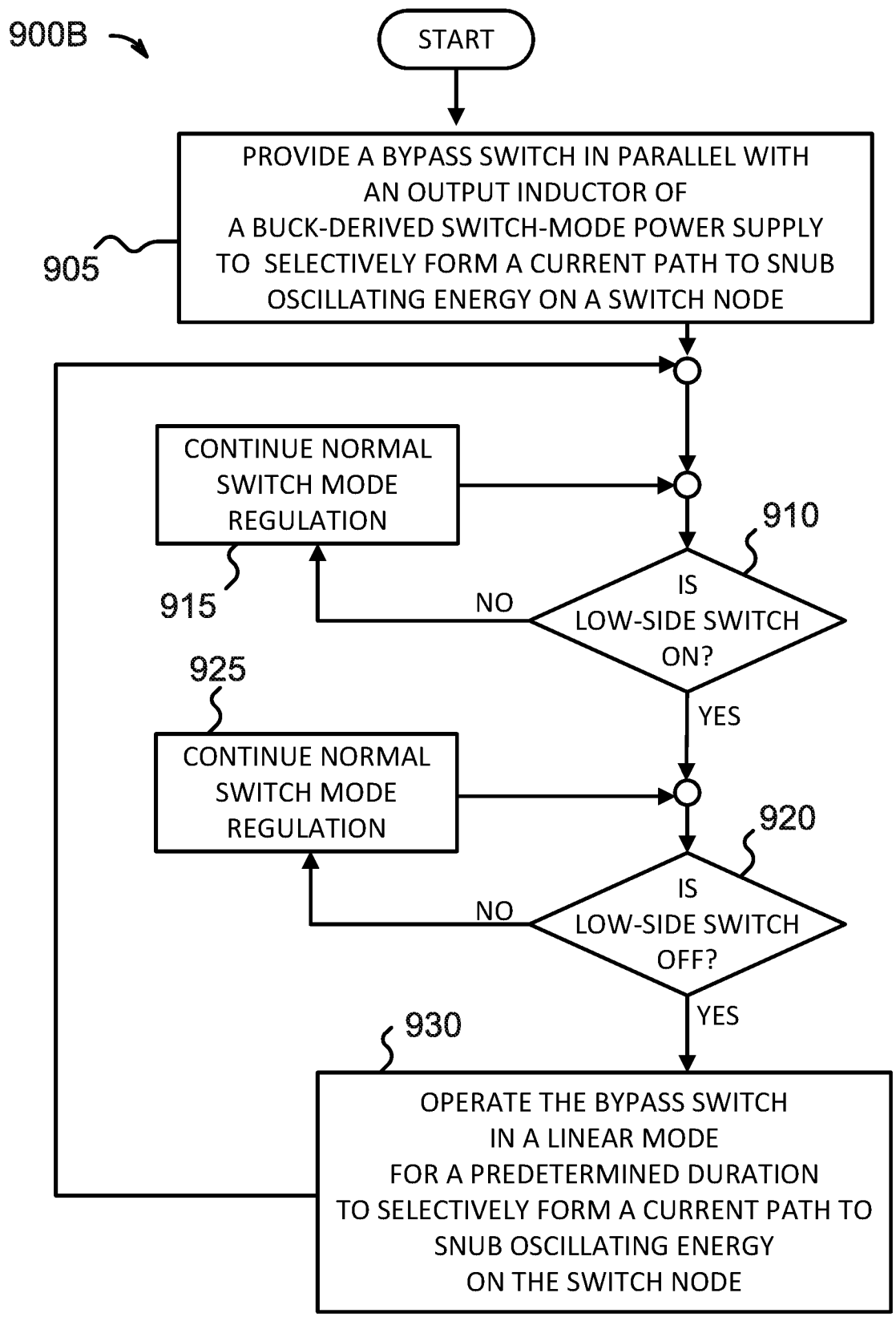
FIG. 9B depicts a flowchart view of an exemplary TQB implemented on a BPS operating in a switch node ring suppression (SNRS) function.

FIG. 9B depicts a flowchart view of an exemplary TQB implemented on a BPS operating in a switch node ring suppression (SNRS) function. A switch node ring suppression process 900B begins at a step 905. At step 905, the bypass switch Q3/Q4 is provided in parallel with the output inductor L1 of a BPS.

In the proceeding steps 910-925, the process continues to loop through normal switch mode operation until reaching an instant where the low-side FET Q2 is at a switch edge going from an on-state to an off-state. Specifically, at steps 910 and 915, the low-side FET Q2 operates normally until the low-side FET Q2 turns on. Then, at steps 920 and 925, the low-side FET Q2 operates normally until the low-side FET Q2 turns off. Accordingly, at step 930, the low-side FET Q2 is at an instant in time where the switching edge is going from an on-state to an off-state.

As points of further clarification, referring back to step 910, the low-side FET Q2 off-state may be the current operating state upon exiting step 930. Similarly, at step 920, the low-side FET Q2 on-state may be the current operating state upon exiting step 910.

Continuing now with the process flow at step 910, the process determines a state of the low-side FET Q2. If the low-side FET Q2 is off, then the process proceeds to step 915, where the normal switch-mode process continues. Next, the process continues by jumping back to step 910. If the low-side FET Q2 is on, then the process proceeds to step 920. At step 920, the process determines the state of the low-side FET Q2, again. If the low-side FET Q2 is on, then the process proceeds to step 925, where the normal switch-mode process continues. Next, the process continues by jumping back to step 920. If the low-side FET Q2 is off, then the process proceeds to step 930.

When the process reaches step 930, the process has determined an instant when the high-side FET Q1 has just turned off. At this instant, the process operates the bypass switch Q3/Q4 in a resistive mode to selectively form a current path, such as $I_{BYPASS}$, with reference to FIG. 9A, to snub oscillating energy on the switch node SWN. In an illustrative example, the process may be executed by a controller such as controller IC1, with reference to FIG. 9A. The process may execute preprogrammed instructions from a memory store.

Figure 10A:
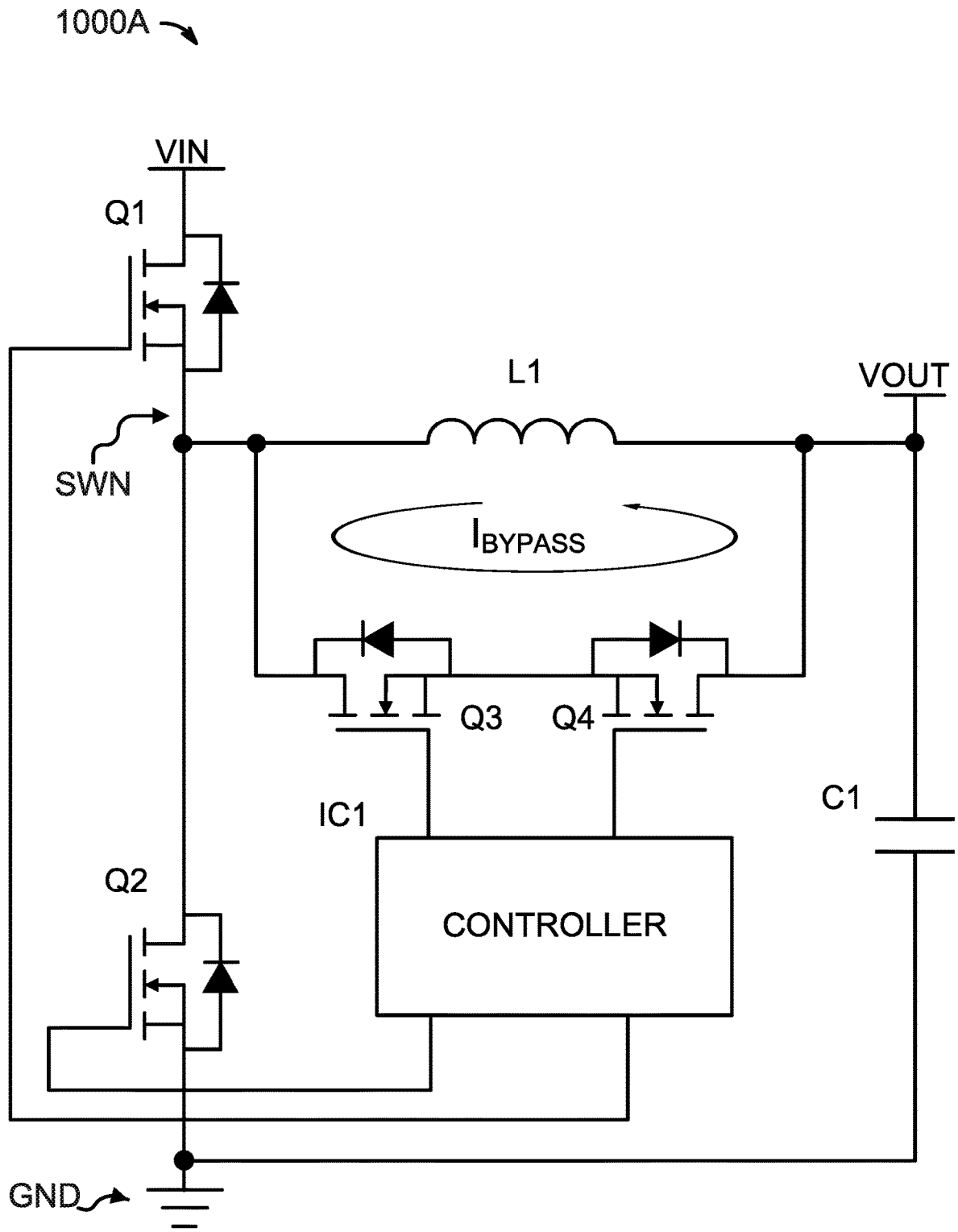
FIG. 10A depicts an exemplary TQB implemented on a BPS operating in discontinuous-mode (DCM).

FIG. 10A depicts an exemplary TQB implemented on a BPS operating in a discontinuous-mode (DCM) ring suppression (DCMRS) function. A TQB implementation 1000A includes the elements described in the TQB implementation 200A, with reference to FIG. 2A. As in the TQB implementation 200A, the output capacitor C1 may supply a load demand. A BPS may include a TQB implementation 1000A.

In the depicted example, the TQB implementation 1000A includes the low-side FET Q2. A reference node GND is coupled to the switch node SWN when the low-side FET Q2 is on. The output inductor L1 connects the switch node SWN to an output node VOUT. The bypass switch Q3/Q4 is in parallel with the output inductor L1.

In operation, when the low-side FET Q2 is turned off, for example, in response to the current through the low-side switch reaching zero, the bypass switch Q3/Q4 is configured to operate in a resistive mode to selectively form a current path to dissipate remaining energy in the output inductor L1. In various examples, the bypass switch Q3/Q4 is configured to operate in a resistive mode to selectively form a current path to control ringing on the switch node.

In some operational examples, when both the high-side FET Q1 and the low-side FET Q2 are off, and in response to current in the output inductor L1 flowing in the direction of $I_{BYPASS}$ (FIG. 10A), the bypass switch Q3/Q4 is turned on to trap energy in the output inductor L1. Next, when the high-side FET Q1 is about to turn on, the bypass switch Q3/Q4 is turned off. Current will now flow from the inductor into the switch node SWN. Current flow into the switch node SWN may cause the switch node SWN to increase in voltage. The increase in the voltage at the switch node SWN may reduce switching losses on the high-side switch.

Figure 10B:
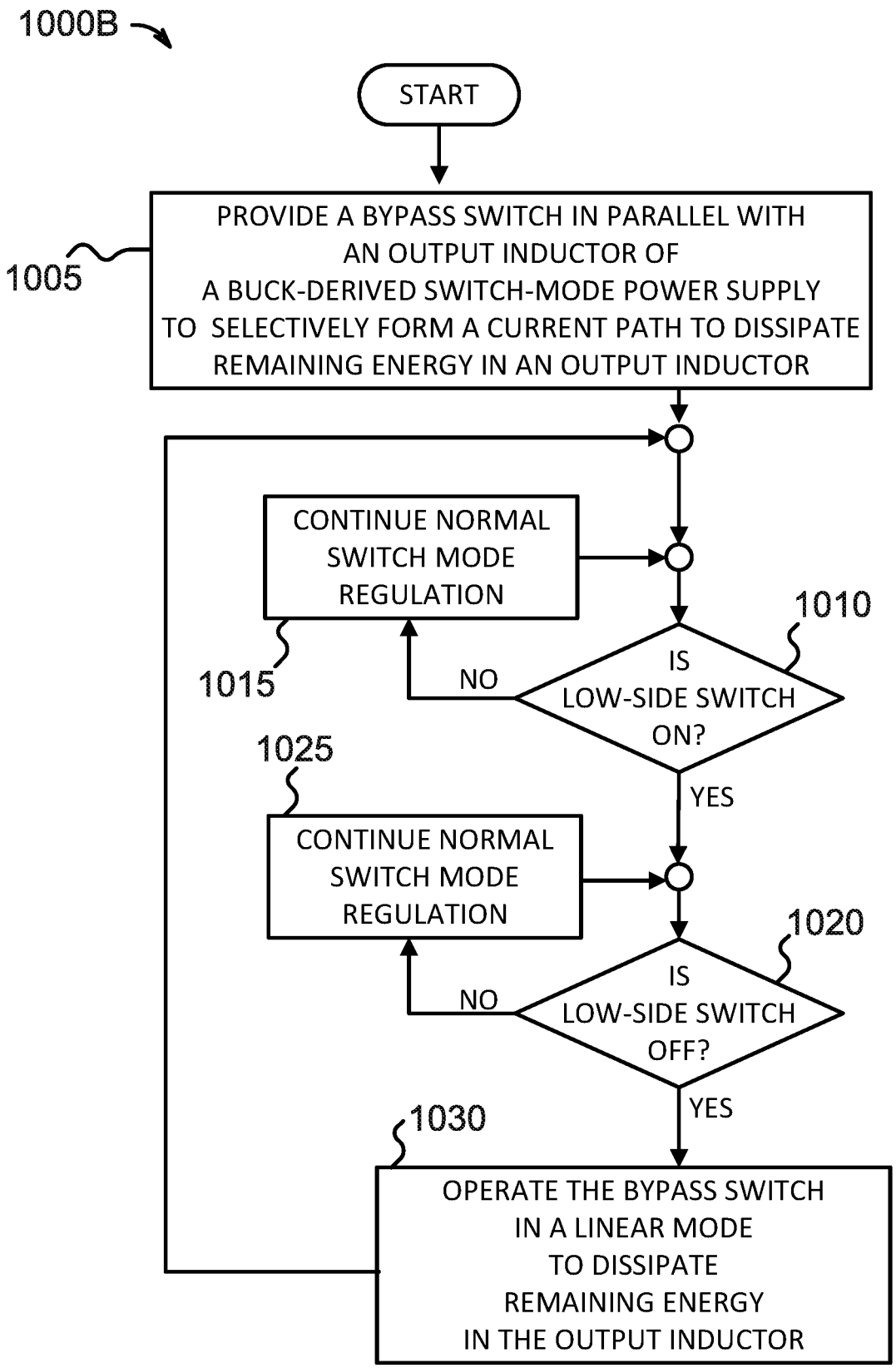
FIG. 10B depicts a flowchart view of an exemplary TQB implemented on a BPS operating in discontinuous-mode (DCM) ring suppression (DCMRS) function.

FIG. 10B depicts a flowchart view of an exemplary TQB implemented on a BPS operating in discontinuous-mode (DCM) ring suppression (DCMRS) function. A discontinuous mode ring suppression process 1000B begins at a step 1005. At step 1005, the bypass switch Q3/Q4 is provided in parallel with the output inductor L1 of a BPS. Next, at step 1010, the process determines a state of the low-side FET Q2. If the low-side FET Q2 is off, then the process proceeds to step 1015, where the normal switch-mode process continues. Next, the process continues by jumping back to step 1010. If at step 1010, the low-side FET Q2 is on, then the process proceeds to step 1020. At step 1020, the process determines the state of the low-side FET Q2, again. If the low-side FET Q2 is on, then the process proceeds to step 1025, where the normal switch-mode process continues. Next, the process continues by jumping back to step 1020.

If at step 1020, the low-side FET Q2 is off, then the process proceeds to step 1030. When the process reaches step 1030, the process has determined an instant when the low-side FET Q2 has just turned off. At this instant, the process operates the bypass switch Q3/Q4 in a resistive mode to selectively form a current path, such as $I_{BYPASS}$, with reference to FIG. 10A, to dissipate any remaining energy in the output inductor L1. In an illustrative example, the process may be executed by a state mode controller such as controller IC1, with reference to FIG. 10A. The process may execute preprogrammed instructions from a memory store. In various examples, the controller may have a state mode control algorithm to determine the operating state of the TQB, and determine appropriate control actions to apply, for example, on the various switches in the system.

Figure 10C:
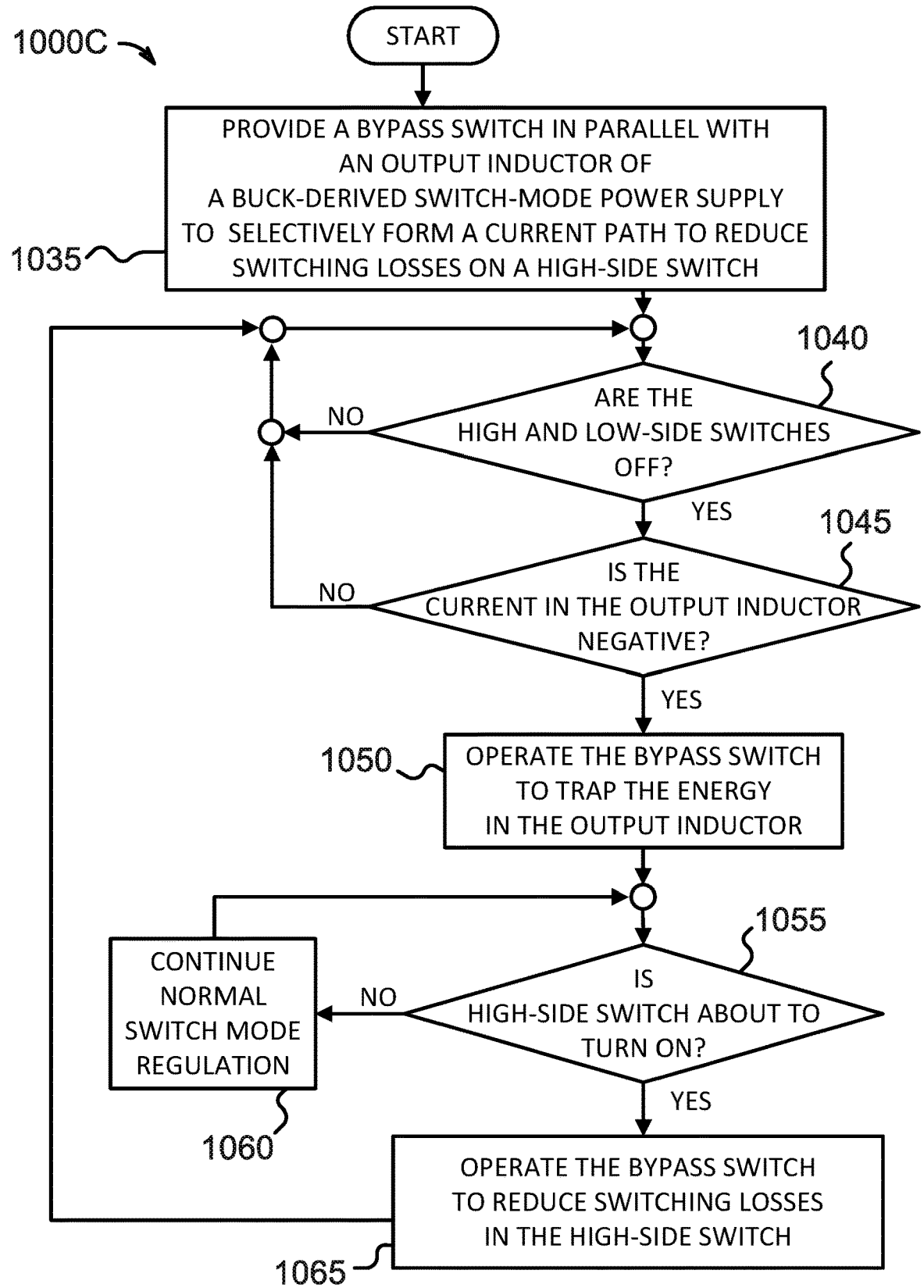
FIG. 10C depicts a flowchart view of an exemplary TQB implemented on a BPS operating in discontinuous-mode (DCM) switching loss suppression (DCMSLS) function.

FIG. 10C depicts a flowchart view of an exemplary TQB implemented on a BPS operating in discontinuous-mode (DCM) switching loss suppression (DCMSLS) function. A discontinuous mode switching loss suppression process 1000C begins at a step 1035. At step 1035, the bypass switch Q3/Q4 is provided in parallel with the output inductor L1 of a BPS. Next, at step 1040, the process determines a state of the high-side FET Q1 and low-side FET Q2. If the high-side FET Q1 and/or the low-side FET Q2 are/is on, then the process repeats step 1040. If both the high-side FET Q1 and low-side FET Q2 are off, then the process proceeds to step 1045. At step 1045, the process determines a current in the output inductor L1. If the current in the output inductor L1 is negative (e.g., current follows the $I_{BYPASS}$ arrow of FIG. 19A), then the process proceeds to step 1050. If the current in the output inductor is positive, then the process jumps back to step 1040.

At step 1050, the process operates the bypass switch Q3/Q4 to trap energy in the output inductor L1, then proceeds to step 1055. At step 1055, the process determines the incipient state of the high-side FET Q1. If, at step 1055, the high-side FET is not about to turn on, then the process proceeds to step 1060. At step 1060, the process allows the BPS to continue operation in normal switch mode regulation, then jumps back to step 1055. If, at step 1055, the high-side FET is about to turn on, then the process proceeds to step 1065. At step 1065, the process turns on (e.g., operates) the bypass switch Q3/Q4 to allow current to flow into the switch node SWN (FIG. 19A). The current flow may increase the voltage at the switch node SWN and may decrease switching losses of the high-side FET Q1 due to an apparent reduction of voltage across the channel of the high-side FET Q1.

Figure 11:
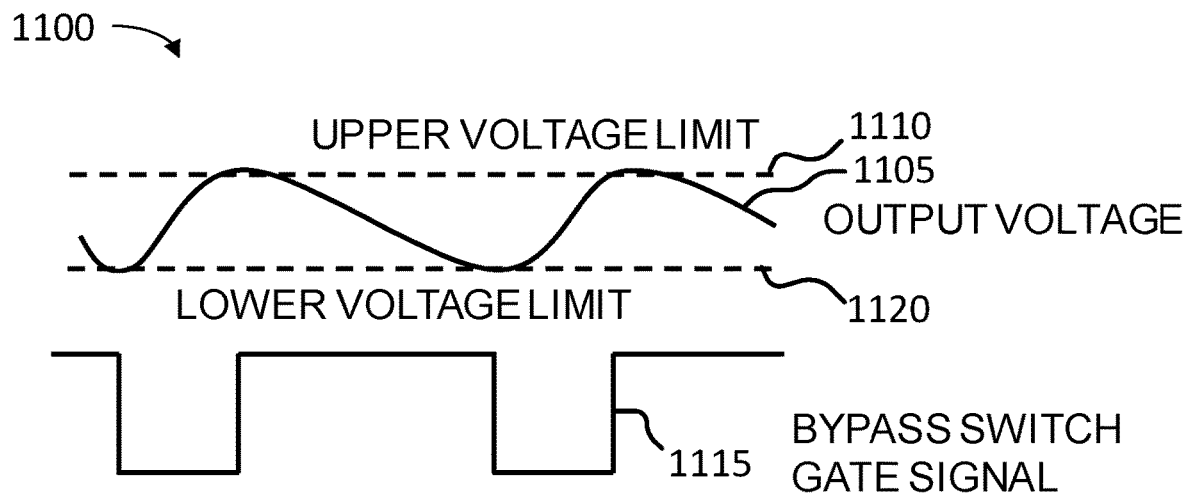
FIG. 11 depicts a chart view of an exemplary hysteretic inductive energy release operation of a TQB implemented on a BPS.

FIG. 11 depicts a chart view of an exemplary hysteretic inductive energy release operation of a TQB implemented on a BPS. A hysteretic inductive energy release operation 1100 may operate on the elements described in the TQB implementation 200A, with reference to FIG. 2A. A BPS may include a TQB implementation, such as the TQB implementation 200A.

In the depicted example, the BPS may include a bypass switch Q3/Q4 in parallel with an output inductor L1. When a high-side FET Q1 is off, and in a first mode, in response to an output voltage 1105 reaching a predetermined upper limit 1110, the bypass switch Q3/Q4 is turned on, via a bypass switch gate signal 1115, to selectively circulate current in the output inductor L1 through the bypass switch Q3/Q4. When a high-side FET Q1 is off, and in a second mode, in response to the output voltage 1105 reaching a predetermined lower limit 1120 the bypass switch Q3/Q4 is turned off, via the bypass switch gate signal 1115, to circulate the current in the output inductor L1 through the output capacitor C1 and the low-side FET Q2, to selectively transfer a controlled amount of energy stored in the inductor to the output capacitor C1. The first mode and the second mode may be alternately executed until just before the high-side FET Q1 is turned on, at which point normal switch-mode power supply regulation may occur. In some examples, the first mode and the second mode may be alternately executed until a predetermined threshold indicative of the energy remaining in the output inductor L1 is reached, at which point normal switch-mode power supply regulation may occur.

The hysteretic inductive energy release operation 1100 may advantageously make use of the energy that is already in the output inductor L1 by supplying it to the output capacitor C1 in a controlled manner. The hysteretic inductive energy release operation 1100 may advantageously deliver a controlled amount of energy to the output capacitor C1, such that output voltage is further regulated. The hysteretic inductive energy release operation 1100 may reduce the amount of capacitance needed. In various implementations, the current in the bypass switch Q3/Q4 may be monitored to determine how much energy is left in the output inductor L1, while the current is circulating. Once the current drops below a predetermined amount of energy left in the inductor, the bypass switch Q3/Q4 may be turned off, for example, to allow the rest of the inductive energy out, or the bypass switch Q3/Q4 may be turned on to keep the current in the output inductor L1 circulating.

Various current monitoring techniques may be employed, for example, current may be monitored with a current mirror in the bypass switches Q3 and/or Q4. In some implementations, the current may be monitored by monitoring the voltage drop across the $R_{DS\text{-}ON}$ of the bypass switch Q3 and/or Q4. The current may be measured by implementing a series RC filter across the inductor, then measuring the voltage across the capacitor. These current monitoring techniques are presented by way of example and not limitation. Various other methods may be employed.

Figure 12:
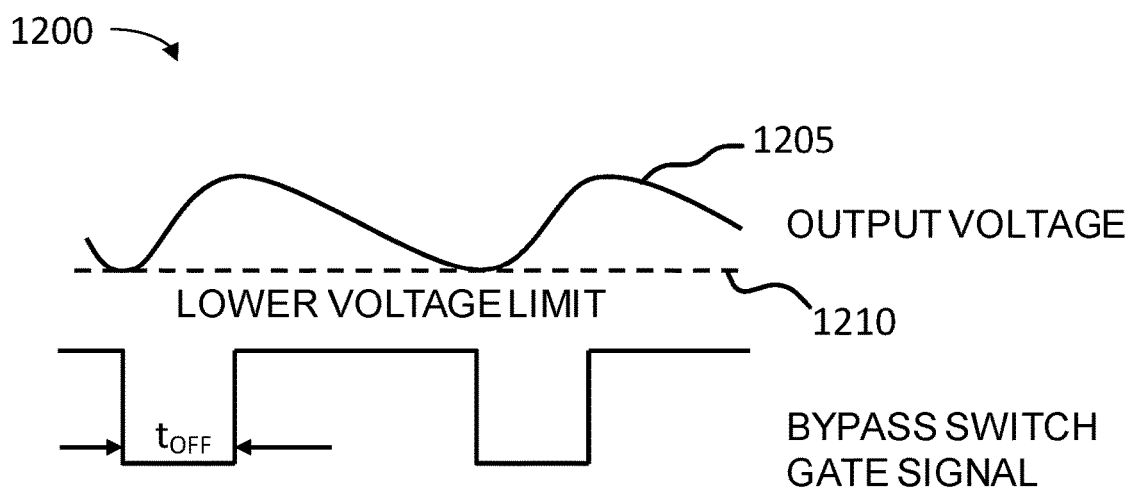
FIG. 12 depicts a chart view of an exemplary constant off-time inductive energy release operation of a TQB implemented on a BPS.

FIG. 12 depicts a chart view of an exemplary constant off-time inductive energy release operation of a TQB implemented on a BPS. A constant off-time inductive energy release operation 1200 may operate on the elements described in the TQB implementation 200A, with reference to FIG. 2A. A BPS may include a TQB implementation, such as the TQB implementation 200A.

In the depicted example, the BPS may include a bypass switch Q3/Q4 in parallel with an output inductor L1. When a high-side FET Q1 is off, and in a first mode, when an output voltage 1205 drops to a lower threshold 1210 the bypass switch is turned off for a predefined period of time $t_{OFF}$. When the bypass switch Q3/Q4 is off for the predefined period of time $t_{OFF}$, a controlled amount of energy from the output inductor L1 is released into one or more output capacitors C1, which may increase the output voltage 1205 for the predefined period of time $t_{OFF}$. When the predefined period $t_{OFF}$ has elapsed, the bypass switch Q3/Q4 is turned on again, which may cause the output voltage 1205 to decay again and start the process all over again. The constant off-time inductive energy release operation 1200 may repeat when the capacitor voltage reaches the lower limit, for example.

Figure 13:
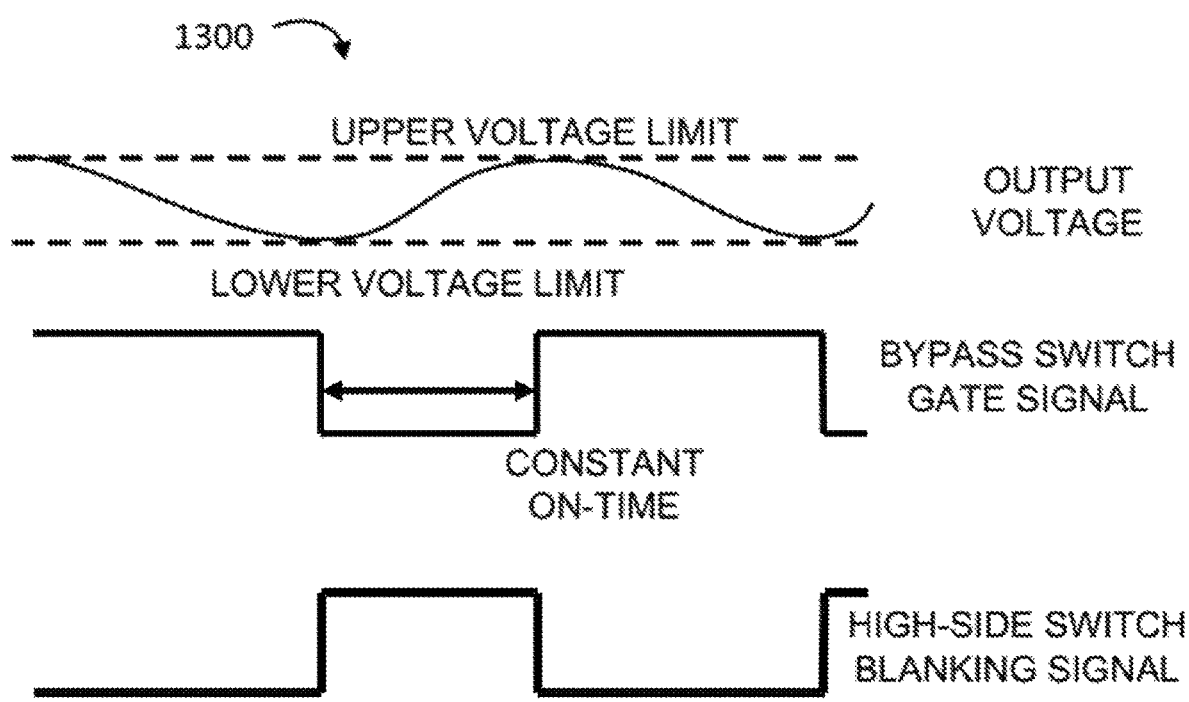
FIG. 13 depicts a chart view of an exemplary constant on-time inductive energy release operation of a TQB implemented on a BPS.

FIG. 13 depicts a chart view of an exemplary constant on-time inductive energy release operation of a TQB implemented on a BPS. Constant on-time inductive energy release may be employed to regulate the output voltage. If a constant on-time regulator is used, the BPS can be used in place of the high side switch to provide energy to the load and output capacitor. Instead of the high-side switch providing energy from the bulk input supply, energy that is being circulated in the bypass switch is released to the output capacitor. In operation, when the regulator control signals the high side switch to turn on, the high side switch will be blanked or over-ridden and the BPS will be turned off for the duration (e.g., a constant time) that the high side switch is signaled to be turned on. In this situation, the low side switch can be turned on while the BPS is turned off. When the regulator signals the high side switch to turn off, the BPS is turned back on and the low side switch may be turned off.

Figure 14:
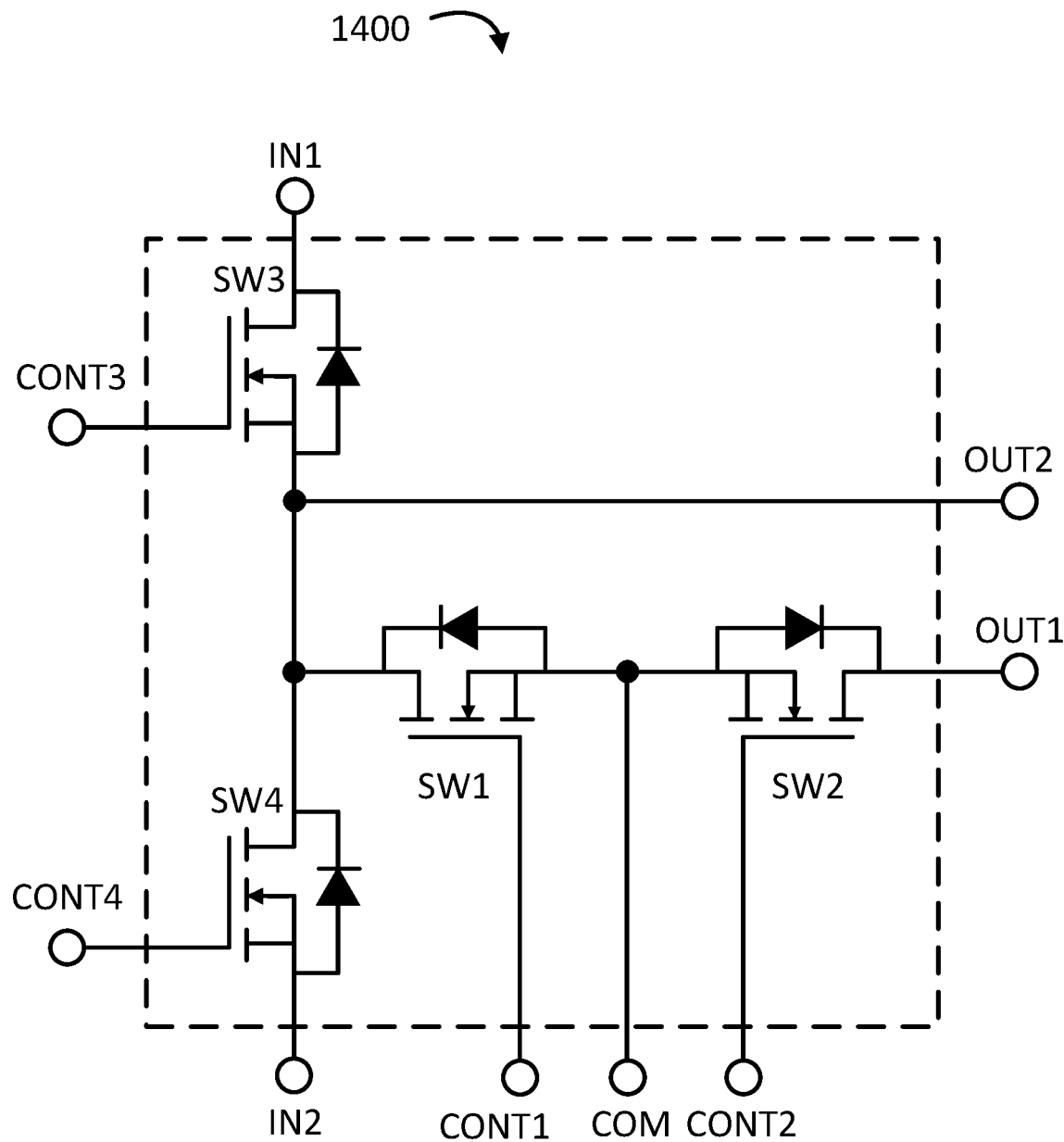
FIG. 14 depicts a schematic view of an exemplary TQB.

FIG. 14 depicts a schematic view of an exemplary TQB. A TQB 1400 includes a first switch SW1 and a second switch SW2 implemented in n-channel MOSFETs. The first switch SW1 is coupled on an output (source) to the common terminal COM. The first switch SW1 is coupled on an input (drain) to a second output terminal OUT2. The first switch SW1 is coupled on a control gate to a first control input terminal CONT1. The second switch SW2 is coupled on an input (drain) to a first output terminal OUT1. The second switch SW2 is coupled on a control gate to a second control input terminal CONT2. The second switch SW2 is coupled on an output (source) to a common terminal COM. A third switch SW3, configured as a high side or main switch, is coupled on an output (source) to the second output terminal OUT2. The third switch SW3 is coupled on an input (drain) to a first input terminal IN1. The third switch SW3 is coupled on a control gate to a third control input terminal CONT3. A fourth switch SW4, configured as a freewheeling rectifier that may be actively operated as a synchronous rectifier to minimize conduction losses when the main switch SW3 is not conducting and current is being supplied to the load via the output terminals OUT1 and OUT2. The fourth switch SW4 is coupled on an input (drain) to a node that connects to the second output terminal OUT2. The fourth switch SW4 is coupled on an output (source) to a second input terminal IN2. The fourth switch SW4 is coupled on a control gate to a fourth control input terminal CONT4.

The TQB may advantageously reduce output voltage and output current transients on various switching power supplies, for example. The TQB may be implemented in, for example, an integrated circuit package. In some examples, the TQB may be implemented on a common die. A controller may be implemented on the same die alone or in combination with one or more companion die, which may, for example, be arranged in a package, or on a common substrate (e.g., hybrid circuit, printed circuit board, or semiconductor die).

Various TQB devices may implement and employ various switching mechanisms. For example, some switching mechanism may include P-Channel FETs, which may have advantages in implementations that require a high-side reference. Various examples of switching mechanisms in TQBs may include Insulated Gate Bipolar Transistors IGBTs. In slower speed higher current applications, for example, various TQBs may include thyristors, triacs or diacs. In some implementations, bilateral switches may be employed as switching mechanisms in various TQBs, which may reduce size.

Figure 15:
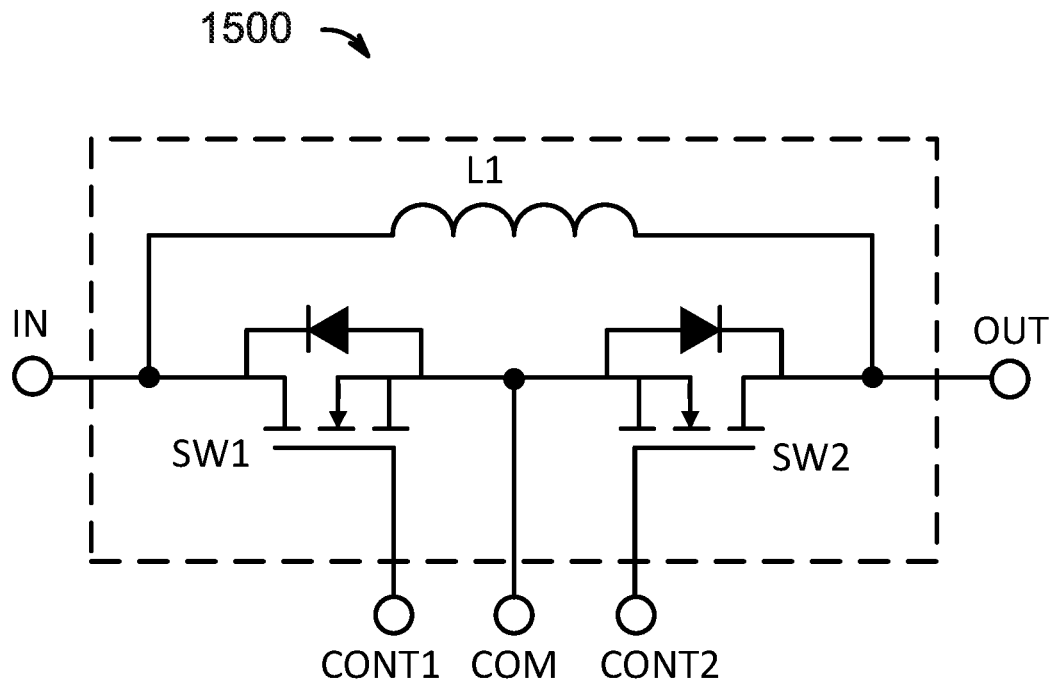
FIG. 15 depicts a schematic view of an exemplary active inductor.

FIG. 15 depicts a schematic view of an exemplary active inductor. An active inductor 1500 includes an inductor L1 arranged in a package, or on a common substrate (e.g., hybrid circuit or die). The inductor L1 is coupled on an output to an output terminal OUT. The inductor L1 is coupled on an input to an input terminal IN. A first switch SW1 is coupled on an input to the input terminal IN. The first switch SW1 is coupled on a control gate to a first control input terminal CONT1. The first switch SW1 is coupled on a source terminal to a common terminal COM. A second switch SW2 is coupled on a source terminal to the common terminal COM. The second switch SW2 is coupled on a control gate to a second control input terminal CONT2. The second switch SW2 is coupled on a drain terminal to the output terminal OUT. The common terminal COM is optional and, if removed, advantageously may reduce a required pin count of the package or die for making connection to the active inductor 1500.

The active inductor may advantageously reduce output voltage and output current transients on various switching power supplies, for example. The active inductor may be implemented in, for example, an integrated circuit package. In some examples, the active inductor may be implemented on a common die. A controller may be implemented on the same die alone or in combination with one or more companion die.

Various active inductor devices may implement and employ various switching mechanisms. For example, some switching mechanism may include P-Channel FETs, which may have advantages in implementations that require a high-side reference. Various examples of switching mechanisms in active inductors may include, for example, Insulated Gate Bipolar Transistors (IGBTs). In slower speed higher current applications, for example, various active inductors may include triacs or diacs. In some implementations, bilateral switches may be employed as switching mechanisms in various active inductors, which may reduce size.

Figure 16:
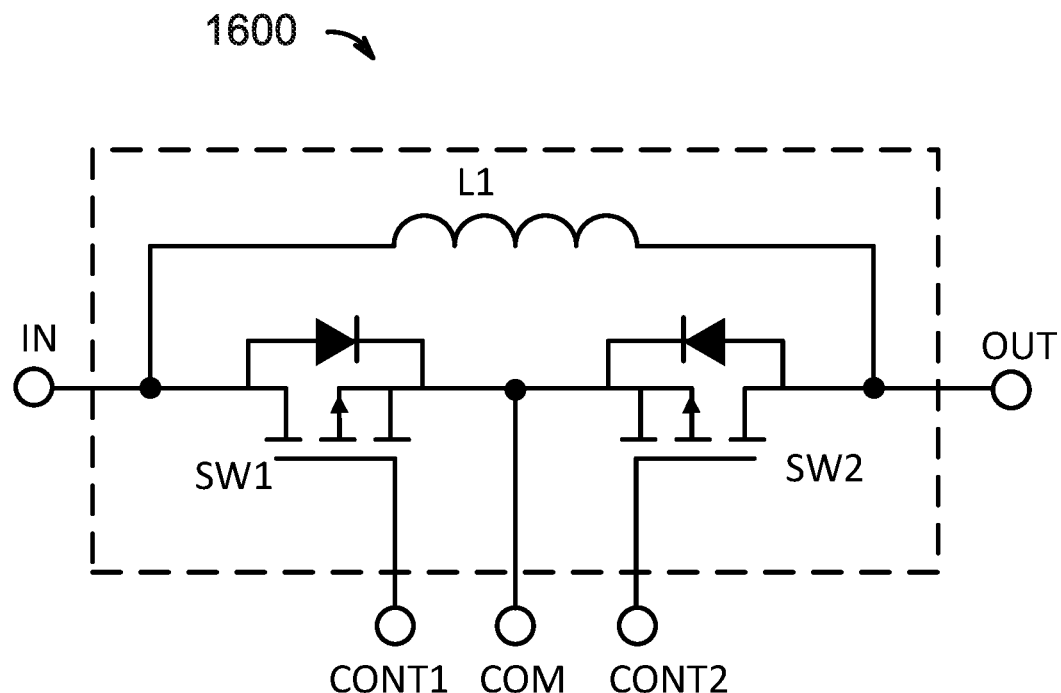
FIG. 16 depicts a schematic view of an exemplary active inductor including P-Channel FETs with a common source.

FIG. 16 depicts a schematic view of an exemplary active inductor including P-Channel FETs with a common source. An active inductor 1600 includes P-channel FETs SW1 and SW2 arranged in a package, or on a common substrate (e.g., hybrid circuit or die). In some examples, the P-channel FETs may be used alone or in combination with other FET technologies (e.g., N-Channel, JFETs, enhancement-mode, depletion-mode).

The active inductor 1600 includes an inductor L1. The inductor L1 is coupled on an output to an output terminal OUT. The inductor L1 is coupled on an input to an input terminal IN. A first P-channel FET SW1 is coupled on an output (drain) to the input terminal IN. The first P-channel FET SW1 is coupled on a control gate to a first control input terminal CONT1. The first P-channel FET SW1 is coupled on an input (source) to a common terminal COM. The common terminal COM is optional and, if removed, advantageously reduces a required pin count for making connection to the active inductor 1600. A second P-channel FET SW2 is coupled on an input (source) to the common terminal COM. The second P-channel FET SW2 is coupled on a control gate to a second control input terminal CONT2. The second P-channel FET SW2 is coupled on an output (drain) to the output terminal OUT.

Figure 17:
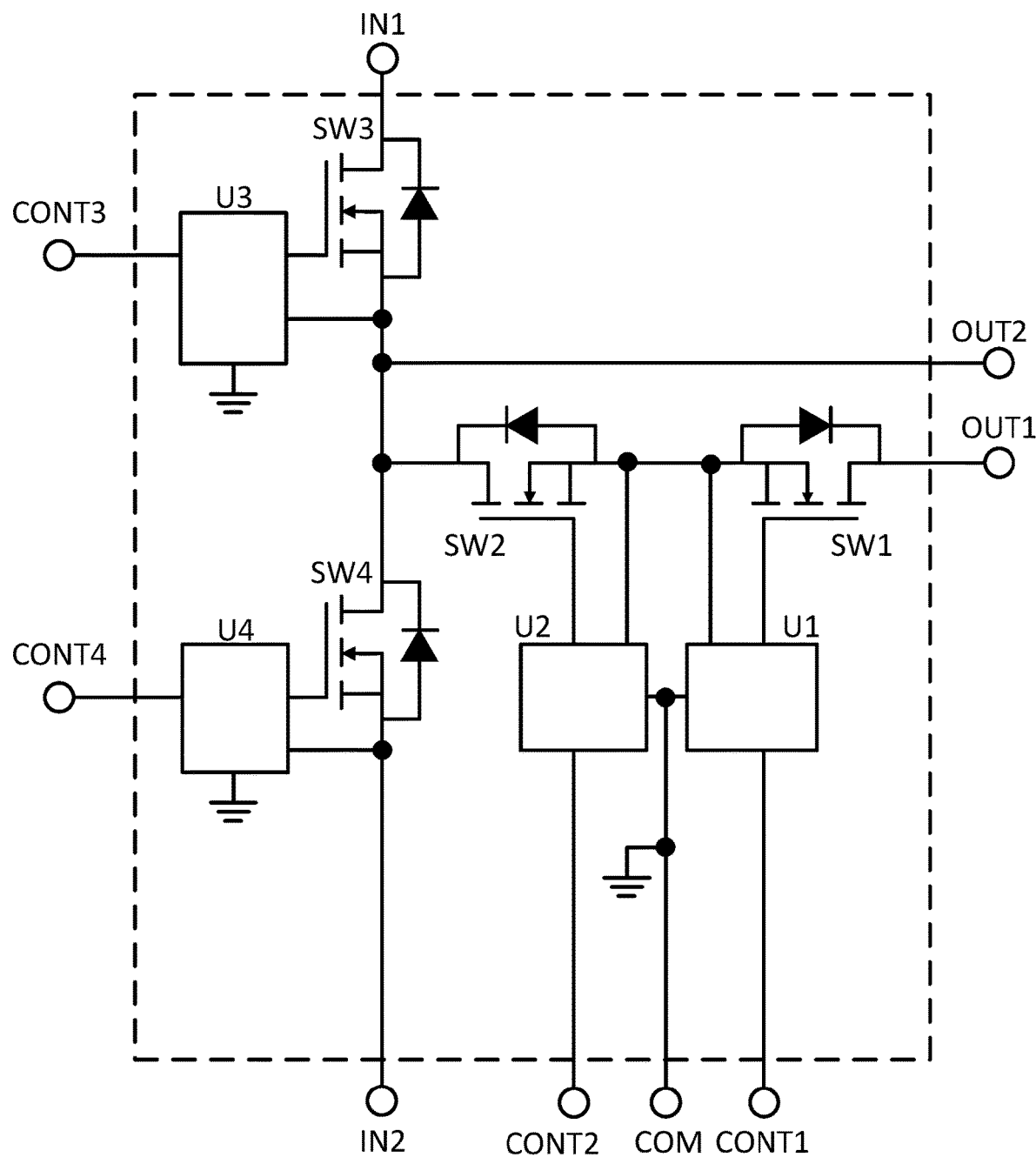
FIG. 17 depicts a schematic view of an exemplary TQB.

FIG. 17 depicts a schematic view of an exemplary TQB. A TQB 1700 includes a first switch SW1. The first switch SW1 is coupled on an input to a first output terminal OUT1. The first switch SW1 is coupled on a control gate to an output of a first driver U1. The first driver U1 is coupled on an input to a first control input terminal CONT1. The first switch SW1 is coupled on an output to a reference output of the first driver U1.

A second switch SW2 is coupled on an output to a reference output of a second driver U2. The second switch SW2 is coupled on an input to a second output terminal OUT2. The second switch SW2 is coupled on a control gate to an output of the second driver U2. The second driver U2 is coupled on an input to a second control input terminal CONT2.

A third switch SW3 is coupled on an output to the second output terminal OUT2. The third switch SW3 is coupled on an input to a first input terminal IN1. The third switch SW3 is coupled on a control gate to an output of a third driver U3. The third driver U3 is coupled on an input to a third control input terminal CONT3. The third switch SW3 is coupled on an output to a reference output of the third driver U3.

A fourth switch SW4 is coupled on an input to the second output terminal OUT2. The fourth switch SW4 is coupled on an output to a second input terminal IN2. The fourth switch SW4 is coupled on a control gate to an output of a fourth driver U4. The fourth driver U4 is coupled on an input to a fourth control input terminal CONT4. The fourth switch SW4 is coupled on an output to a reference output of the fourth driver U4.

The drivers U1, U2, U3 and U4 are coupled on a reference input to the common terminal COM.

Figure 18:
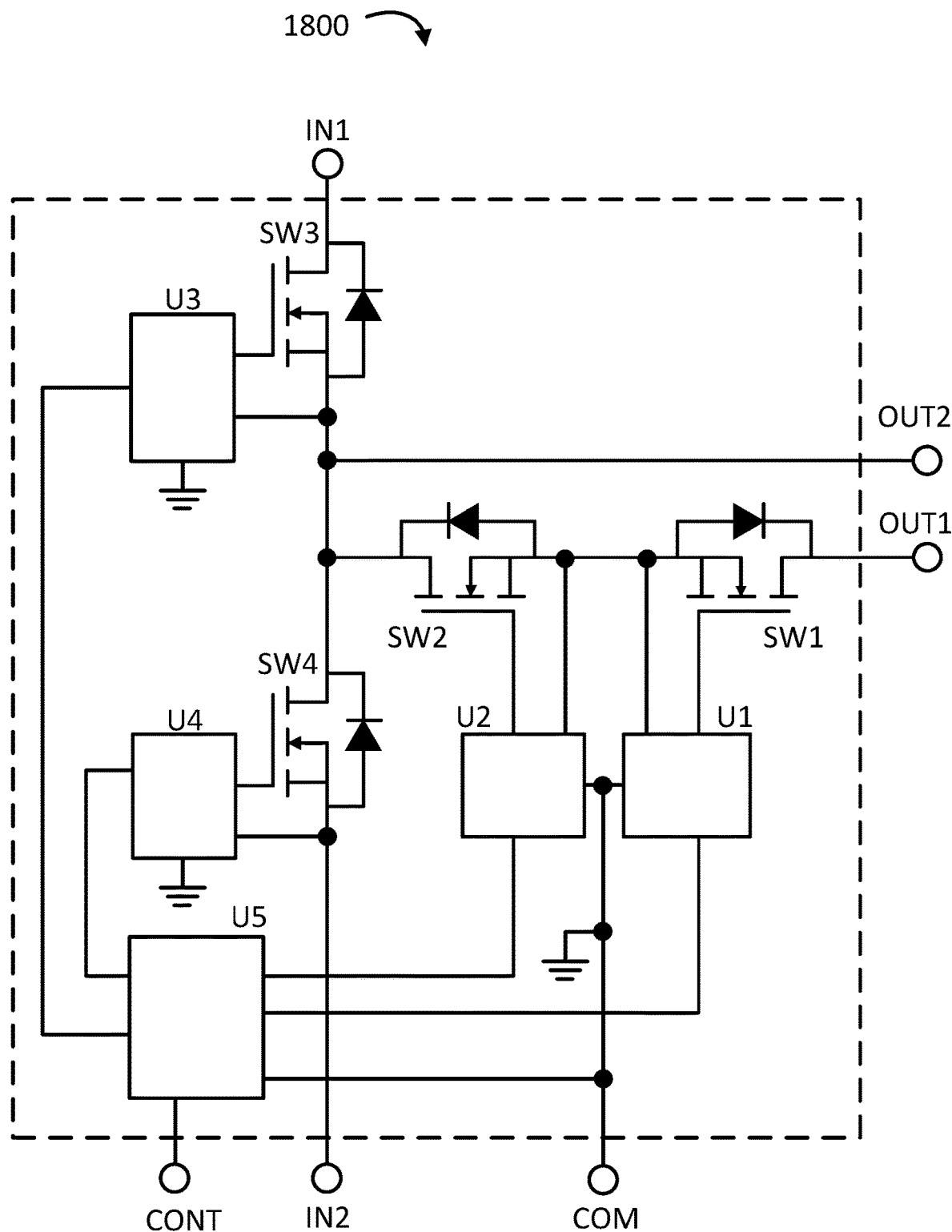
FIG. 18 depicts a schematic view of an exemplary TQB.

FIG. 18 depicts a schematic view of an exemplary TQB. A TQB 1800 includes a first switch SW1. The first switch SW1 is coupled on an input to a first output terminal OUT1. The first switch SW1 is coupled on a control gate to an output of a first driver U1. The first driver U1 is coupled on an input to a first control output of a controller U5. The first switch SW1 is coupled on an output to a reference output of the first driver U1.

A second switch SW2 is coupled on an input to a second output terminal OUT2. The second switch SW2 is coupled on a control gate to an output of a second driver U2. The second driver U2 is coupled on an input to a second control output of the controller U5. The second switch SW2 is coupled on an output to a reference output of the second driver U2.

A third switch SW3 is coupled on an output to the second output terminal OUT2. The third switch SW3 is coupled on an input to a first input terminal IN1. The third switch SW3 is coupled on a control gate to an output of a third driver U3. The third driver U3 is coupled on an input to a third control output of the controller U5. The third switch SW3 is coupled on an output to a reference output of the third driver U3.

A fourth switch SW4 is coupled on an input to the second output terminal OUT2. The fourth switch SW4 is coupled on an output to a second input terminal IN2. The fourth switch SW4 is coupled on a control gate to an output of a fourth driver U4. The fourth driver U4 is coupled on an input to a fourth control output of the controller U5. The fourth switch SW4 is coupled on an output to a reference output of the fourth driver U4.

The drivers U1, U2, U3 and U4 are coupled on a reference input to the common terminal COM. The controller U5 is coupled on a reference input to the common terminal COM. The controller U5 is coupled on an input to a control input terminal CONT. The controller U5 may be operable to receive a command signal from, for example, a BPS controller. In some examples, the controller U5 may include the logic to implement a BPS.

Figure 19:
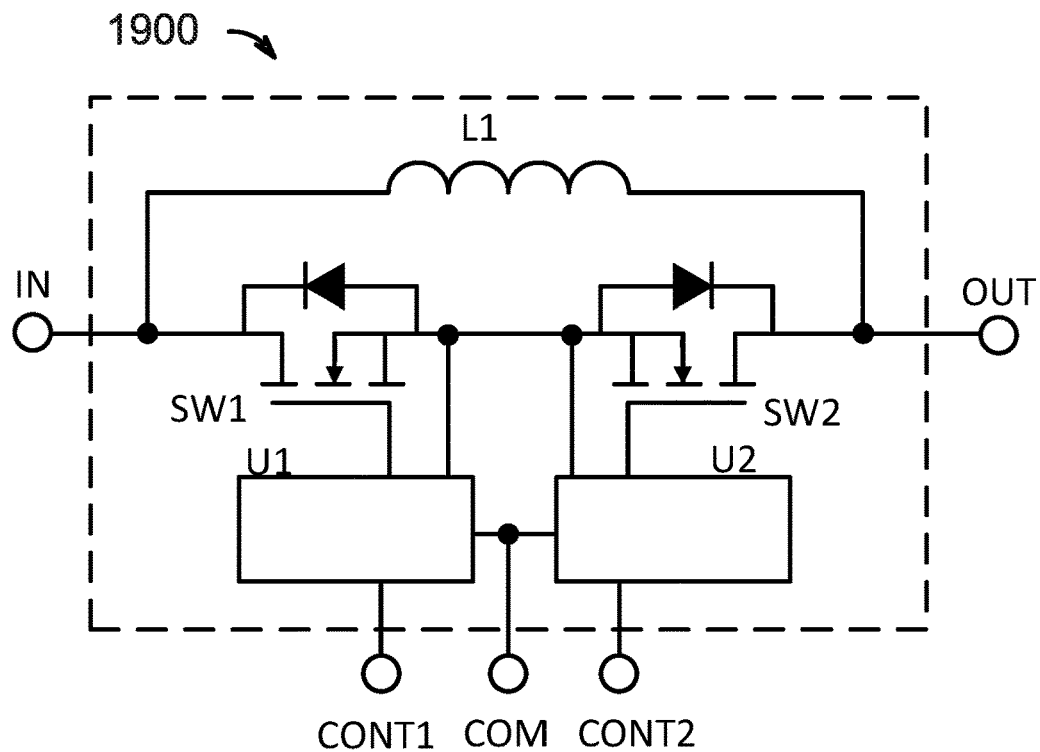
FIG. 19 depicts a schematic view of an exemplary active inductor.

FIG. 19 depicts a schematic view of an exemplary active inductor. An active inductor 1900 includes an inductor L1. The inductor L1 is coupled on an output to an output terminal OUT. The inductor L1 is coupled on an input to an input terminal IN.

A first switch SW1 is coupled on an input to the input terminal IN. The first switch SW1 is coupled on a control gate to an output of a first driver U1. The first driver U1 is coupled on an input to a first control input terminal CONT1. The first switch SW1 is coupled on an output to a reference output of the first driver U1.

A second switch SW2 is coupled on an output to a reference output of a second driver U2. The second switch SW2 is coupled on a control gate to an output of the second driver U2. The second driver U2 is coupled on an input to a second control input terminal CONT2. The second switch SW2 is coupled on an input to the output terminal OUT. The drivers U1 and U2 are coupled on a reference input to a common terminal COM.

The active inductor may advantageously reduce output voltage and output current transients on various switching power supplies, for example. The active inductor may be implemented in, for example, an integrated circuit package. In some examples, the active inductor may be implemented on a common die. A controller may be implemented on the same die alone or in combination with one or more companion die.

Figure 20:
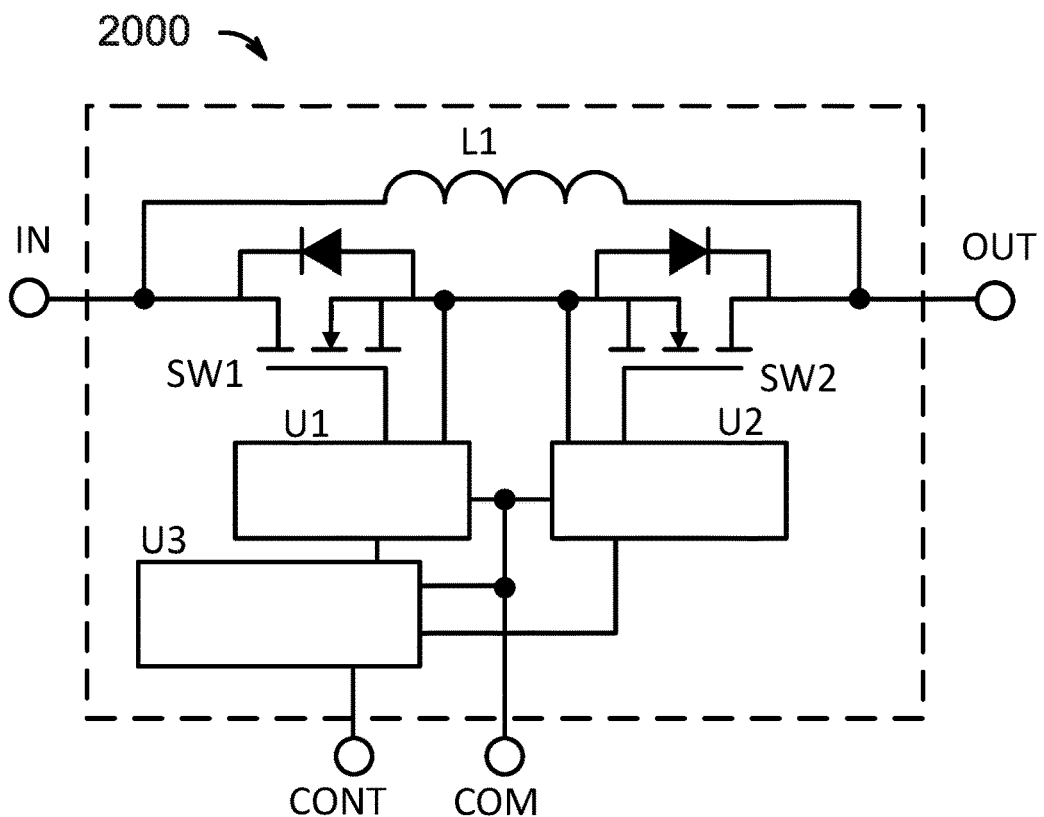
FIG. 20 depicts a schematic view of an exemplary active inductor.

FIG. 20 depicts a schematic view of an exemplary active inductor. An active inductor 2000 includes an inductor L1. The inductor L1 is coupled on an output to an output terminal OUT. The inductor L1 is coupled on an input to an input terminal IN.

A first switch SW1 is coupled on an input to the input terminal IN. The first switch SW1 is coupled on a control gate to an output of a first driver U1. The first driver U1 is coupled on an input to a controller U3. The first switch SW1 is coupled on an output to a reference output of the first driver U1.

A second switch SW2 is coupled on an output to a reference output of a second driver U2. The second switch SW2 is coupled on a control gate to an output of the second driver U2. The second driver U2 is coupled on an input to a controller U3. The second switch SW2 is coupled on an input to the output terminal OUT.

The drivers U1 and U2 are coupled on a reference input to a common terminal COM. The controller U5 is coupled on a reference input to the common terminal COM.

The active inductor may advantageously reduce output voltage and output current transients on various switching power supplies, for example. The active inductor may be implemented in, for example, an integrated circuit package. In some examples, the active inductor may be implemented on a common die. A controller may be implemented on the same die alone or in combination with one or more companion die.

Figure 21A:
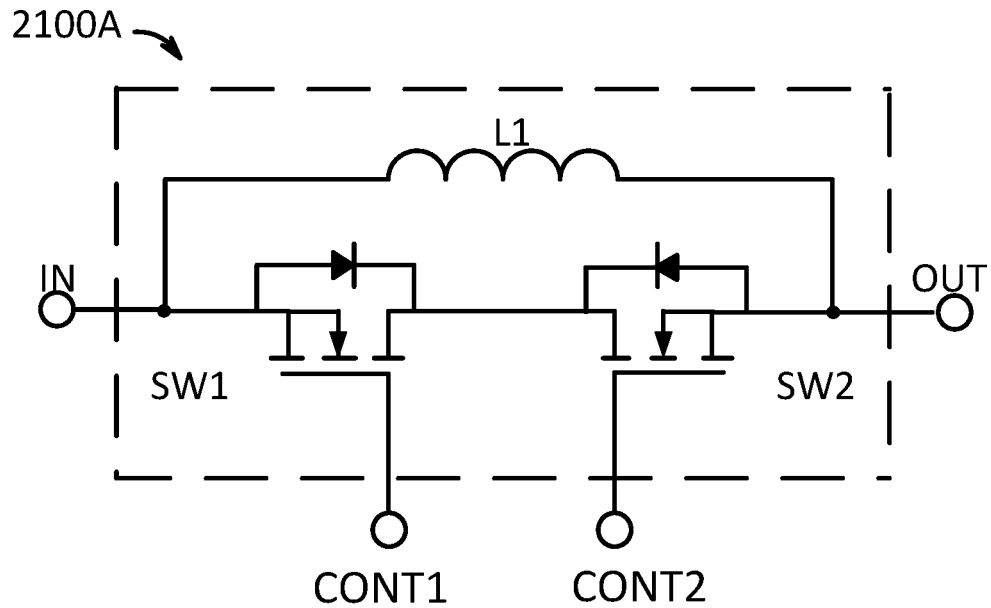
FIG. 21A depicts a schematic view of an exemplary four terminal active inductor assembly including N-Channel FETs arranged in a common drain configuration.

FIG. 21A depicts a schematic view of an exemplary four terminal active inductor assembly including N-Channel FETs arranged in a common drain configuration. An assembly 2100A may be used as an active inductor that enables multiple modes of operation in accordance with various embodiments described herein.

Figure 21B:
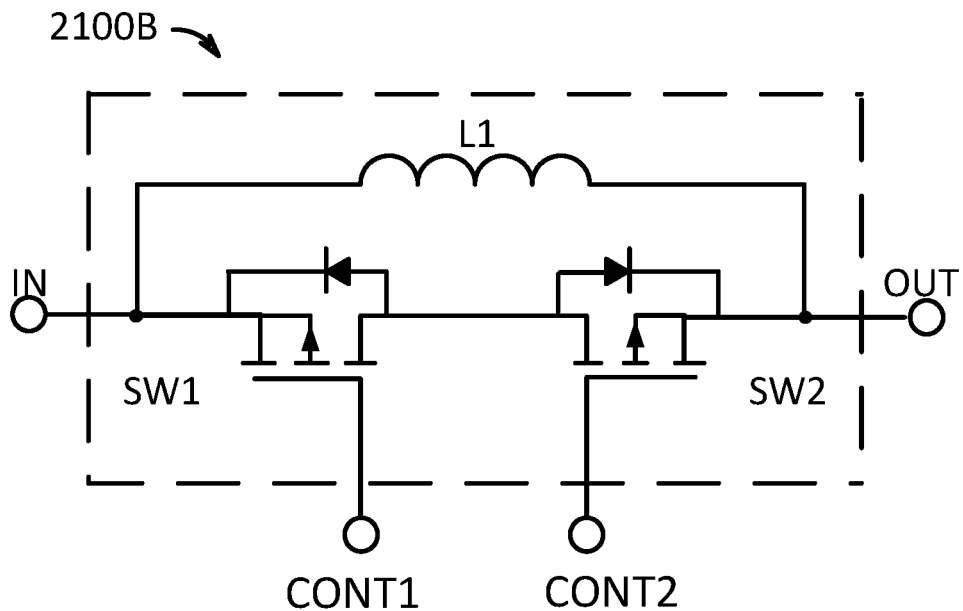
FIG. 21B depicts a schematic view of an exemplary four terminal active inductor assembly including P-Channel FETs arranged in a common drain configuration.

FIG. 21B depicts a schematic view of an exemplary four terminal active inductor assembly including P-Channel FETs arranged in a common drain configuration. An assembly 2100B may be used as an active inductor that enables multiple modes of operation in accordance with various embodiments described herein.

The assemblies 2100A or 2100B may be housed (see dotted line) in a packaging, such as plastic or ceramic, as may be used for hybrid or integrated circuits. In the assemblies 2100A, 2100B, each of the gates of the MOSFETS may be independently controlled via terminals CONT1, CONT2, respectively. The current from an IN terminal may flow to or from an OUT terminal through an inductor L1 in parallel with a series arrangement of common source MOSFETs SW1, SW2.

Figure 22A:
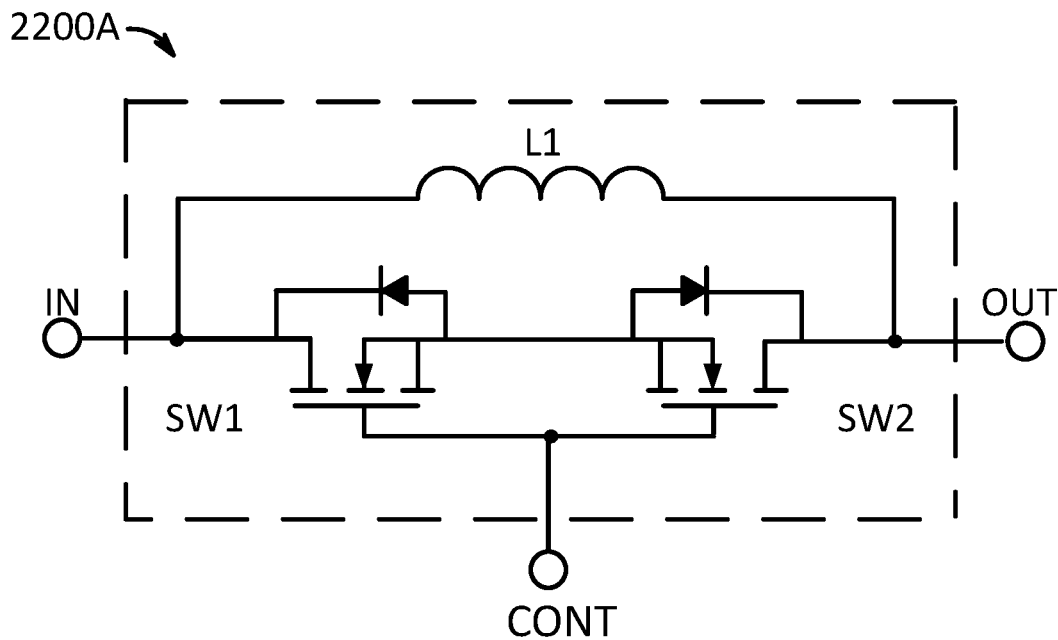
FIG. 22A depicts a schematic view of an exemplary three terminal active inductor assembly including N-Channel FETs arranged in a common source configuration.

FIG. 22A depicts a schematic view of an exemplary three terminal active inductor assembly including N-Channel FETs arranged in a common source configuration. An assembly 2200A may be used as an active inductor that enables multiple modes of operation in accordance with various embodiments described herein.

Figure 22B:
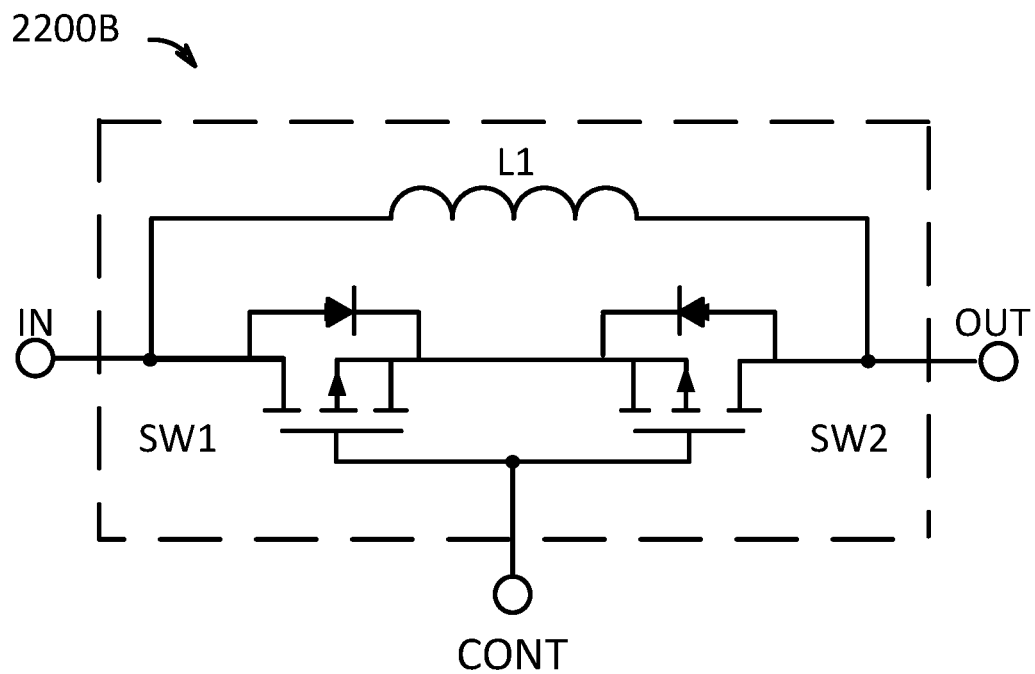
FIG. 22B depicts a schematic view of an exemplary three terminal active inductor assembly including P-Channel FETs arranged in a common source configuration.

FIG. 22B depicts a schematic view of an exemplary three terminal active inductor assembly including P-Channel FETs arranged in a common source configuration. An assembly 2200B may be used as an active inductor that enables multiple modes of operation in accordance with various embodiments described herein.

Figure 22C:
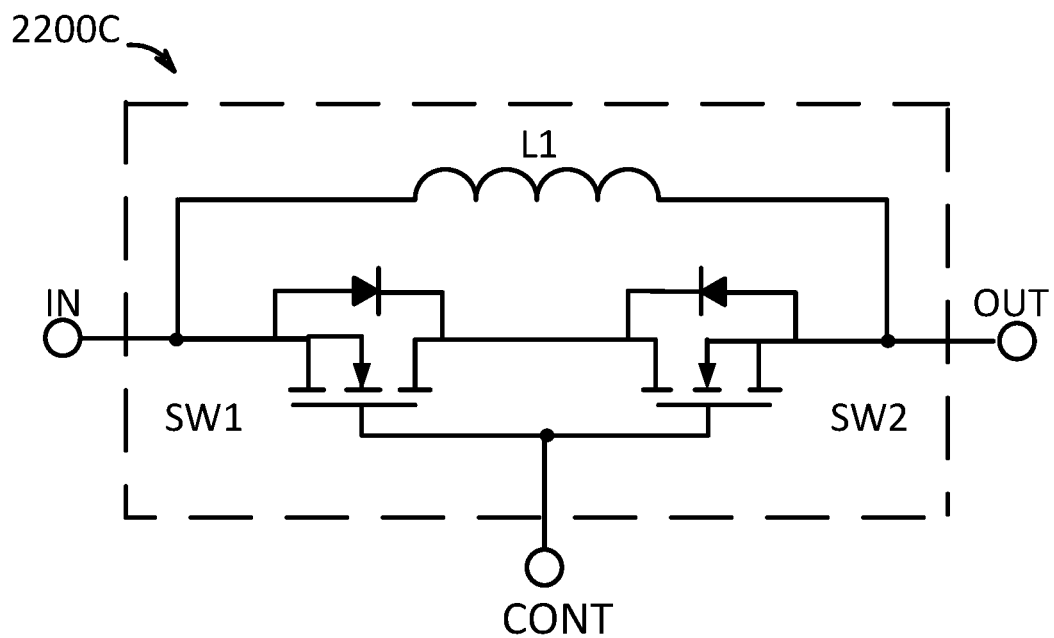
FIG. 22C depicts a schematic view of an exemplary three terminal active inductor assembly including N-Channel FETs arranged in a common drain configuration.

FIG. 22C depicts a schematic view of an exemplary three terminal active inductor assembly including N-Channel FETs arranged in a common drain configuration. An assembly 2200C may be used as an active inductor that enables multiple modes of operation in accordance with various embodiments described herein.

Figure 22D:
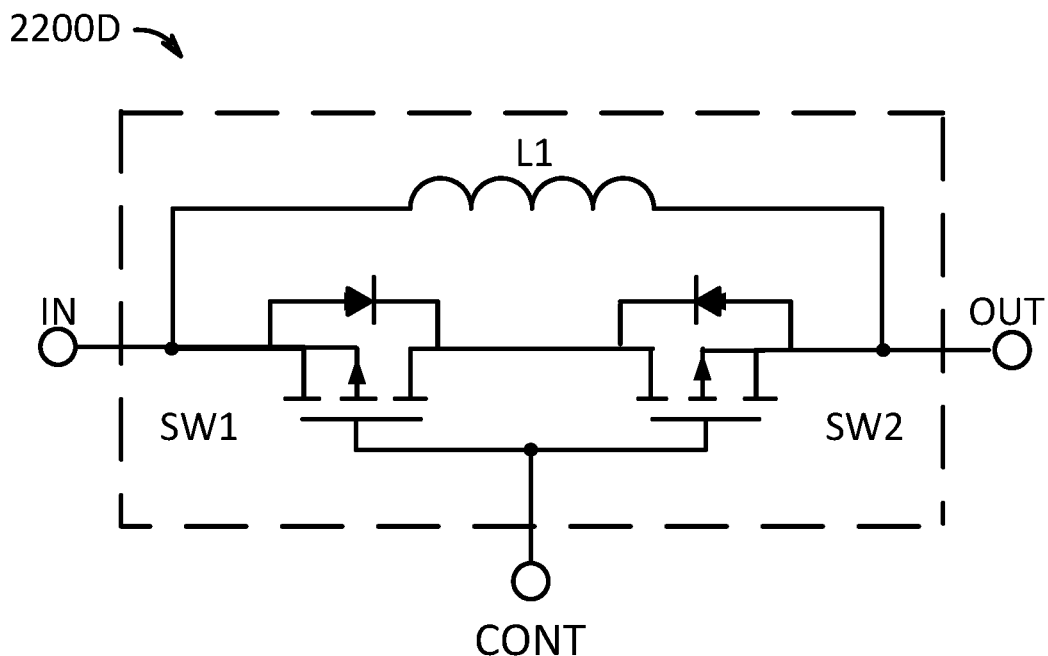
FIG. 22D depicts a schematic view of an exemplary three terminal active inductor assembly including P-Channel FETs arranged in a common drain configuration.

FIG. 22D depicts a schematic view of an exemplary three terminal active inductor assembly including P-Channel FETs arranged in a common drain configuration. An assembly 2200D may be used as an active inductor that enables multiple modes of operation in accordance with various embodiments described herein.

The assemblies 2200A-2200D may be housed (see dotted line) in a packaging, such as plastic or ceramic, as may be used for hybrid or integrated circuits. In the assemblies 2200A-2200D, each of the gates of the MOSFETS may be controlled via a common terminal CONT.

In the assemblies 2200A, 2200B, the current from an IN terminal may flow to or from an OUT terminal through an inductor L1 in parallel with a series arrangement of common source MOSFETs SW1, SW2. In the assemblies 2200C, 2200D, the current from an IN terminal may flow to or from an OUT terminal through an inductor L1 in parallel with a series arrangement of common drain MOSFETs SW1, SW2.

Figure 23A:
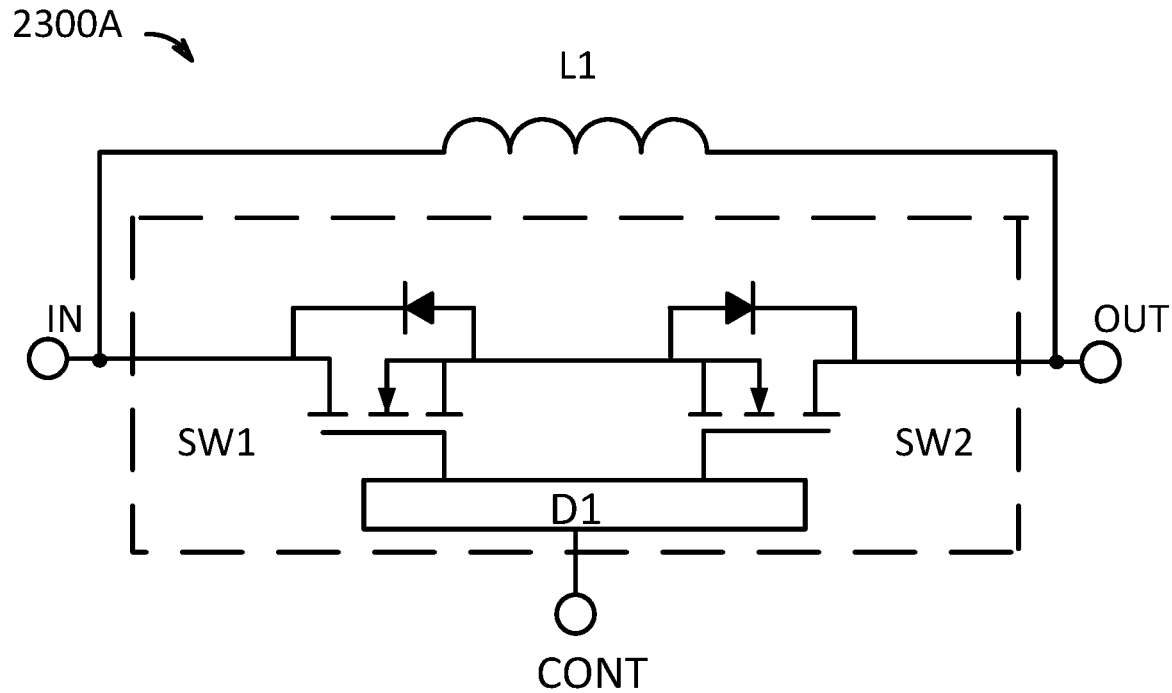
FIG. 23A depicts a schematic view of an exemplary three terminal active inductor assembly including N-Channel FETs arranged in a common source configuration with an integrated driver.

FIG. 23A depicts a schematic view of an exemplary three terminal active inductor assembly including N-Channel FETs arranged in a common source configuration with an integrated driver. An assembly 2300A may be used as an active inductor that enables multiple modes of operation in accordance with various embodiments described herein.

Figure 23B:
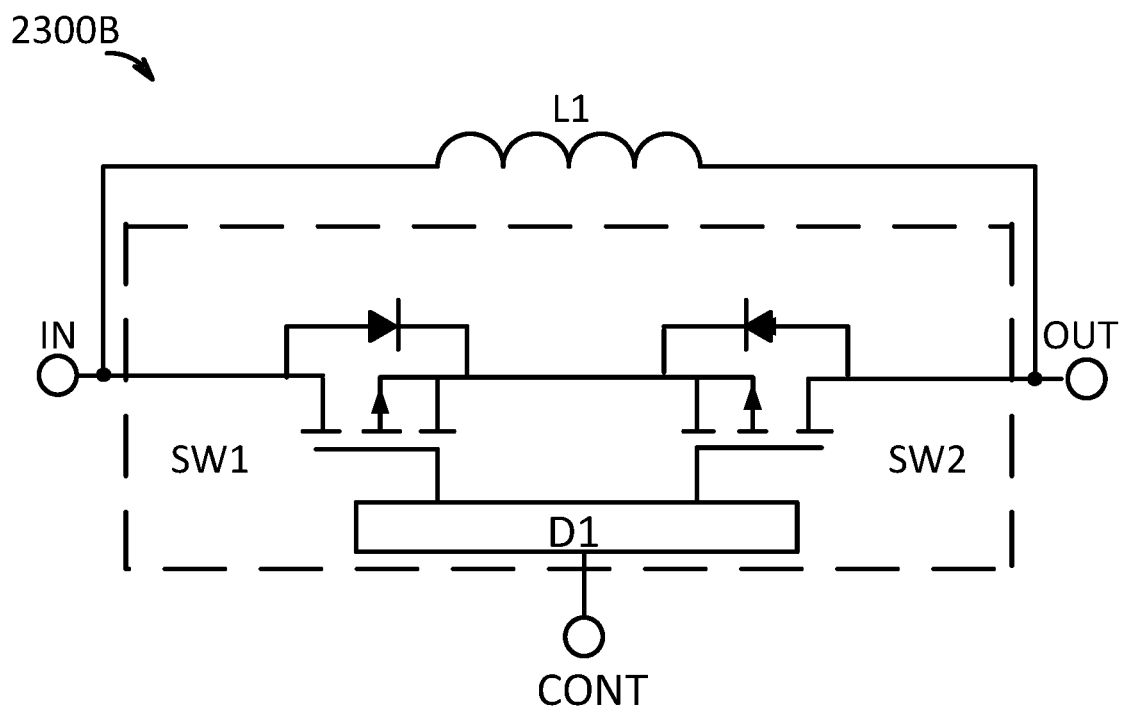
FIG. 23B depicts a schematic view of an exemplary three terminal active inductor assembly including P-Channel FETs arranged in a common source configuration with an integrated driver.

FIG. 23B depicts a schematic view of an exemplary three terminal active inductor assembly including P-Channel FETs arranged in a common source configuration with an integrated driver. An assembly 2300B may be used as an active inductor that enables multiple modes of operation in accordance with various embodiments described herein.

Figure 23C:
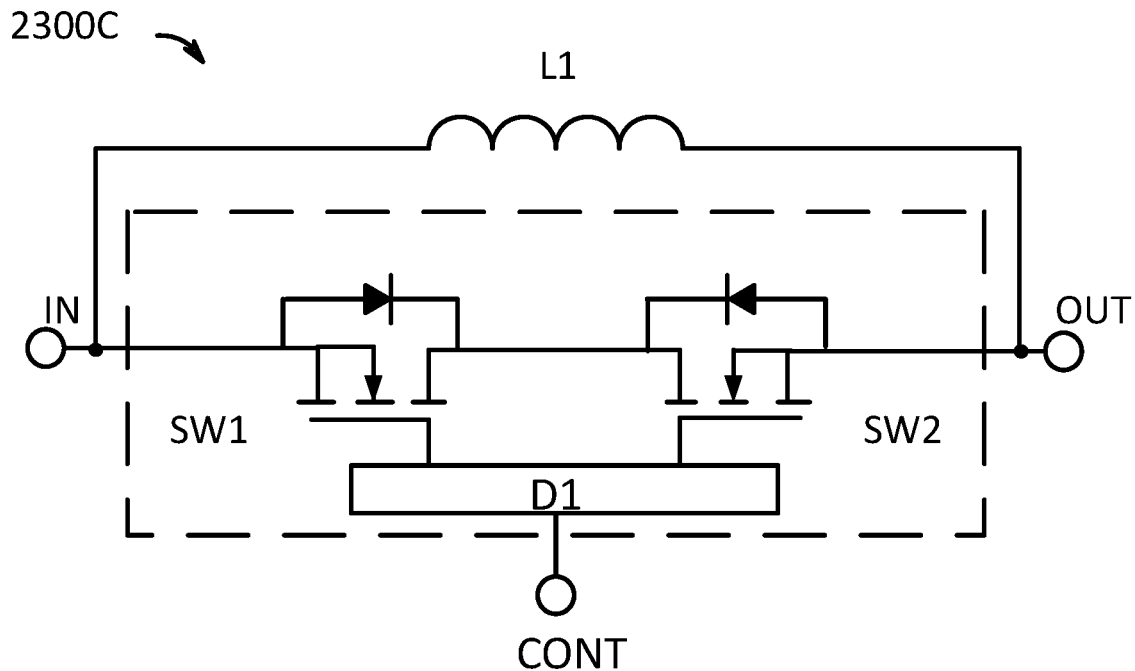
FIG. 23C depicts a schematic view of an exemplary three terminal active inductor assembly including N-Channel FETs arranged in a common drain configuration with an integrated driver.

FIG. 23C depicts a schematic view of an exemplary three terminal active inductor assembly including N-Channel FETs arranged in a common drain configuration with an integrated driver. An assembly 2300C may be used as an active inductor that enables multiple modes of operation in accordance with various embodiments described herein.

Figure 23D:
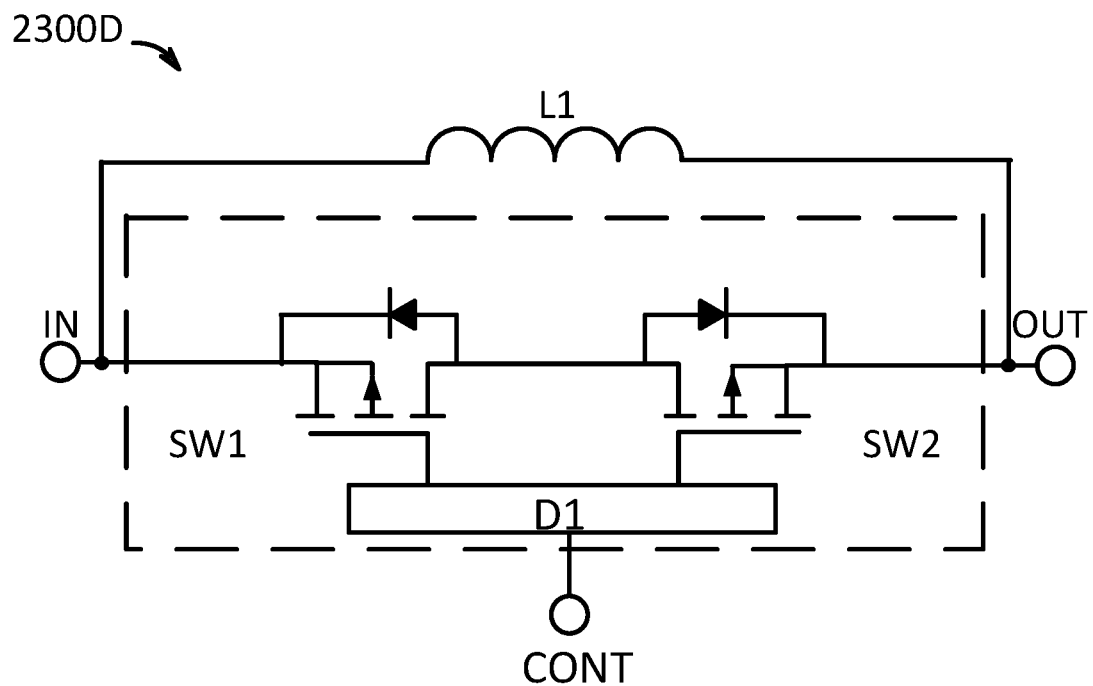
FIG. 23D depicts a schematic view of an exemplary three terminal active inductor assembly including P-Channel FETs arranged in a common drain configuration with an integrated driver.

FIG. 23D depicts a schematic view of an exemplary three terminal active inductor assembly including P-Channel FETs arranged in a common drain configuration with an integrated driver. An assembly 2300D may be used as an active inductor that enables multiple modes of operation in accordance with various embodiments described herein.

The assemblies 2300A-2300D may be housed (see dotted line) in a packaging, such as plastic or ceramic, as may be used for hybrid or integrated circuits. In the assemblies 2300A-2300D, each of the gates of the MOSFETS may be controlled via a common terminal CONT via an integrated gate driver circuit D1 packaged in each of the assemblies 2300-2300D.

In the assemblies 2300A, 2300B, the current from an IN terminal may flow to or from an OUT terminal through an inductor L1 connected externally to the package and in parallel with a series arrangement of common source MOSFETs SW1, SW2. In the assemblies 2300C, 2300D, the current from an IN terminal may flow to or from an OUT terminal through an inductor L1 connected externally to the package and in parallel with a series arrangement of common drain MOSFETs SW1, SW2.

Although various embodiments have been described with reference to the figures, other embodiments are possible. For example, some switches may be arranged in anti-series, while the anti-series combination runs in parallel with an inductor. In various illustrative embodiments, anti-series switches may refer to switches connected in series, where each switch is configured to block current in opposing directions when each of the switches is in an "off" or non-conducting state, and to permit current to flow in at least the direction opposite to the direction blocked by each individual switch. In some embodiments, one or both switches may conduct current in both directions when in an "on" or conducting state. In some implementations, a diode is intrinsic to the switch, and may permit current to conduct in the direction opposite to the blocked direction while the switch is in the off state, For example, an anti-cross conduction circuit may be implemented in a TQB or may be implemented as part of the functions within a TQB controller, for example. The anti-cross conduction circuit may substantially avoid switch states that may be destructive, for example, operating combinations of switches that directly connect VIN to GND or operating combinations of switches that directly connect VIN to VOUT, for example. VIN, VOUT and GND may be, for example, as illustrated with reference to FIG. 19A.

In various implementations, a constant on-time controller may be configured according to one or more exemplary aspects. Various examples of freewheeling rectifiers may include synchronous rectifiers, Schottky diodes, high-speed rectifiers, general rectifiers and/or body diodes intrinsic within various transistors (e.g., FETs).

In an exemplary aspect, a BPS may be configured to pulse current through an inductor in a steady-state mode with a substantially constant pulse width and a constant average switch period, wherein in response to a detected transient change in load demand, a switch period may be modulated by an amount calculated to supply a change in additional energy demand in a first number of cycles. The switch period may be modulated by an amount calculated in a subsequent second number of cycles such that the average switch period is maintained over the first plus second number of cycles under dynamic load conditions.

In various implementations, output ripple reduction may be configured according to one of more exemplary aspects.

In an exemplary aspect, a voltage pre-regulator may be configured to supply a switch-mode power supply (MP-SMPS) having two or more phases, initializing an incremental amount to a predetermined amount, measuring the output ripple of the MP-SMPS, and iteratively:
a) adjusting the output voltage of the voltage pre-regulator by the incremental amount,
b) measuring the output ripple response to the adjustment,
c) changing the sign of the incremental amount in response to an unimproved output ripple from the previous measurement of MP-SMPS output ripple, (else leaving the incremental amount unchanged), such that the output ripple of the MP-SMPS is minimized.

In various implementations, a multi-mode TQB may be configured according to one of more exemplary aspects.

First Post Load Dump Mode

In an exemplary aspect, a BPS with a bypass switch in parallel with an inductor may respond to a decrease in average load demand by (a) in a first mode, turning on the bypass switch to selectively circulate inductor current through the bypass switch, and (b) in a second mode, turning off the bypass switch selectively to circulate the inductor current through the output capacitor and the freewheeling rectifier to selectively transfer a controlled amount of energy stored in the inductor to the output capacitor.

Second Post Load Dump Mode

In an exemplary aspect, a BPS with a bypass switch in parallel with an inductor may respond to a decrease in average load demand by (a) in a first mode, turning on the bypass switch to selectively circulate inductor current through the bypass switch, and (b) in a second mode, operating the bypass switch in a linear mode to circulate the inductor current through the output capacitor and the freewheeling rectifier to continuously transfer a controlled amount of energy stored in the inductor to the output capacitor.

Third Post Load Dump Mode: (Dissipation)

In an exemplary aspect, a load dump control system may include a bypass switch formed of two (or more) series connected Field Effect Transistors (FETs) in opposing polarities (e.g., anti-series), the bypass switch being in parallel with an output inductor of a buck-derived switch-mode power supply, and a controller configured to, in response to a decrease in load demand, control the bypass switch to operate in a resistive mode to dissipate excess energy stored in the inductor as heat in the FETs.

First Output Voltage Clamp Mode

In an exemplary aspect, a BPS may include a bypass switch in parallel with an output inductor, the bypass switch being controlled to operate in a resistive mode to clamp an output voltage on an output capacitor through a low-side switch.

Second Output Voltage Clamp Mode

In an exemplary aspect, a BPS may include a bypass switch in parallel with an inductor wherein, in response to an output ringing characteristic from a decrease in average load demand, the bypass switch may be controlled to operate in a resistive mode to adjust a quality factor (Q) of the output inductor-output capacitor (LC) circuit combination to dynamically tune an output ringing characteristic according to a desired parameter.

Transient Speedup Mode

In an exemplary aspect, a bypass switch may be operated across (e.g., in parallel with) an inductor of a buck-derived converter by controlling the resistance of the bypass switch to allow a bypass current to flow in parallel with the inductor current to deliver extra current to the load in response to an increase in load demand.

Switch Node Ring Suppression Mode

In an exemplary aspect, a BPS may include a series switch that couples a DC supply to a switch node, an inductor that connects the switch node to an output node, and a bypass switch in parallel with the inductor, wherein when the series switch turns off, the bypass switch may be configured to operate in a resistive mode to selectively form a current path to snub oscillating energy on the switch node.

Discontinuous Mode (DCM) Switch Node Ring Suppression Mode

In an exemplary aspect, a BPS may include a low-side controlled switch such that, when the low-side controlled switch is turned on, a reference node is coupled to a switch node via the low-side controlled switch. An output inductor that connects between the switch node and an output node. A bypass switch connects in parallel with the output inductor. When the low-side controlled switch is turned off, in response to, for example, the current through the low-side switch reaching zero, the bypass switch operates in a resistive mode to selectively form a current path to dissipate remaining energy in the output inductor. The bypass switch may be configured to operate in a resistive mode to, for example, control ringing on the switch node.

Inductive Energy Release—Hysteretic Mode

In an exemplary aspect, a BPS may include a bypass switch in parallel with an inductor. When a high-side FET (e.g., main switch) is off, in a first mode in response to an output voltage reaching a predetermined upper limit, the bypass switch may be turned on to selectively circulate inductor current through the bypass switch. In a second mode, in response to an output voltage reaching a predetermined lower limit, the bypass switch may be turned off to circulate the inductor current through the output capacitor and the freewheeling rectifier to selectively transfer a controlled amount of energy stored in the inductor to the output capacitor.

Inductive Energy Release—Constant Off-Time Mode

In an exemplary aspect, a BPS may include a bypass switch in parallel with an inductor. When a high-side FET is off, in a first mode, in response to an output voltage reaching a predetermined lower limit, the bypass switch may be turned off for a predetermined duration to circulate the inductor current through the output capacitor and the freewheeling rectifier. When the predetermined duration elapses, the bypass switch is turned on in a second mode.

Multimode Driver for Inductive Bypass Switch

In various embodiments, a TQB circuit may advantageously allow for substantial improvement of the transient and noise performance for buck and buck-derived regulators. In implementations that employ one or more of the operations described herein, taken alone or in combination, may implicate novel control structures and techniques to achieve multimode operations, for example. With reference to FIG. 10A, an exemplary TQB circuit may be configured to modulate conductivity between an intermediate switch node (e.g., SWN of FIG. 10A) and an output node (e.g., VOUT) in response to a bypass switch control signal (or a set of independent bypass switch control signals to independently modulate conductivity of the two semiconductor switches of the BPS). By way of illustration and not limitation, exemplary modes for operation of an embodiment of a bypass switch may include: full on, resistance mode, controlled current mode, controlled voltage mode. In implementations using MOSFET devices, for example, the resistance of the device may generally refer to the instantaneous resistance of the channel between the drain and the source terminals (e.g., which may be referred to in some cases as Rds,on).

In some exemplary operations, a full on mode may correspond to the bypass switch gate being driven so that bypass switch operates in a low resistance state (e.g., substantially minimum channel resistance for that device). This mode may be used, for example, to trap energy in the inductor during high to low load transitions. In a first submode of the full on mode, energy is substantially trapped in the inductor (not accounting for ideal losses). In a second submode of the full on mode, energy may be released to the output by pulsing off the bypass switch to alternate out of the trap mode.

In some embodiments, the bypass switch of the TQB may operate in a resistance mode. In the resistance mode operation, voltage across and current through the bypass switch may be monitored and the bypass switch may be driven to substantially maintain a fixed value of voltage across one or both of the switching devices (e.g., Vds) to current through the switching devices (e.g., drain current). This resistance mode of operation may advantageously be employed, for example, to controllably damp out ringing during state transitions.

In some embodiments, the bypass switch of the TQB may operate in a controlled current mode. In the controlled current mode operation, current through the bypass switch may be monitored and the bypass switch may be driven to substantially maintain a predetermined value (or values) of current. This resistance mode of operation may advantageously be employed, for example, to provide an additional current path in parallel with the inductor to improve transient response. In some implementations, such as when current through the switch, in a linear mode, may be substantially proportional to the gate drive voltage, a fixed gate drive voltage that is lower than the full on gate drive voltage may be used to control and/or limit the current in the switch to a desired value.

In some embodiments, the bypass switch of the TQB may operate in a controlled voltage mode. In the controlled current mode operation, voltage across the bypass switch may be monitored and the bypass switch may be driven to substantially maintain a predetermined value (or values) of voltage across the switch, or from the output of the switch to a reference potential (e.g., ground). This resistance mode of operation may advantageously be employed, for example, to use the switch as a shunt regulator configured to protect the load (e.g., supplied between the output node of the TQB and the load circuit ground reference) in the case of a fault (e.g., unintended short circuit), for example, in the high side switch (e.g., Q1 of FIG. 9A).

Some aspects of embodiments may be implemented, in whole or in part, as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a first receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

In some embodiments, apparatus and associated methods may relate to a buck-derived switched mode power supply with constant on-time and configured to substantially maintain a steady-state average switch period in a time interval between a start of a load transient and the time when the inductor current returns to a steady state. In an illustrative example, the time interval may include a first and a second predetermined number of cycles after the start of the load transient. The switch period may be modulated, for example, by an amount calculated to supply a change in additional energy demand in the first number of cycles and an opposite amount in the subsequent second number of cycles calculated to maintain the average steady-state switch period over the time interval. In various examples, maintaining average switching period with constant on-time may minimize transient response times without sacrificing stability and without the need for complex compensation networks.

In some implementations, the inductor, the main switch, the freewheeling rectifier, the bypass switches, taken alone or in combination, may be disposed within a housing or enclosure. In some implementations, the inductor may be implemented in an integrated circuit. In some embodiments, a discrete (e.g., wound wire) inductor may be packaged with one or more other components in a unitary object, such as by potting. For example, epoxy, elastomer, plastic or other suitable conformable materials may bind or encase the components into a single packaged object. In various implementations, by way of example and not limitation, a housing or enclosure may be formed by dipping, potting, spraying, electrostatic operation, or injection molding.

Various embodiments described herein present illustrative examples of suitable circuit apparatus for bypassing the inductor to selectively transfer a controlled amount of energy stored in the inductor to the output terminal in response to a decrease in average load demand. By way of example and not limitation, examples of such circuit apparatus have been described with reference to the bypass switches such as, at least, for example, Q3-Q4 of FIG. 2A, or SW1-SW2 of FIG. 14.

Various embodiments described herein present illustrative examples of suitable circuit apparatus for performing operations to control the bypass apparatus while the main switch is off, when the operations include (a) in a first mode, causing the inductor current to circulate through the bypass means; and, (b) in a second mode, causing the inductor current to circulate via the output terminal and return through the freewheeling rectifier. By way of example and not limitation, examples of such circuit apparatus have been described with reference to the bypass controller and/or gate drive such as, at least, for example, IC1 of FIG. 9A, 10A, or U1-U3 of FIG. 20.

Multifunction TQB

An exemplary aspect of a multifunction TQB relates to a buck-derived switched mode power supply with a three-quarter bridge (TQB) configuration. The apparatus includes a main switch operative to selectively connect a first terminal of an input voltage source to an intermediate switch node, an inductor having a first terminal coupled to the intermediate switch node and a second terminal coupled to an output node adapted to communicate energy to a load, a freewheeling rectifier coupled to conduct current from a second terminal of the input voltage source to the intermediate switch node; and, a bypass switch arranged in parallel with the inductor and formed of a first controllable semiconductor switch and a second controllable semiconductor switch connected in anti-series and configured to modulate conductivity between the intermediate switch node and the output node in response to a bypass switch control signal.

In various implementations of the exemplary aspect, the bypass switch may be further arranged such that when only the first controllable semiconductor switch is turned on, current can pass through the bypass switch in only a first direction, and when only the second controllable semiconductor switch is turned on, current can pass through the bypass switch in only a second direction, and when both the first and the second controllable semiconductor switches are turned on, current can pass through the bypass switch in either the first direction or the second direction. The first and the second controllable semiconductor switches may be series-connected in a common drain configuration or in a common source configuration. The apparats may further include an integrated circuit package formed as a unitary body, wherein at least the bypass switch, the main switch, and the freewheeling rectifier are disposed within the integrated circuit package. At least the bypass switch and the inductor may be disposed within the integrated circuit package. The integrated circuit package may be formed as a unitary body having only three terminals for making connection to the bypass switch, wherein at least the bypass switch and a gate driver circuit are disposed within the integrated circuit package, and wherein the three terminals include an input terminal operatively connected to the intermediate switch node, an output terminal operatively connected to the output node, and a control input terminal operatively connected to the gate driver circuit and to receive the bypass switch control signal. In some implementations, the bypass switch may include at least one P-channel MOSFET or at least one N-channel MOSFET.

Multimode Driver for Inductive Bypass Switch

An exemplary aspect of the multifunction TQB relates to a multimode driver for the inductive bypass switch. For example, the apparatus may further include a multimode driver circuit operatively coupled to the bypass switch and configured to generate the bypass switch control signal to operate the bypass switch in a plurality of different modes in response to load conditions.

One of the plurality of different modes may include generating the bypass switch controls to cause at least one of the first controllable semiconductor switch and the second controllable semiconductor switch to operate in a full on mode characterized by a substantially minimum channel resistance state.

One of the plurality of different modes may include generating the bypass switch controls to cause at least one of the first controllable semiconductor switch and the second controllable semiconductor switch to operate in a controlled resistance mode characterized by regulating to a predetermined ratio of a voltage across the at least one switch to a current through the at least one switch.

One of the plurality of different modes may include generating the bypass switch controls to cause at least one of the first controllable semiconductor switch and the second controllable semiconductor switch to operate in a controlled current mode characterized by regulating a predetermined current through the at least one switch.

One of the plurality of different modes may include generating the bypass switch controls to cause at least one of the first controllable semiconductor switch and the second controllable semiconductor switch to operate in a controlled voltage mode characterized by regulating a predetermined voltage between a predetermined node of the bypass switch and a predetermined reference node. The predetermined node of the bypass switch may include the output node and the predetermined reference node may be a circuit ground reference for the load.

The apparatus may further include a gate drive circuit to interface a first control signal associated with the bypass switch control signal to a first control terminal of the first controllable semiconductor switch and a second control signal associated with the bypass switch control signal to a second control terminal of the second controllable semiconductor switch.

Regulated Inductive Energy Release

A further exemplary aspect relates to regulated inductive energy release. The apparatus may further include a bypass switch controller operative to generate the set of bypass switch control signals to operate the bypass switch to selectively transfer a controlled amount of energy stored in the inductor to the output terminal by performing operations. The operations may include: in a first mode, operate the bypass switch to selectively cause the inductor current to circulate through the bypass switch; and, in a second mode, operate the bypass switch to cause the inductor current to circulate via the output terminal to the load and return through the freewheeling rectifier.

Hysteretic—Controlled Release

A further exemplary aspect relates to hysteretic operation to control the release of the energy from the inductor. For example, the bypass switch controller may be configured to iteratively perform further operations to: enter the second mode in response to a voltage at the output terminal reaching a predetermined lower threshold; and, enter the first mode in response to the voltage at the output terminal reaching a predetermined upper threshold.

Constant OFF Time—Controlled Release

A further exemplary aspect relates to constant off time operation to control the release of the energy from the inductor. For example, the bypass switch controller may be configured to iteratively perform further operations to: while in the first mode, and upon a voltage at the output terminal falling below a predetermined lower threshold, enter the second mode; and upon reaching a predetermined duration of time in the second mode, enter the first mode.

Constant on Time Control—Controlled Release

A further exemplary aspect relates to constant on time operation to control the release of the energy from the inductor. For example, the bypass switch controller may be configured to iteratively perform further operations to: enter the first mode in response to a voltage at the output terminal reaching a predetermined upper threshold; if the current in the inductor exceeds a predetermined first current threshold when the voltage at the output terminal reaching a predetermined lower threshold: control the main switch to remain in an off state until the inductor current falls below a predetermined second current threshold; enter the second mode in response to the voltage at the output terminal reaching a predetermined lower threshold; and, enter the first mode in response to the voltage at the output terminal reaching a predetermined upper threshold.

Multifunction Three Quarter Bridge

In an exemplary aspect, a buck-derived switched mode power supply includes a three-quarter bridge (TQB) configuration. The TQB includes a main switch operative to selectively connect a first terminal of an input voltage source to an intermediate switch node, and an inductor having a first terminal coupled to the intermediate switch node and a second terminal coupled to an output terminal. A freewheeling rectifier couples to conduct current from a second terminal of the input voltage source to the intermediate switch node. A bypass switch is arranged in parallel with the inductor and is formed of a first controllable semiconductor switch and a second controllable semiconductor switch connected in anti-series and responsive to a set of bypass switch control signals. A bypass switch controller is operative to generate the set of bypass switch control signals to operate the bypass switch to selectively transfer a controlled amount of energy stored in the inductor to the output terminal in response to a decrease in average load demand by performing operations while the main switch is off. The operations include, in a first mode, operate the bypass switch to selectively cause the inductor current to circulate through the bypass switch; and, in a second mode, operate the bypass switch to cause the inductor current to circulate via the output terminal and return through the freewheeling rectifier.

In various implementations, the output terminal that may be adapted to support an output voltage when an output capacitor is connected from the output terminal to the second terminal of the input voltage source. The bypass switch may be further arranged such that when only the first controllable semiconductor switch is turned on, current can pass through the bypass switch in only a first direction, and when only the second controllable semiconductor switch is turned on, current can pass through the bypass switch in only a second direction, and when both the first and the second controllable semiconductor switches are turned on, current can pass through the bypass switch in either the first direction or the second direction.

In various embodiments, the bypass switch may include at least one P-channel MOSFET, or at least one N-channel MOSFET. The apparatus may further include an integrated circuit package formed as a unitary body.

The bypass switch, the main switch, and the freewheeling rectifier may be disposed within the integrated circuit package. The apparatus may further include a gate drive circuit to interface at least one of the control signals in the set of bypass switch control signals to a first control terminal of the first controllable semiconductor switch and at least one of the control signals in the set of bypass switch control signals to a second control terminal of the second controllable semiconductor switch, wherein the gate drive circuit is disposed in the integrated circuit package. The bypass switch controller may be disposed in the integrated circuit package and operatively coupled to supply the bypass switch control signals to the gate drive circuit. The apparatus may further include a second gate drive circuit disposed in the integrated circuit package, wherein the second gate drive circuit is operatively coupled to control the conductivity state of the main switch. The apparatus may further include a control input terminal to receive an operating command signal in the integrated circuit package, wherein the bypass switch controller is further configured to operatively control operation of the main switch via the second gate drive circuit in response to the received operating command signal. The freewheeling rectifier may include a synchronous rectifier, and the second gate drive circuit may be operatively coupled to control the conductivity state of the synchronous rectifier.

In an exemplary aspect, a multifunction Three Quarter Bridge may provide a buck-derived switched mode power supply with a three-quarter bridge (TQB) configuration. The apparatus includes a main switch operative to selectively connect a first terminal of an input voltage source to an intermediate switch node, and an inductor having a first terminal coupled to the intermediate switch node and a second terminal coupled to an output node adapted to communicate energy to a load. A freewheeling rectifier couples to conduct current from a second terminal of the input voltage source to the intermediate switch node. A bypass switch is arranged in parallel with the inductor and formed of a first controllable semiconductor switch and a second controllable semiconductor switch connected in anti-series and configured to modulate conductivity between the intermediate switch node and the output node in response to a bypass switch control signal.

In some embodiments, the bypass switch may be further arranged such that when only the first controllable semiconductor switch is turned on, current can pass through the bypass switch in only a first direction, and when only the second controllable semiconductor switch is turned on, current can pass through the bypass switch in only a second direction, and when both the first and the second controllable semiconductor switches are turned on, current can pass through the bypass switch in either the first direction or the second direction. The first and the second controllable semiconductor switches may be series-connected in a common drain configuration, or in a common source configuration. The apparatus may further include an integrated circuit package formed as a unitary body, wherein at least the bypass switch, the main switch, and the freewheeling rectifier are disposed within the integrated circuit package. In some examples, at least the bypass switch and the inductor may be disposed within the integrated circuit package. The integrated circuit package may be formed as a unitary body having only three terminals for making connection to the bypass switch, wherein at least the bypass switch and a gate driver circuit are disposed within the integrated circuit package, and wherein the three terminals include an input terminal operatively connected to the intermediate switch node, an output terminal operatively connected to the output node, and a control input terminal operatively connected to the gate driver circuit and to receive the bypass switch control signal. In various examples, the bypass switch may include at least one P-channel MOSFET, and/or at least one N-channel MOSFET.

In some implementations that involve a multimode driver for the inductive bypass switch, the apparatus may further include a multimode driver circuit operatively coupled to the bypass switch and configured to generate the bypass switch control signal to operate the bypass switch in a plurality of different modes in response to load conditions.

One of the plurality of different modes may include generating the bypass switch controls to cause at least one of the first controllable semiconductor switch and the second controllable semiconductor switch to operate in a full on mode characterized by a substantially minimum channel resistance state. In some cases, one of the plurality of different modes may include generating the bypass switch controls to cause at least one of the first controllable semiconductor switch and the second controllable semiconductor switch to operate in a controlled resistance mode characterized by regulating to a predetermined ratio of a voltage across the at least one switch to a current through the at least one switch. One of the plurality of different modes may include generating the bypass switch controls to cause at least one of the first controllable semiconductor switch and the second controllable semiconductor switch to operate in a controlled current mode characterized by regulating a predetermined current through the at least one switch. One of the plurality of different modes may also include generating the bypass switch controls to cause at least one of the first controllable semiconductor switch and the second controllable semiconductor switch to operate in a controlled voltage mode characterized by regulating a predetermined voltage between a predetermined node of the bypass switch and a predetermined reference node. The predetermined node of the bypass switch may include the output node and the predetermined reference node may include a circuit ground reference for the load. The apparatus may further include a gate drive circuit to interface at least one of the control signals in the set of bypass switch control signals to a first control terminal of the first controllable semiconductor switch and at least one of the control signals in the bypass switch control signals to a second control terminal of the second controllable semiconductor switch.

In some implementations that involve a regulated inductive energy release, the apparatus may further include a bypass switch controller operative to generate the bypass switch control signal to operate the bypass switch to selectively transfer a controlled amount of energy stored in the inductor to the output terminal by performing operations. The operations may include: in a first mode, operate the bypass switch to selectively cause the inductor current to circulate through the bypass switch; and, in a second mode, operate the bypass switch to cause the inductor current to circulate via the output terminal to the load and return through the freewheeling rectifier.

Using hysteresis to provide controlled release of inductor energy, some embodiments include the bypass switch controller configured to iteratively perform further operations to: enter the second mode in response to a voltage at the output terminal reaching a predetermined lower threshold; and, enter the first mode in response to the voltage at the output terminal reaching a predetermined upper threshold.

Using constant off time to provide controlled release of inductor energy, the bypass switch controller may be configured to iteratively perform further operations to: while in the first mode, and upon a voltage at the output terminal falling below a predetermined lower threshold, enter the second mode; and, upon reaching a predetermined duration of time in the second mode, enter the first mode.

Using Constant ON time control, in accordance with various embodiments described herein, the bypass switch controller may be configured to iteratively perform further operations to: enter the first mode in response to a voltage at the output terminal reaching a predetermined upper threshold. If the current in the inductor exceeds a predetermined first current threshold when the voltage at the output terminal reaching a predetermined lower threshold: control the main switch to remain in an off state until the inductor current falls below a predetermined second current threshold; enter the second mode in response to the voltage at the output terminal reaching a predetermined lower threshold; and, enter the first mode in response to the voltage at the output terminal reaching a predetermined upper threshold.

Inductor with Bypass Switch

In another exemplary aspect, a conductivity modulation apparatus for active operations with an inductive element may include an input terminal (IN) electrically connected to an input node, an output terminal (OUT) electrically connected to an output node, and an inductor (L1) electrically connected between the input node and the output node. The apparatus may further include a bypass switch electrically connected between the input node and the output node, the bypass switch comprising a first semiconductor switch (SW1) having a first control gate and a second semiconductor switch (SW2) having a second control gate, the first and second semiconductor switches being connected in anti-series. The apparatus may further include a first control input terminal (CONT1) operably connected to the first control gate, wherein the first semiconductor switch is configured to modulate conductivity between the input node and the output node in response to a first bypass switch control signal being received at the first control input terminal. The apparatus may further include a package that houses the input terminal, the output terminal and the first control input terminal, wherein the input terminal, the output terminal, and the first control input terminal are each configured to communicate electrical signals between an interior of the package and an exterior of the package.

In various embodiments of the exemplary aspect, the apparatus may further include a common input terminal (COM) electrically connected to an intermediate node connecting between the first semiconductor switch and the second semiconductor switch, wherein the common input terminal is configured to communicate electrical signals between the interior of the package and the exterior of the package. The first semiconductor switch may be configured to modulate conductivity between the input node and the output node in response to the first bypass switch control signal received between the first control input terminal and the common input terminal. The apparatus may further include a second control input terminal (CONT2) operably connected to the second control gate, wherein the second semiconductor switch is configured to modulate conductivity between the input node and the output node in response to a second bypass switch control signal received at the second control input terminal, wherein the second bypass switch control signal is independently controllable relative to the first bypass switch control signal, and the second control input terminal is configured to communicate electrical signals between the interior of the package and the exterior of the package. The second semiconductor switch may be configured to modulate conductivity between the input node and the output node in response to the second bypass switch control signal received between the second control input terminal and the common input terminal. The package may further include an integrated circuit (IC)

package that houses the bypass switch in the interior of the IC package, and the second control input terminal is configured to communicate electrical signals between the interior and the exterior of the IC package.

The apparatus may further include the package having an integrated circuit (IC) package that houses the bypass switch in the interior of the IC package. The IC may further house the inductor in the interior of the IC package. The bypass switch may include at least one P-channel MOSFET, and/or at least one N-channel MOSFET. The first and the second semiconductor switches may be series-connected in a common drain configuration, or in a common source configuration. The bypass switch may operably connect in parallel with the inductor.

Another exemplary aspect relates to a conductivity modulation apparatus for active operations with an inductive element. The apparatus may include a first input terminal (IN1) electrically connected to a first input node, a second input terminal (IN2) electrically connected to a second input node, and a first output terminal (OUT1) electrically connected to an output node. The apparatus may further include a main switch (SW3) operative to selectively connect the first input terminal of an input voltage source to an intermediate switch node, and a freewheeling rectifier (SW4) coupled to conduct current from the second input terminal of the input voltage source to the intermediate switch node, and a bypass switch electrically connected between the intermediate switch node and the first output node, the bypass switch comprising a first semiconductor switch (SW1) having a first control gate and a second semiconductor switch (SW2) having a second control gate, the first and second semiconductor switches being connected in anti-series. The apparatus may further include a first control input terminal (CONT1) operably connected to the first control gate, wherein the first semiconductor switch is configured to modulate conductivity between the input node and the output node in response to a first bypass switch control signal being received at the first control input terminal. The apparatus may further include a package that houses the input terminal, the output terminal and the first control input terminal, wherein the first and second input terminals, the first output terminal, and the first control input terminal are each configured to communicate electrical signals between an interior of the package and an exterior of the package.

In various embodiments of the exemplary aspect, the apparatus may further include a second output terminal (OUT2) electrically connected to the intermediate switch node, and the second output terminal is configured to communicate electrical signals between the interior of the package and the exterior of the package. The bypass switch may be operable to selectively circulate current through an inductor when the inductor is connected between the first output terminal and the second output terminal in response to the first bypass switch control signal. The apparatus may further include a common input terminal (COM), wherein the first semiconductor switch is configured to modulate conductivity between the input node and the output node in response to the first bypass switch control signal received between the first control input terminal and the common input terminal, and the common input terminal is configured to communicate electrical signals between an interior of the package and an exterior of the package.

The apparatus may further include a second control input terminal (CONT2) operably connected to the second control gate, wherein the second semiconductor switch is configured to modulate conductivity between the input node and the output node in response to a second bypass switch control signal received at the second control input terminal, wherein the second bypass switch control signal is independently controllable relative to the first bypass switch control signal.

The package may further include an integrated circuit (IC) package that houses the bypass switch, the main switch (SW3) and the freewheeling rectifier (SW4) in the interior of the IC package. The apparatus may further include a main switch control input terminal (CONT3) operably connected to the main switch (SW3), and a freewheeling rectifier control input terminal (CONT4) operably connected to the freewheeling rectifier (SW4), wherein the main switch control terminal and the freewheeling rectifier control input terminal are each configured to communicate electrical signals between an interior of the package and an exterior of the package.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A conductivity modulation apparatus for active operations with an inductive element, the apparatus comprising:
    an input terminal (IN) electrically connected to an input node;
    an output terminal (OUT) electrically connected to an output node;
    an inductor (L1) electrically connected between the input node and the output node;
    a bypass switch electrically connected between the input node and the output node, the bypass switch comprising a first semiconductor switch (SW1) having a first control gate and a second semiconductor switch (SW2) having a second control gate, the first and second semiconductor switches being connected in anti-series; and,
    a first control input terminal (CONT1) operably connected to the first control gate, wherein the first semiconductor switch is configured to modulate conductivity between the input node and the output node in response to a first bypass switch control signal being received at the first control input terminal; and,
    a package that houses the input terminal, the output terminal and the first control input terminal, wherein the input terminal, the output terminal, and the first control input terminal are each configured to communicate electrical signals between an interior of the package and an exterior of the package, the package comprises a unitary body and further houses the inductor in the interior of the package.

2. The apparatus of claim 1, further comprising a common input terminal (COM) electrically connected to an intermediate node connecting between the first semiconductor switch and the second semiconductor switch, wherein the common input terminal is configured to communicate electrical signals between the interior of the package and the exterior of the package.

3. The apparatus of claim 2, wherein the first semiconductor switch is configured to modulate conductivity between the input node and the output node in response to the first bypass switch control signal received between the first control input terminal and the common input terminal.

4. The apparatus of claim 3, further comprising a second control input terminal (CONT2) operably connected to the second control gate, wherein the second semiconductor switch is configured to modulate conductivity between the input node and the output node in response to a second bypass switch control signal received at the second control input terminal, wherein the second bypass switch control signal is independently controllable relative to the first bypass switch control signal, and the second control input terminal is configured to communicate electrical signals between the interior of the package and the exterior of the package.

5. The apparatus of claim 4, wherein the second semiconductor switch is configured to modulate conductivity between the input node and the output node in response to the second bypass switch control signal received between the second control input terminal and the common input terminal.

6. The apparatus of claim 4, wherein the package further comprises an integrated circuit (IC) package that houses the bypass switch in the interior of the IC package, and the second control input terminal is configured to communicate electrical signals between the interior and the exterior of the IC package.

7. The apparatus of claim 1, wherein the package further comprises an integrated circuit (IC) package that houses the bypass switch in the interior of the IC package.

8. The apparatus of claim 7, wherein the integrated circuit (IC) package further houses the inductor in the interior of the IC package.

9. The apparatus of claim 1, wherein the bypass switch comprises at least one P-channel MOSFET.

10. The apparatus of claim 1, wherein the bypass switch comprises at least one N-channel MOSFET.

11. The apparatus of claim 1, wherein the first and second semiconductor switches are series-connected in a common drain configuration.

12. The apparatus of claim 1, wherein the first and second semiconductor switches are series-connected in a common source configuration.

13. The apparatus of claim 1, wherein the bypass switch is operably connected in parallel with the inductor.

14. A conductivity modulation apparatus for active operations with an inductive element, the apparatus comprising:
 a first input terminal (IN1) electrically connected to a first input node;
 a second input terminal (IN2) electrically connected to a second input node; a first output terminal (OUT1) electrically connected to an output node;
 a main switch (SW3) operative to selectively connect the first input terminal of an input voltage source to an intermediate switch node;
 a freewheeling rectifier (SW4) coupled to conduct current from the second input terminal of the input voltage source to the intermediate switch node; and,
 a bypass switch electrically connected between the intermediate switch node and the output node, the bypass switch comprising a first semiconductor switch (SW1) having a first control gate and a second semiconductor switch (SW2) having a second control gate, the first and second semiconductor switches being connected in anti-series; and,
 a first control input terminal (CONT1) operably connected to the first control gate, wherein the first semiconductor switch is configured to modulate conductivity between the input node and the output node in response to a first bypass switch control signal being received at the first control input terminal; and,
 a package that houses the input terminal, the output terminal and the first control input terminal, wherein the first and second input terminals, the first output terminal, and the first control input terminal are each configured to communicate electrical signals between an interior of the package and an exterior of the package, the package comprises a unitary body and further houses the inductor in the interior of the package.

15. The apparatus of claim 14, further comprising a second output terminal (OUT2) electrically connected to the intermediate switch node, and the second output terminal is configured to communicate electrical signals between the interior of the package and the exterior of the package.

16. The apparatus of claim 15, wherein the bypass switch is operable to selectively circulate current through an inductor when the inductor is connected between the first output terminal and the second output terminal in response to the first bypass switch control signal.

17. The apparatus of claim 14, further comprising a common input terminal (COM), wherein the first semiconductor switch is configured to modulate conductivity between the input node and the output node in response to the first bypass switch control signal received between the first control input terminal and the common input terminal, and the common input terminal is configured to communicate electrical signals between an interior of the package and an exterior of the package.

18. The apparatus of claim 14, further comprising a second control input terminal (CONT2) operably connected to the second control gate, wherein the second semiconductor switch is configured to modulate conductivity between the input node and the output node in response to a second bypass switch control signal received at the second control input terminal, wherein the second bypass switch control signal is independently controllable relative to the first bypass switch control signal.

19. The apparatus of claim 14, wherein the package further comprises an integrated circuit (IC) package that houses the bypass switch, the main switch (SW3) and the freewheeling rectifier (SW4) in the interior of the IC package.

20. The apparatus of claim 19, further comprising a main switch control input terminal (CONT3) operably connected to the main switch (SW3), and a freewheeling rectifier control input terminal (CONT4) operably connected to the freewheeling rectifier (SW4), wherein the main switch control terminal and the freewheeling rectifier control input terminal are each configured to communicate electrical signals between an interior of the package and an exterior of the package.

* * * * *